US012238999B2

United States Patent
Liu et al.

(10) Patent No.: US 12,238,999 B2
(45) Date of Patent: Feb. 25, 2025

(54) DISPLAY SUBSTRATE, DISPLAY PANEL AND DISPLAY APPARATUS

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Ke Liu, Beijing (CN); Ling Shi, Beijing (CN); Yipeng Chen, Beijing (CN); Lang Liu, Beijing (CN); Zhenhua Zhang, Beijing (CN); Xuewei Tian, Beijing (CN)

(73) Assignees: Chengdu BOE Optoelectronis Technology Co., Ltd., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 584 days.

(21) Appl. No.: 17/629,360

(22) PCT Filed: Feb. 7, 2021

(86) PCT No.: PCT/CN2021/075844
§ 371 (c)(1),
(2) Date: Jan. 21, 2022

(87) PCT Pub. No.: WO2022/165807
PCT Pub. Date: Aug. 11, 2022

(65) Prior Publication Data
US 2023/0165097 A1    May 25, 2023

(51) Int. Cl.
*H10K 59/35*    (2023.01)
*H10K 59/121*    (2023.01)
*H10K 59/131*    (2023.01)

(52) U.S. Cl.
CPC ....... *H10K 59/353* (2023.02); *H10K 59/1213* (2023.02); *H10K 59/1216* (2023.02); *H10K 59/131* (2023.02)

(58) Field of Classification Search
CPC ............. H10K 59/353; H10K 59/1213; H10K 59/1216; H10K 59/131; H10K 59/12
See application file for complete search history.

(56) References Cited

U.S. PATENT DOCUMENTS 9,153,612 B2    10/2015    Miyanami
9,478,572 B2    10/2016    Miyanami
(Continued)

FOREIGN PATENT DOCUMENTS

CN    105428381 A    3/2016
CN    105679266 A    6/2016
(Continued)

OTHER PUBLICATIONS

International Search Report and Written Opinion dated Nov. 11, 2021 for corresponding PCT Application No. PCT/CN2021/075844.
(Continued)

*Primary Examiner* — Wasiul Haider
(74) *Attorney, Agent, or Firm* — Kinney & Lange, P.A.

(57) ABSTRACT

A display substrate, a display panel and a display apparatus are provided. The display substrate includes a first display region and a second display region, and a light transmittance of the first display region is greater than a light transmittance of the second display region. A plurality of sub-pixels located in the first display region includes a plurality of sub-pixel groups, each sub-pixel group includes a first sub-pixel and a second sub-pixel, the first pixel driving circuit includes a first sub-pixel driving circuit and a second sub-pixel driving circuit. The first sub-pixel driving circuit
(Continued)

includes at least a first reset transistor, the second sub-pixel driving circuit includes at least a second reset transistor, and the first reset transistor of the first sub-pixel driving circuit and the second reset transistor of the second sub-pixel driving circuit are at least partially shared with each other.

20 Claims, 40 Drawing Sheets

(56) References Cited

U.S. PATENT DOCUMENTS

| | | | |
|---|---|---|---|
| 9,806,118 | B2 | 10/2017 | Miyanami |
| 10,256,267 | B2 | 4/2019 | Miyanami |
| 10,615,208 | B2 | 4/2020 | Miyanami |
| 11,031,427 | B2 | 6/2021 | Miyanami |
| 2012/0217601 | A1 | 8/2012 | Miyanami |
| 2015/0015468 | A1 | 1/2015 | Ko et al. |
| 2015/0349002 | A1 | 12/2015 | Miyanami |
| 2017/0005122 | A1 | 1/2017 | Miyanami |
| 2018/0026029 | A1 | 1/2018 | Miyanami |
| 2019/0221593 | A1 | 7/2019 | Miyanami |
| 2019/0325823 | A1* | 10/2019 | Yang ............... G09G 3/3233 |
| 2020/0235143 | A1 | 7/2020 | Miyanami |
| 2021/0296379 | A1 | 9/2021 | Miyanami |

FOREIGN PATENT DOCUMENTS

| | | |
|---|---|---|
| CN | 107799057 A | 3/2018 |
| CN | 108269840 A | 7/2018 |
| CN | 108596083 A | 9/2018 |
| CN | 110265458 A | 9/2019 |
| CN | 110459175 A | 11/2019 |
| CN | 110599963 A | 12/2019 |
| CN | 111899684 A | 11/2020 |
| KR | 20160017959 A | 2/2016 |
| WO | 2021012259 A1 | 1/2021 |

OTHER PUBLICATIONS

First Chinese Office Action dated Nov. 15, 2024, for corresponding Chinese Patent Application No. 202180000206.2, 19 pgs.

* cited by examiner

DISPLAY SUBSTRATE, DISPLAY PANEL AND DISPLAY APPARATUS

CROSS REFERENCE TO RELATED APPLICATION(S)

This application is a Section 371 National Stage Application of International Application No. PCT/CN2021/075844, filed on Feb. 7, 2021, entitled "DISPLAY SUBSTRATE, DISPLAY PANEL AND DISPLAY APPARATUS", the contents of which is incorporated herein by reference in its entirety.

TECHNICAL FIELD

The present disclosure relates to the field of display technologies, and in particular to a display substrate, a display panel and a display apparatus.

BACKGROUND

With the increase of users' demands for diversified use of a display apparatus and the emergence of the design requirement for high screen-to-body ratio of the display apparatus, an "under-screen camera" solution has emerged. In the "under-screen camera" solution, an imaging module such as a camera is embedded in a display region to reduce a size of a bezel region of the display apparatus, thereby increasing the screen-to-body ratio. At present, in the "under-screen camera" solution, on a basis of increasing the screen-to-body ratio of the display apparatus, how to ensure both the light transmittance and the display effect at a position corresponding to the imaging module in the display substrate becomes an important topic which the research and development personnel focus on.

The above-mentioned information disclosed in this section is only used to understand the background of the technical concept of the present disclosure, and the above-mentioned information may include information that does not constitute the related art.

SUMMARY

In an aspect, a display substrate is provided. The display substrate includes a first display region and a second display region, a light transmittance of the first display region is greater than a light transmittance of the second display region. The display substrate includes: a base substrate; a plurality of sub-pixels arranged on the base substrate and located in the first display region, the sub-pixels including a first pixel driving circuit and a first light-emitting device, the first pixel driving circuit being electrically connected to the first light-emitting device and configured to drive the first light-emitting device to emit light; and a plurality of sub-pixels arranged on the base substrate and located in the second display region, the sub-pixels located in the second display region including a second pixel driving circuit and a second light-emitting device, the second pixel driving circuit being electrically connected to the second light-emitting device and configured to drive the second light-emitting device to emit light. The plurality of sub-pixels located in the first display region include a plurality of sub-pixel groups, and each of the plurality of sub-pixel groups includes a first sub-pixel and a second sub-pixel. The first pixel driving circuit includes a first sub-pixel driving circuit and a second sub-pixel driving circuit, the first sub-pixel driving circuit is configured to drive the first light-emitting device of the first sub-pixel to emit light, and the second sub-pixel driving circuit is configured to drive the first light-emitting device of the second sub-pixel to emit light. The first sub-pixel driving circuit includes at least a first reset transistor, the second sub-pixel driving circuit includes at least a second reset transistor, and the first reset transistor of the first sub-pixel driving circuit and the second reset transistor of the second sub-pixel driving circuit are at least partially shared with each other.

According to some exemplary embodiments of the present disclosure, an orthographic projection of each of the first reset transistor of the first sub-pixel driving circuit and the second reset transistor of the second sub-pixel driving circuit on the base substrate falls within an orthographic projection of an occupied region of the first sub-pixel driving circuit on the base substrate.

According to some exemplary embodiments of the present disclosure, the first reset transistor includes a common transistor and a first sub-transistor, and the second reset transistor includes the common transistor and a second sub-transistor, and each of the common transistor, the first sub-transistor and the second sub-transistor includes a gate, a source and a drain, and the gate of each of the common transistor, the first sub-transistor and the second sub-transistor is configured to receive a reset control signal, one of the source or the drain of the common transistor is configured to receive an initialization voltage signal, and the other of the source or the drain of the common transistor is electrically connected to the first sub-transistor and the second sub-transistor, respectively.

According to some exemplary embodiments of the present disclosure, the display substrate further includes a semiconductor layer arranged on the base substrate and a first conductive layer located on a side of the semiconductor layer away from the base substrate, the display substrate further includes a reset signal line arranged on the base substrate, the reset signal line is configured to transmit the reset control signal, and the reset signal line is located in the first conductive layer; and the reset signal line includes a first part, a second part and a third part located in the first display region, and the semiconductor layer includes a common channel portion, a first channel portion and a second channel portion located in the first display region, orthographic projections of the first part, the second part and the third part on the base substrate are respectively coincide with orthographic projections of the common channel portion, the first channel portion and the second channel portion on the base substrate, a gate of the common transistor includes the first part, a gate of the first sub-transistor includes the second part, and a gate of the second sub-transistor includes the third part.

According to some exemplary embodiments of the present disclosure, the common transistor includes a common source portion and a common drain portion located in the semiconductor layer, the first sub-transistor includes a first sub-source portion and a first sub-drain portion located in the semiconductor layer, and the second sub-transistor includes a second sub-source portion and a second sub-drain portion located in the semiconductor layer. The common source portion and the common drain portion are respectively located on both sides of the common channel portion, the first sub-source portion and the first sub-drain portion are respectively located on both sides of the first channel portion, and the second sub-source portion and the second sub-drain portion are respectively located on both sides of the second channel portion.

According to some exemplary embodiments of the present disclosure, the display substrate further includes an initialization voltage line arranged on the base substrate and a first connection portion arranged on the base substrate; one of the common source portion and the common drain portion is electrically connected to the initialization voltage line through a first via hole, and the other of the common source portion and the common drain portion extends continuously with one of the first sub-source portion and the first sub-drain portion; and the other of the first sub-source portion and the first sub-drain portion is electrically connected to one end of the first connection portion through a second via hole.

According to some exemplary embodiments of the present disclosure, the first sub-pixel driving circuit further includes a first driving transistor including a gate, and the other end of the first connection portion is electrically connected to the gate of the first driving transistor through a third via hole.

According to some exemplary embodiments of the present disclosure, the display substrate further includes a first transparent conductive connection portion arranged on the base substrate, the other of the common source portion and the common drain portion further extends continuously with one of the second sub-source portion and the second sub-drain portion; and the other of the second sub-source portion and the second sub-drain portion is electrically connected to one end of the first transparent conductive connection portion through a third via hole.

According to some exemplary embodiments of the present disclosure, the second sub-pixel driving circuit further includes a second driving transistor including a gate, and the other end of the first transparent conductive connection portion is electrically connected to the gate of the second driving transistor through a fourth via hole.

According to some exemplary embodiments of the present disclosure, the initialization voltage line is located in a second conductive layer, the first connection portion is located in a third conductive layer, the second conductive layer is located on a side of the first conductive layer away from the base substrate, and the third conductive layer is located on a side of the second conductive layer away from the base substrate.

According to some exemplary embodiments of the present disclosure, the first transparent conductive connection portion is located in a first transparent conductive layer, and the first transparent conductive layer is located on a side of the third conductive layer away from the base substrate.

According to some exemplary embodiments of the present disclosure, the first sub-pixel driving circuit further includes a first initialization transistor including an active layer located in the semiconductor layer. The second sub-pixel driving circuit further includes a second initialization transistor including an active layer located in the semiconductor layer. An orthographic projection of the first transparent conductive connection portion on the base substrate partially overlaps with an orthographic projection of the active layer of the first initialization transistor on the base substrate, and the orthographic projection of the first transparent conductive connection portion on the base substrate partially overlaps with an orthographic projection of the active layer of the second initialization transistor on the base substrate.

According to some exemplary embodiments of the present disclosure, the display substrate further includes a first scan signal line and a second scan signal line arranged on the base substrate, the first scan signal line is configured to supply a scan signal to the first sub-pixel driving circuit, and the second scan signal line is configured to supply a scan signal to the second sub-pixel driving circuit. An orthographic projection of the first scan signal line on the base substrate partially overlaps with the orthographic projection of the active layer of the first initialization transistor on the base substrate, and an orthographic projection of the second scan signal line on the base substrate partially overlaps with the orthographic projection of the active layer of the second initialization transistor on the base substrate.

According to some exemplary embodiments of the present disclosure, the first transparent conductive connection portion includes at least a first part, a second part, and a third part. The third part of the first transparent conductive connection portion extends in a first direction, the second part of the first transparent conductive connection portion extends in a second direction, and the first part of the first transparent conductive connection portion extends in an oblique direction that is oblique relative to both the first direction and the second direction.

According to some exemplary embodiments of the present disclosure, an orthographic projection of the first part of the first transparent conductive connection portion on the base substrate partially overlaps with the orthographic projection of the active layer of the first initialization transistor on the base substrate; and/or an orthographic projection of the third part of the first transparent conductive connection portion on the base substrate partially overlaps with the orthographic projection of the active layer of the second initialization transistor on the base substrate; and/or the second part of the first transparent conductive connection portion is located in a light-transmitting region between the first sub-pixel and the second sub-pixel.

According to some exemplary embodiments of the present disclosure, the active layer of the first initialization transistor is spaced apart from other parts of the first sub-pixel driving circuit in the semiconductor layer; and/or the active layer of the second initialization transistor is spaced apart from other parts of the second sub-pixel driving circuit in the semiconductor layer.

According to some exemplary embodiments of the present disclosure, the display substrate further includes a second connection portion arranged on the base substrate, and a first end of the second connection portion is electrically connected to the initialization voltage line through a fifth via hole, and a second end of the second connection portion is electrically connected to a first end of the active layer of the first initialization transistor through a sixth via hole.

According to some exemplary embodiments of the present disclosure, the display substrate further includes a second transparent conductive connection portion arranged on the base substrate, a first end of the second transparent conductive connection portion is electrically connected to a second end of the second connection portion through a seventh via hole, and a second end of the second transparent conductive connection portion is electrically connected to a first end of the active layer of the second initialization transistor through an eighth via hole.

According to some exemplary embodiments of the present disclosure, the second connection portion is located in a third conductive layer; and/or the second transparent conductive connection portion is located in a first transparent conductive layer.

According to some exemplary embodiments, an orthographic projection of the sixth via hole on the base substrate at least partially overlaps with an orthographic projection of the seventh via hole on the base substrate.

According to some exemplary embodiments of the present disclosure, the display substrate further includes a third transparent conductive connection portion arranged on the base substrate, and one end of the third transparent conductive connection portion is electrically connected to the first scan signal line through a ninth via hole, and the other end of the third transparent conductive connection portion is electrically connected to the second scan signal line through a tenth via hole.

According to some exemplary embodiments of the present disclosure, the display substrate further includes a first light-emitting control line and a second light-emitting control line arranged on the base substrate, the first light-emitting control line is configured to supply a light-emitting control signal to the first sub-pixel driving circuit, and the second light-emitting control line is configured to supply a light-emitting control signal to the second sub-pixel driving circuit. The display substrate further includes a fourth transparent conductive connection portion arranged on the base substrate, one end of the fourth transparent conductive connection portion is electrically connected to the first light-emitting control line through an eleventh via hole, and the other end of the fourth transparent conductive connection portion is electrically connected to the second light-emitting control line through a twelfth via hole.

According to some exemplary embodiments of the present disclosure, in at least one sub-pixel group, the first sub-pixel and the second sub-pixel share the reset signal line and the initialization voltage line.

According to some exemplary embodiments of the present disclosure, the plurality of sub-pixel groups include at least a first sub-pixel group and a second sub-pixel group that are located in the same row and are adjacent to each other. The display substrate further includes a first conductive wire arranged on the base substrate, one end of the first conductive wire is electrically connected to a reset signal line in the first sub-pixel group through a thirteenth via hole, the other end of the first conductive wire is electrically connected to a reset signal line in the second sub-pixel group through a fourteenth via hole.

According to some exemplary embodiments of the present disclosure, the display substrate further includes a second conductive wire arranged on the base substrate, one end of the second conductive wire is electrically connected to an initialization voltage line in the first sub-pixel group through a fifteenth via hole, and the other end of the second conductive wire is electrically connected to an initialization voltage line in the second sub-pixel group through a sixteenth via hole.

According to some exemplary embodiments of the present disclosure, the third transparent conductive connection portion and/or the fourth transparent conductive connection portion are located in a first transparent conductive layer, and the first conductive wire and/or the second conductive wire are located in a second transparent conductive layer. The second transparent conductive layer is located on a side of the first transparent conductive layer away from the base substrate.

According to some exemplary embodiments of the present disclosure, the display substrate further includes: a data signal line configured to transmit a data signal and a driving voltage line configured to transmit a driving voltage. The data signal line and the driving voltage line are located in the first transparent conductive layer.

According to some exemplary embodiments of the present disclosure, the driving voltage line is disconnected at the first sub-pixel driving circuit and the second sub-pixel driving circuit, so that the driving voltage line includes a first driving voltage sub-line and a second driving voltage sub-line, and the first driving voltage sub-line and the second driving voltage sub-line are spaced apart in an extension direction of the driving voltage line. The display substrate further includes a third connection portion, one end of the third connection portion is electrically connected to the first driving voltage sub-line through a seventeenth via hole, and the other end of the third connection portion is electrically connected to the second driving voltage sub-line through an eighteenth via hole.

According to some exemplary embodiments of the present disclosure, the display substrate includes a fourth conductive layer arranged on the base substrate, and the fourth conductive layer is located between the first transparent conductive layer and the second transparent conductive layer. The third connection portion is located in the fourth conductive layer.

According to some exemplary embodiments, an orthographic projection of at least one of the first conductive wire or the second conductive wire on the base substrate intersects with an orthogonal projection of at least one of the data line or the driving voltage line on the base substrate.

According to some exemplary embodiments of the present disclosure, the first light-emitting device includes at least a first electrode and a light-emitting material layer arranged on a side of the first electrode away from the base substrate. An area of an orthographic projection of a first electrode of the first sub-pixel on the base substrate is greater than an area of an orthographic projection of a first electrode of the second sub-pixel on the base substrate.

According to some exemplary embodiments of the present disclosure, the orthographic projection of the first electrode of the first sub-pixel on the base substrate covers an orthographic projection of an occupied region of the first sub-pixel driving circuit on the base substrate; and/or the orthographic projection of the first electrode of the second sub-pixel on the base substrate covers an orthographic projection of an occupied region of the second sub-pixel driving circuit on the base substrate.

According to some exemplary embodiments, the first sub-pixel is a red sub-pixel or a blue sub-pixel, and the second sub-pixel is a green sub-pixel.

In another aspect, a display panel is provided, including the display substrate as described above.

In yet another aspect, a display apparatus is provided, including the display substrate or the display panel as described above.

According to some exemplary embodiments of the present disclosure, the display apparatus further includes at least one image sensor. An orthographic projection of the at least one image sensor on the base substrate falls within an orthographic projection of the first display region on the base substrate.

BRIEF DESCRIPTION OF THE DRAWINGS

By describing exemplary embodiments of the present disclosure in detail with reference to the accompanying drawings, the features and advantages of the present disclosure will become more apparent.

DETAILED DESCRIPTION OF EMBODIMENTS

Figure 1:
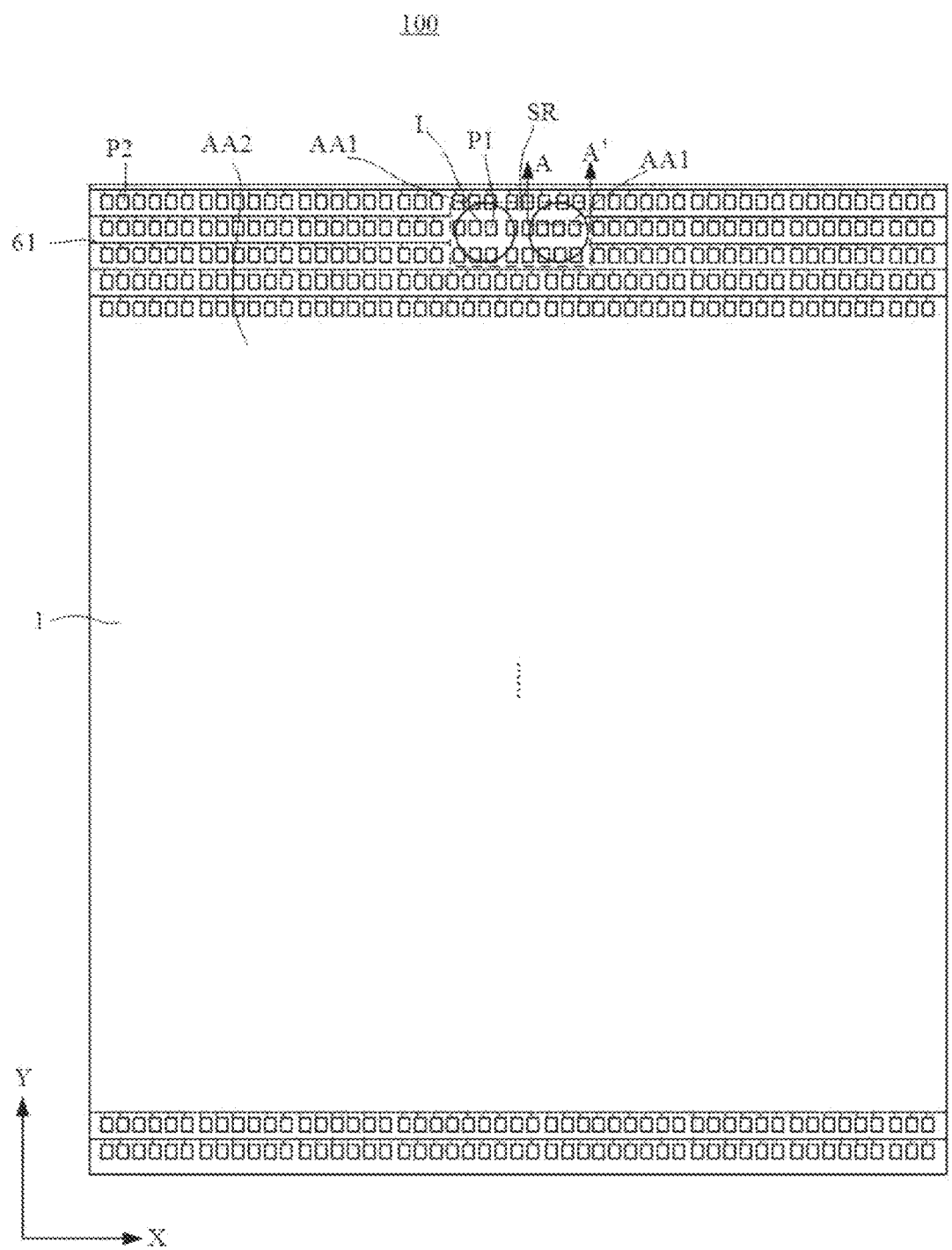
FIG. 1 shows a schematic plan view of a display apparatus according to some exemplary embodiments of the present disclosure, in which a planar structure of a display substrate included in the display apparatus is schematically shown.

In order to make the objectives, technical solutions, and advantages of the embodiments of the present disclosure more clear, the technical solutions of the embodiments of the present disclosure will be described clearly and completely below with reference to the drawings. The embodiments described hereinafter make up a subset of the embodiments of the present disclosure, but not all of the embodiments. All other embodiments obtained by those of ordinary skilled in the art based on the described embodiments of the present disclosure without carrying out any inventive effort shall fall within the protection scope of the present disclosure.

It should be noted that, in the drawings, for clarity and/or description purposes, a size and relative size of an element may be enlarged. As such, a size and relative size of each element need not be limited to those shown in the drawings. In the specification and drawings, a same or similar reference sign indicates a same or similar component.

When an element is described as being "on", "connected to" or "coupled to" another element, the element may be directly on the another element, directly connected to the another element or directly coupled to the another element, or there may be an intermediate element. However, when an element is described as being "directly on", "directly connected to" or "directly coupled to" another element, there is no intermediate element. Other terms and/or expressions used to describe the relationship between elements should be interpreted in a similar manner, for example, "between" and "directly between", "adjacent" and "directly adjacent", or "on" and "directly on", etc. In addition, the term "connected" may refer to a physical connection, an electrical connection, a communication connection, and/or a fluid connection. In addition, the X axis, the Y axis, and the Z axis are not limited to the three axes of the Cartesian coordinates, and may be interpreted in a broader meaning. For example, the X axis, the Y axis, and the Z axis may be perpendicular to each other, or may represent different directions that are not perpendicular to each other. For the purpose of the present disclosure, "at least one of X, Y, or Z" and "at least one selected from a group consisting of X, Y, or Z" may be interpreted as only X, only Y, only Z, or any combination of two or more of X, Y, or Z such as XYZ, XYY, YZ, and ZZ. The term "and/or" as used in the present disclosure includes any or all combinations of one or more related listed items.

It should be noted that although terms "first", "second" and the like may be used to describe various components, members, elements, regions, layers and/or portions here, however, these components, members, elements, regions, layers and/or portions should not be limited by these terms. These terms are used to distinguish one component, member, element, region, layer and/or portion from another component, member, element, region, layer and/or portion. Thus, for example, without departing from the teachings of the present disclosure, a first component, member, element, region, layer and/or portion may be named as a second component, member, element, region, layer and/or portion.

For ease of description, spatial relationship terms, for example, "upper", "lower", "left", "right", etc. may be used here to describe a relationship between one element or feature and another element or feature as shown in a figure. It should be understood that, in addition to an orientation shown in the figure, the spatial relationship terms are intended to cover other different orientations of an apparatus in use or in operation. For example, if the apparatus in the figure is turned upside down, an element described as "below" or "under" another element or feature will be oriented "above" or "on" the another element or feature.

In the present disclosure, terms "about", "approximately", "substantially" and other similar terms are used as approximate terms rather than as terms of degree, and they are intended to explain an inherent deviation of a measured or calculated value that will be recognized by those of ordinary skilled in the art. Taking into account factors such as a process fluctuation, a measurement problem, and an error related to a measurement of a specific quantity (i.e., a limitation of a measurement system), "about" or "approximately" as used here includes the stated value and means that, for those of ordinary skilled in the art, the determined specific value is within an acceptable deviation range. For example, "about" can mean within one or more standard deviations, or within ±30%, ±20%, ±10% and ±5% of the stated value.

It should be noted that, in the present disclosure, the expression "a same layer" refers to a layer structure formed by using a same film forming process to form a film layer used for forming a specific pattern, and then using a same mask to pattern the film layer through a patterning process. According to different specific patterns, a patterning process may include multiple exposure, development, or etching processes, and the specific pattern formed in the layer structure may be continuous or discontinuous. The multiple elements, components, structures and/or portions located in "a same layer" are made of a same material, and are formed by a same patterning process. Generally, the multiple elements, components, structures and/or portions located in "a same layer" have approximately a same thickness.

Those of ordinary skilled in the art should understand that, unless otherwise specified, the expressions "continuously extending", "integrated structure", "overall structure" or the like herein indicate that multiple elements, components, structures and/or portions are located in a same layer, and are generally formed by a same patterning process during a manufacturing process. There are no gaps or breaks between these elements, components, structures and/or portions, but a continuously extending structure.

In the present disclosure, the expression "repeating unit" refers to a combination of multiple sub-pixels, for example, a combination of multiple sub-pixels used to display one pixel point, and multiple "repeating units" are arranged repeatedly in an array on a base substrate. For example, a repeating unit may include at least one pixel, for example, two, three, four, or more sub-pixels. In addition, for ease of description, a repeating unit located in a first display region is referred to as a first repeating unit, and a repeating unit located in a second display region is referred to as a second repeating unit.

In the present disclosure, the expression "pixel density" refers to the number of repeating units or sub-pixels per unit area. For example, PPI may be used to represent the pixel density, and the meaning of PPI is the number of pixels per unit area. Similarly, the expression "distribution density" refers to the number of components (for example, repeating units, sub-pixels, spacers, etc.) per unit area.

Figure 2:
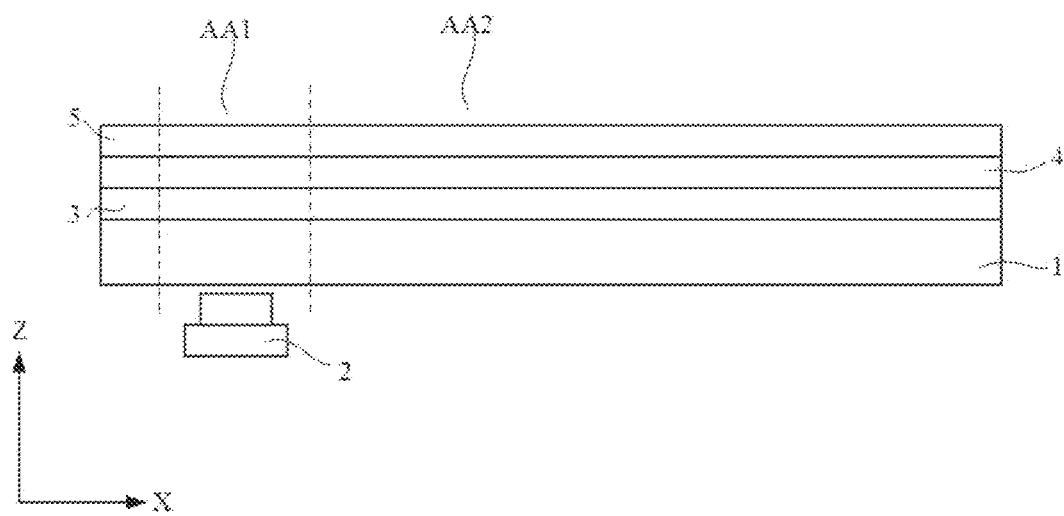
FIG. 2 shows a schematic cross-sectional view of a display apparatus taken along a line AA' in FIG. 1, according to some exemplary embodiments of the present disclosure.

FIG. 1 shows a schematic plan view of a display apparatus according to some exemplary embodiments of the present disclosure, in which a planar structure of a display substrate included in the display apparatus is schematically shown. FIG. 2 shows a schematic cross-sectional view of a display apparatus taken along a line AA' in FIG. 1, according to some exemplary embodiments of the present disclosure.

For example, the display apparatus includes a display substrate. The display substrate may be an electroluminescent display substrate, such as an OLED display substrate.

As shown in FIG. 1, the display apparatus according to the embodiments of the present disclosure includes a display substrate 100. The display substrate 100 includes a display region, and the display region may include a first display region AA1 and a second display region AA2. For example, the second display region AA2 at least partially surrounds (for example, completely surrounds) the first display region AA1.

As shown in FIG. 2, the display substrate 100 may include a base substrate 1. In the first display region AA1, a sensor 2 may be arranged on a back surface (shown as a lower side in FIG. 2, for example, a side opposite to a light exit direction during display) of the base substrate 1, and the first display region AA1 may meet an imaging requirement of the sensor 2 for light transmittance.

For example, a light transmittance of the first display region AA1 is greater than a light transmittance of the second display region AA2. The sensor 2 is, for example, an image sensor or an infrared sensor. The sensor 2 is used to receive light from a display side (shown as an upper side in FIG. 2, for example, in the light exit direction during display or a direction where the human eye is during display) of the display substrate 100, so that operations such as image capturing, distance sensing, and light intensity sensing may be performed. The light, for example, pass through the first display region AA1 and then illuminate the sensor, so as to be sensed by the sensor.

It should be noted that, in an illustrated exemplary embodiment, the second display region AA2 completely surrounds the first display region AA1, however, the embodiments of the present disclosure are not limited thereto. For example, in other embodiments, the first display region AA1 may be located at an upper edge of the display substrate. For example, three sides of the first display region AA1 are surrounded by the second display region AA2, and an upper side of the first display region AA1 is flush with an upper side of the display substrate. For another example, the first display region AA1 may be located at the upper edge of the display substrate and arranged along an entire width of the display substrate.

For example, a shape of the first display region AA1 may be a circle, an oval, a polygon, or a rectangle, and a shape of the second display region AA2 may be a circle, a ring, an oval, or a rectangle, but the embodiments of the present disclosure are not limited thereto. For another example, both the shape of the first display region AA1 and the shape of the second display region AA2 may be a rectangle, a rounded rectangle or other appropriate shapes.

The OLED display technology may be applied in the display substrate shown in FIGS. 1 to 2. Due to advantages of wide viewing angle, high contrast, fast response, low power consumption, foldability, flexibility, etc., OLED display substrates are more and more widely used in display products. With the development and in-depth application of the OLED display technology, the demand for displays with high screen-to-body ratio is becoming stronger. In the display substrate shown in FIGS. 1 and 2, an under-screen camera solution is applied. In this way, a notch region may be avoided, no holes need to be punched in the display screen, and the screen-to-body ratio may be increased, which makes the visual experience better.

For example, the display substrate may include a base substrate 1 and various film layers arranged on the base substrate 1. For example, the display substrate may further include a driving circuit layer, a light-emitting device layer, and an encapsulation layer arranged on the base substrate 1. For example, the driving circuit layer 3, the light-emitting device layer 4, and the encapsulation layer 5 are schematically shown in FIG. 2. The driving circuit layer 3 includes a driving circuit structure, and the light-emitting device layer 4 includes a light-emitting device such as OLED. The driving circuit structure controls a light-emitting device of each sub-pixel to emit light, so as to achieve a display function. The driving circuit structure includes a thin film transistor, a storage capacitor, and various signal lines. The various signal lines include a gate line, a data line, an ELVDD power supply line, an ELVSS power supply line, etc., so as to provide various signals such as a control signal, a data signal, and a power supply voltage signal for a pixel driving circuit in each sub-pixel.

For example, the first display region AA1 may correspond to an under-screen camera, that is, the first display region AA1 may be an under-screen imaging region. In the embodiments of the present disclosure, that the display substrate 100 includes two first display regions AA1 is taken as an example for description. Each first display region AA1 may has a circular shape, a substantially circular shape, an oval shape, a polygonal shape, or the like. Two first display regions AA1 are spaced apart, and a spacing region SR is provided between the two first display regions AA1.

For example, with reference to FIGS. 1 and 2, in the illustrated embodiments, two sensors 2 may be arranged to correspond to two sub-display regions respectively, so as to form a display apparatus with a dual-camera structure. However, the embodiments of the present disclosure are not limited thereto, and in other embodiments, fewer (for example, one) or more sub-display regions and sensors 2 may be arranged. In addition, a shape of the sub-display region may also be determined according to a shape of a hardware structure to be installed. For example, orthographic projections of respective sub-display regions on the base substrate may have one or more of following shapes: a circle, an oval, a rectangle, a rounded rectangle, a square, a rhombus, a trapezoid, a polygon, etc., and various combinations thereof.

In the embodiments of the present disclosure, a display region with a higher light transmittance than that of a normal display region is arranged in the display substrate, and a hardware structure such as a camera is installed in the display region. In this way, functions such as under-screen imaging may be achieved, which may increase a screen-to-body ratio and achieve a full-screen effect.

In the related art, a manner of reducing a pixel density of the first display region is generally used to cause a light transmittance of the display region provided with the sensor 2 (that is, the first display region AA1) to be greater than a light transmittance of a normal display region (that is, the second display region AA2), that is, cause PPI of the first display region to be less than PPI of the second display region, for example, the PPI of the first display region is generally set to be less than half of the PPI of the second display region. However, the manner of reducing PPI will reduce a display quality of the first display region. Different from the normal display region, a picture displayed in the first display region will be visually grainy. In addition, in the related art, a pixel driving circuit of a pixel in the first display region is generally arranged outside an under-screen imaging region. For example, a pixel driving circuit is arranged in the above-mentioned spacing region SR. In this case, there will be a black border in a display region between the two sensors 2 during display, which will adversely affect the overall display quality. In addition, when a pixel driving circuit is arranged outside the under-screen imaging region, the pixel driving circuit arranged outside must be electrically connected to a light-emitting element (such as OLED) of each pixel arranged in the under-screen imaging region via a conductive wire. Due to limitations of a distance between pixels, a width of a conductive wire, and a distance between conductive wires, the realization of high PPI of the under-screen imaging region will be limited, that is, the under-screen imaging region with high PPI cannot be achieved.

An embodiment of the present disclosure provides at least a display substrate, a display panel, and a display apparatus. The display substrate includes a first display region and a second display region, a light transmittance of the first display region is greater than a light transmittance of the second display region. The display substrate includes: a base substrate; a plurality of sub-pixels arranged on the base substrate and located in the first display region, in which the sub-pixels include a first pixel driving circuit and a first light-emitting device, and the first pixel driving circuit is electrically connected to the first light-emitting device and used for driving the first light-emitting device to emit light; and a plurality of sub-pixels arranged on the base substrate and located in the second display region, in which the sub-pixels located in the second display region include a second pixel driving circuit and a second light-emitting device, and the second pixel driving circuit is electrically connected to the second light-emitting device and used for driving the second light-emitting device to emit light. The plurality of sub-pixels located in the first display region include a plurality of sub-pixel groups, and each sub-pixel group includes a first sub-pixel and a second sub-pixel. The first pixel driving circuit includes a first sub-pixel driving circuit and a second sub-pixel driving circuit, the first sub-pixel driving circuit is used for driving a first light-emitting device of the first sub-pixel to emit light, and the second sub-pixel driving circuit is used for driving a first light-emitting device of the second sub-pixel to emit light. The first sub-pixel driving circuit includes at least a first reset transistor, and the second sub-pixel driving circuit includes at least a second reset transistor, and the first reset transistor of the first sub-pixel driving circuit and the second reset transistor of the second sub-pixel driving circuit are at least partially shared with each other. In the embodiments of the present disclosure, in the under-screen imaging region, the plurality of sub-pixels may share at least part of the reset transistors, which is conducive to the reduction of an area of a region occupied by the pixel driving circuit corresponding to some of the sub-pixels, so that the PPI of the under-screen imaging region is enabled to be relatively high, while ensuring that the light transmittance of the under-screen imaging region meets the requirements.

Figure 3:
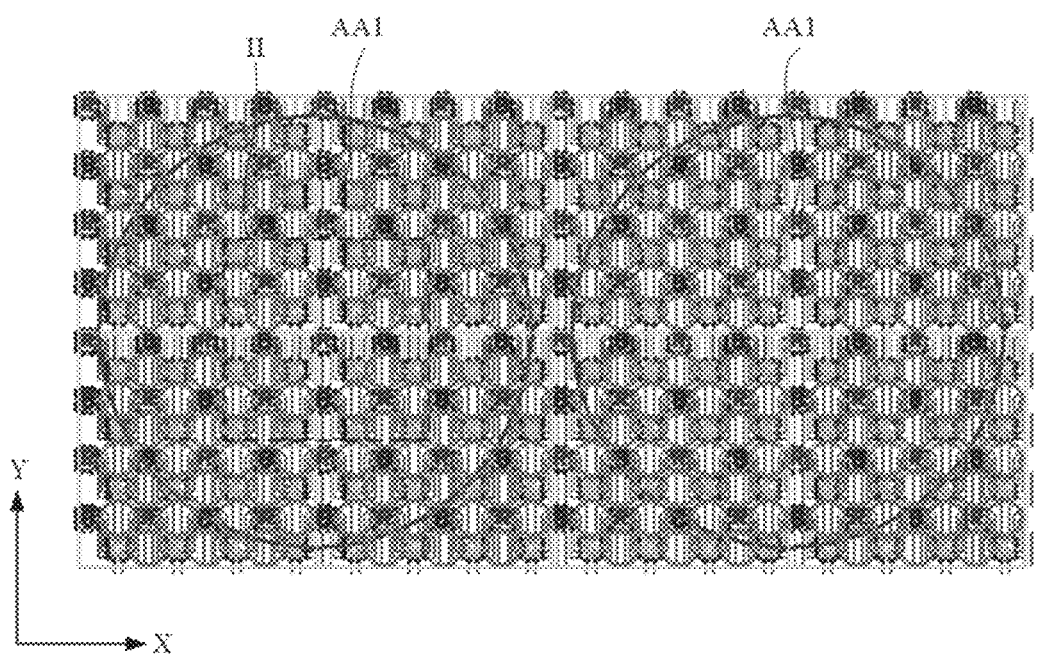
FIG. 3 shows a partial enlarged view of a display substrate at part I in FIG. 1, according to some exemplary embodiments of the present disclosure.
Figure 4:
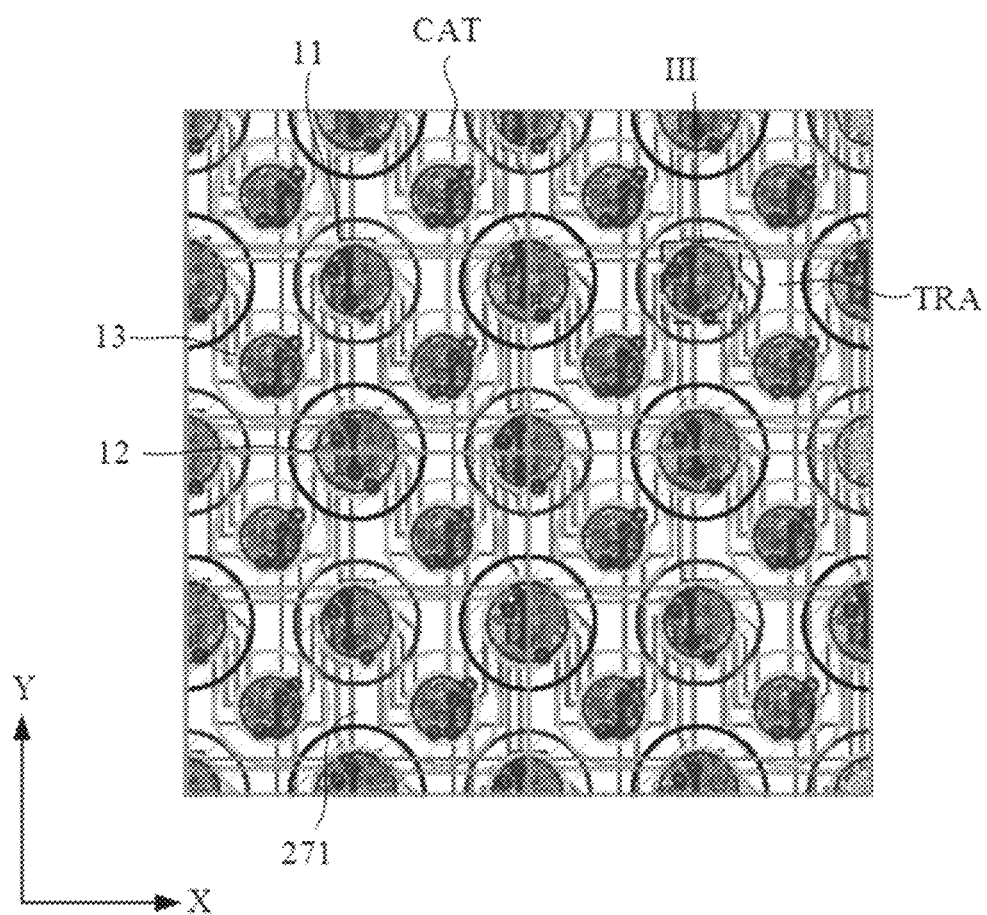
FIG. 4 shows a partial enlarged view of a display substrate at part II in FIG. 3, according to some exemplary embodiments of the present disclosure.
Figure 5:
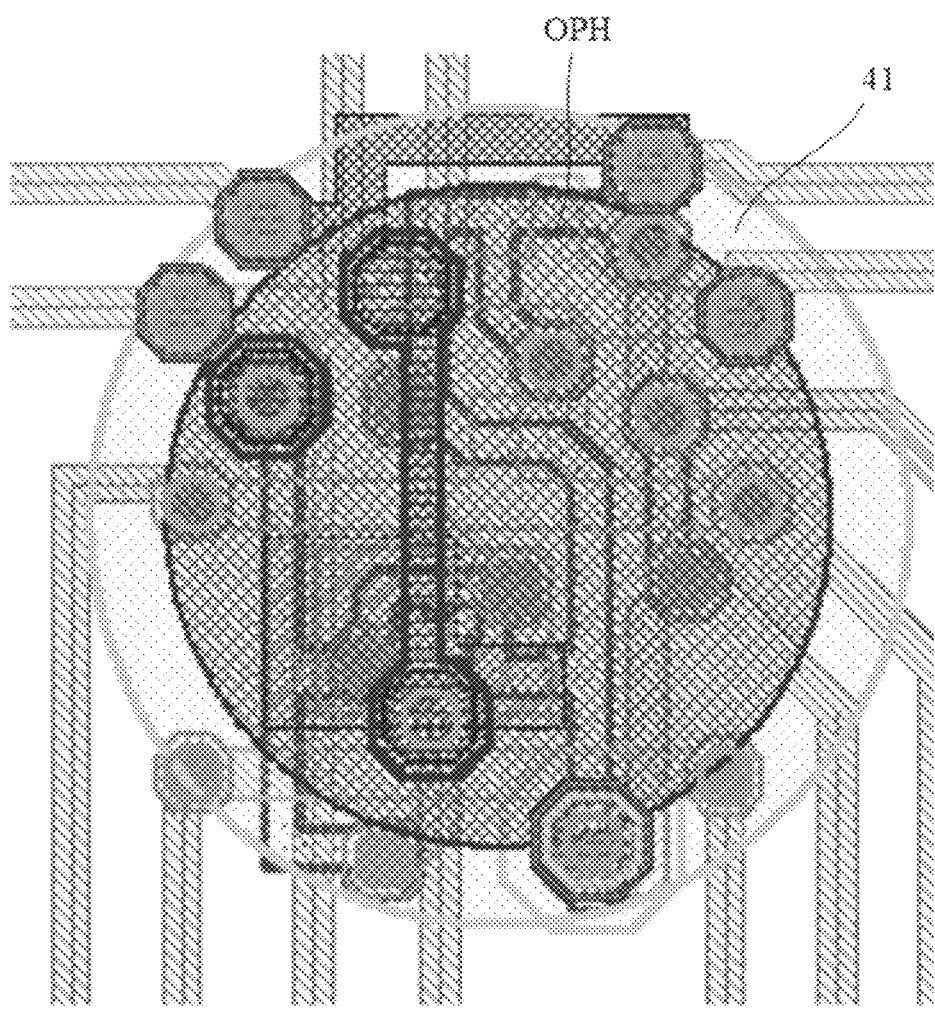
FIG. 5 shows a partial enlarged view of a display substrate at part III in FIG. 4, according to some exemplary embodiments of the present disclosure.

FIG. 3 shows a partial enlarged view of a display substrate at part I in FIG. 1, according to some exemplary embodiments of the present disclosure. FIG. 4 shows a partial enlarged view of a display substrate at part II in FIG. 3, according to some exemplary embodiments of the present disclosure. FIG. 5 shows a partial enlarged view of a display substrate at part III in FIG. 4, according to some exemplary embodiments of the present disclosure.

With reference to FIGS. 1 to 5, the display substrate may include the first display region AA1 and the second display region AA2, a light transmittance of the first display region AA1 is greater than a light transmittance of the second display region AA2. The first display region AA1 may correspond to the sensor 2, that is, an orthographic projection of the sensor 2 on the base substrate 1 falls within an orthographic projection of the first display region AA1 on the base substrate 1.

Figure 6A:
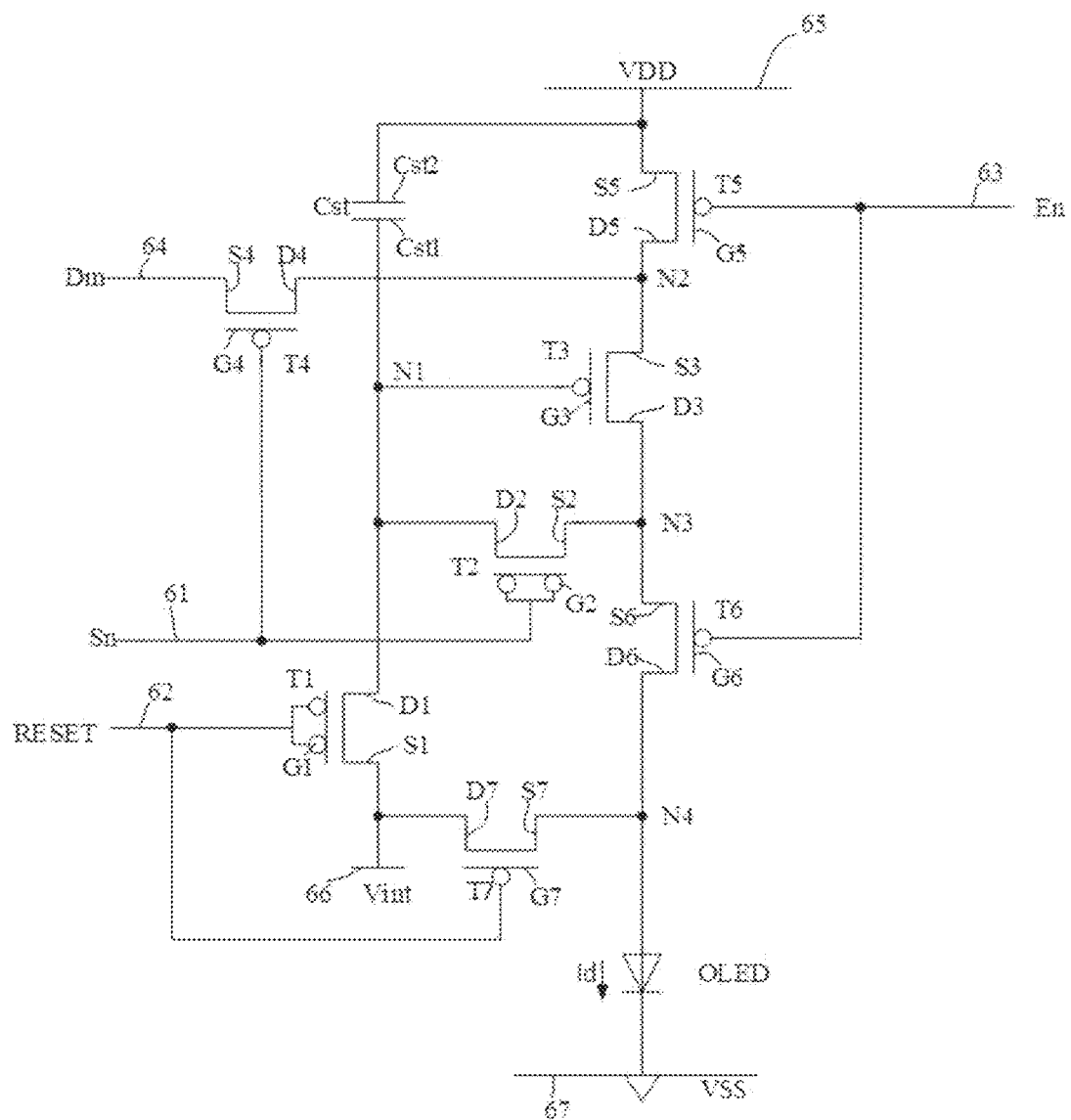
FIG. 6A shows an equivalent circuit diagram of a pixel driving circuit of a display substrate according to some exemplary embodiments of the present disclosure.
Figure 7:
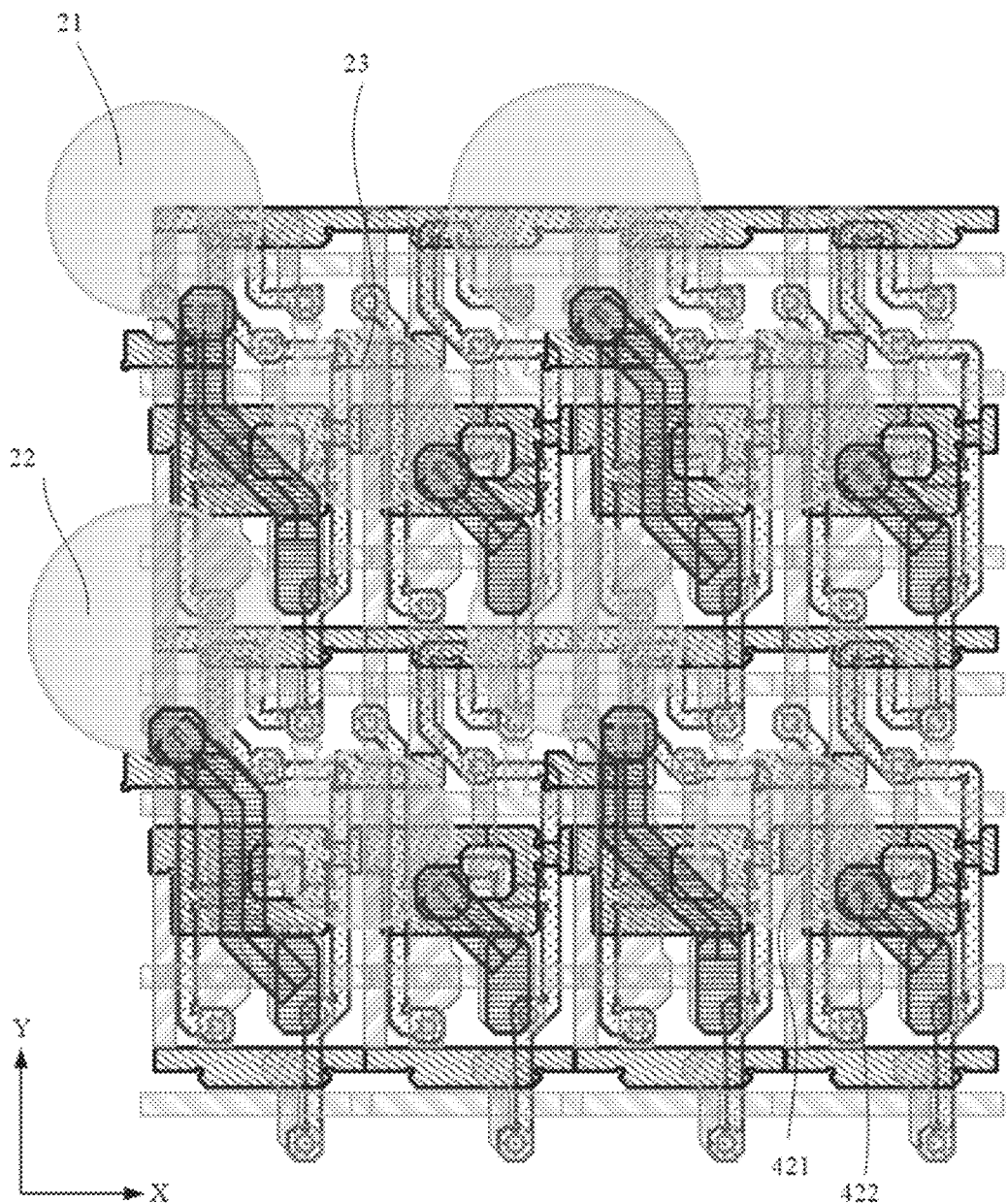
FIG. 7 shows a plan view of an exemplary embodiment of sub-pixels located in a second display region of a display substrate according to some exemplary embodiments of the present disclosure, in which a plan view of a repeating unit in the second display region is schematically shown.
Figure 8:
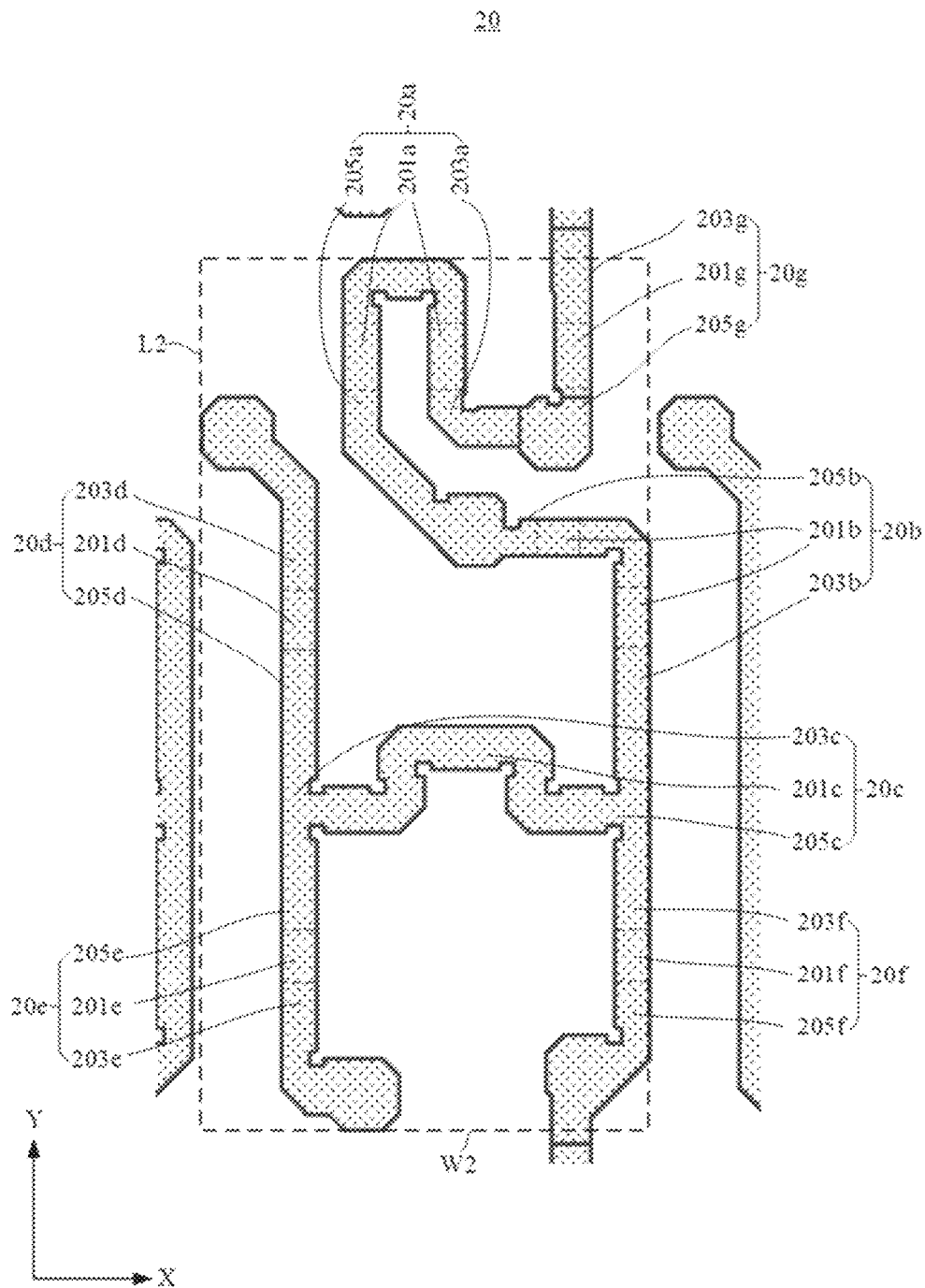
FIG. 8 shows a plan view of a semiconductor layer of an exemplary embodiment of a sub-pixel included in a repeating unit in FIG. 7.
Figure 9:
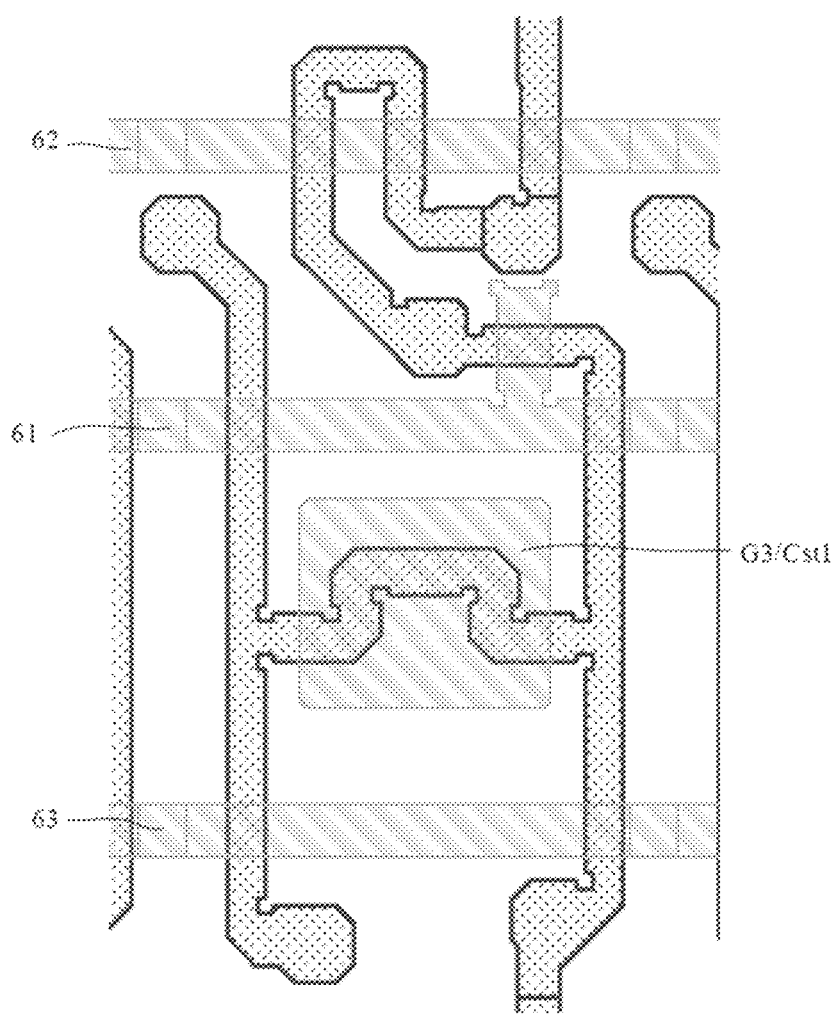
FIG. 9 shows a plan view of a combination of a semiconductor layer and a first conductive layer of an exemplary embodiment of a sub-pixel included in a repeating unit in FIG. 7.
Figure 10:
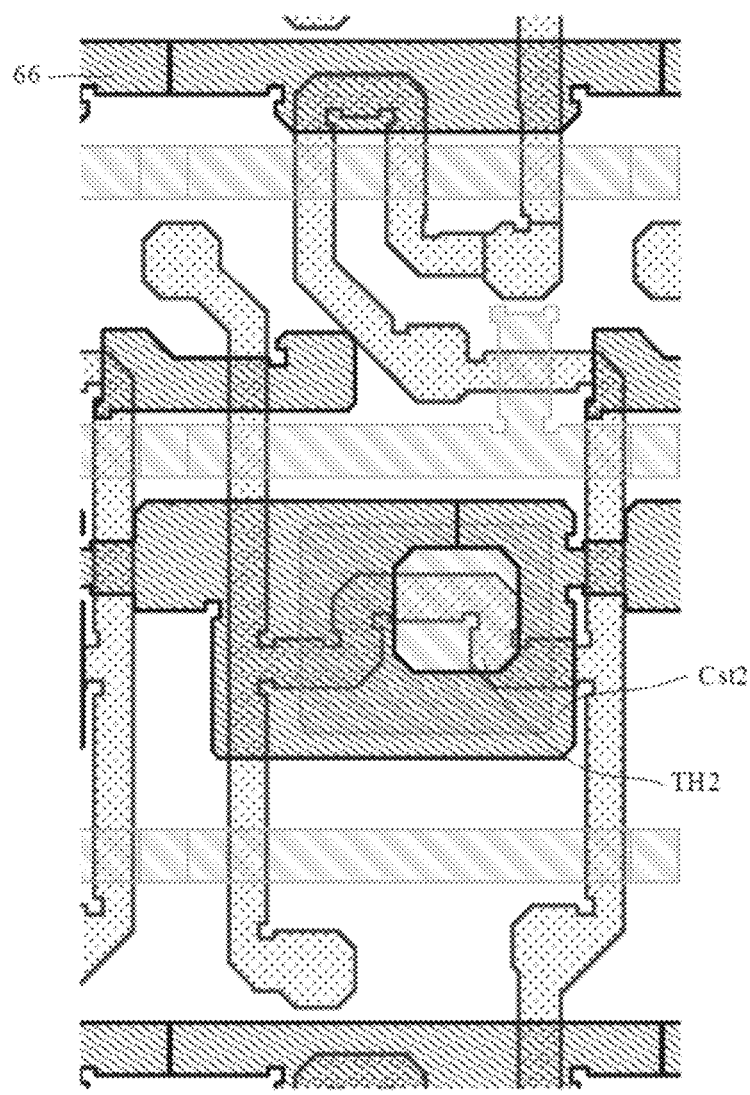
FIG. 10 shows a plan view of a combination of a semiconductor layer, a first conductive layer, and a second conductive layer of an exemplary embodiment of a sub-pixel included in a repeating unit in FIG. 7.
Figure 11:
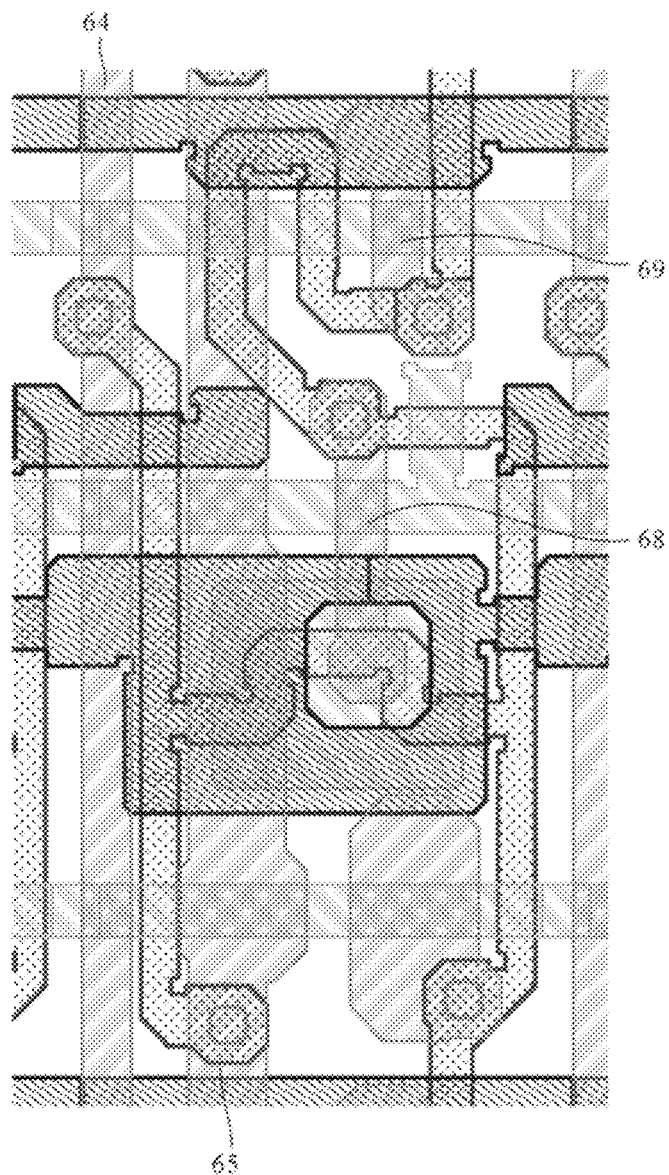
FIG. 11 shows a plan view of a combination of a semiconductor layer, a first conductive layer, a second conductive layer, and a third conductive layer of an exemplary embodiment of a sub-pixel included in a repeating unit in FIG. 7.
Figure 12A:
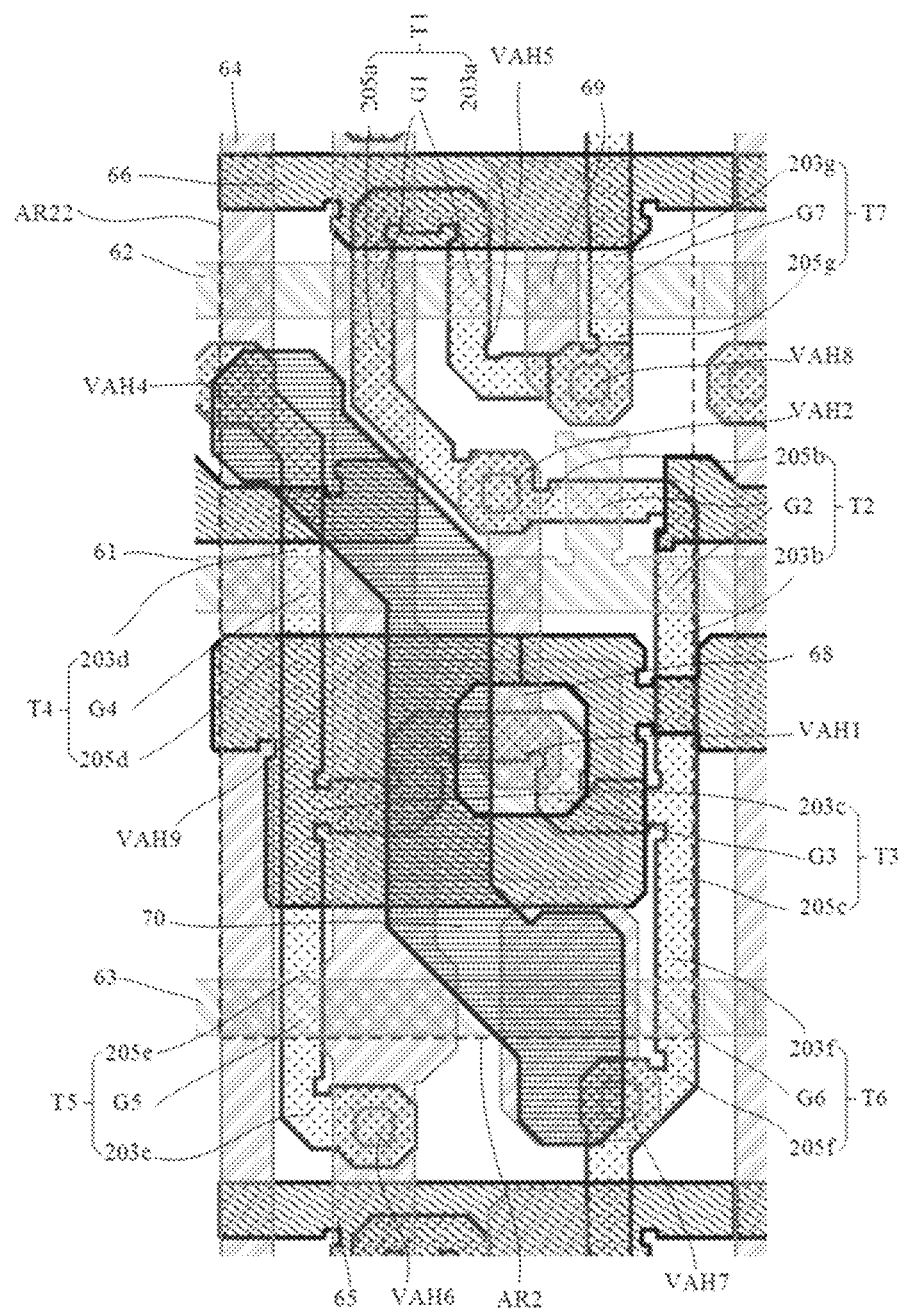
FIGS. 12A and 12B respectively show plan views of combinations of a semiconductor layer, a first conductive layer, a second conductive layer, a third conductive layer, and a fourth conductive layer of exemplary embodiments of sub-pixels included in a repeating unit in FIG. 7.
Figure 12B:
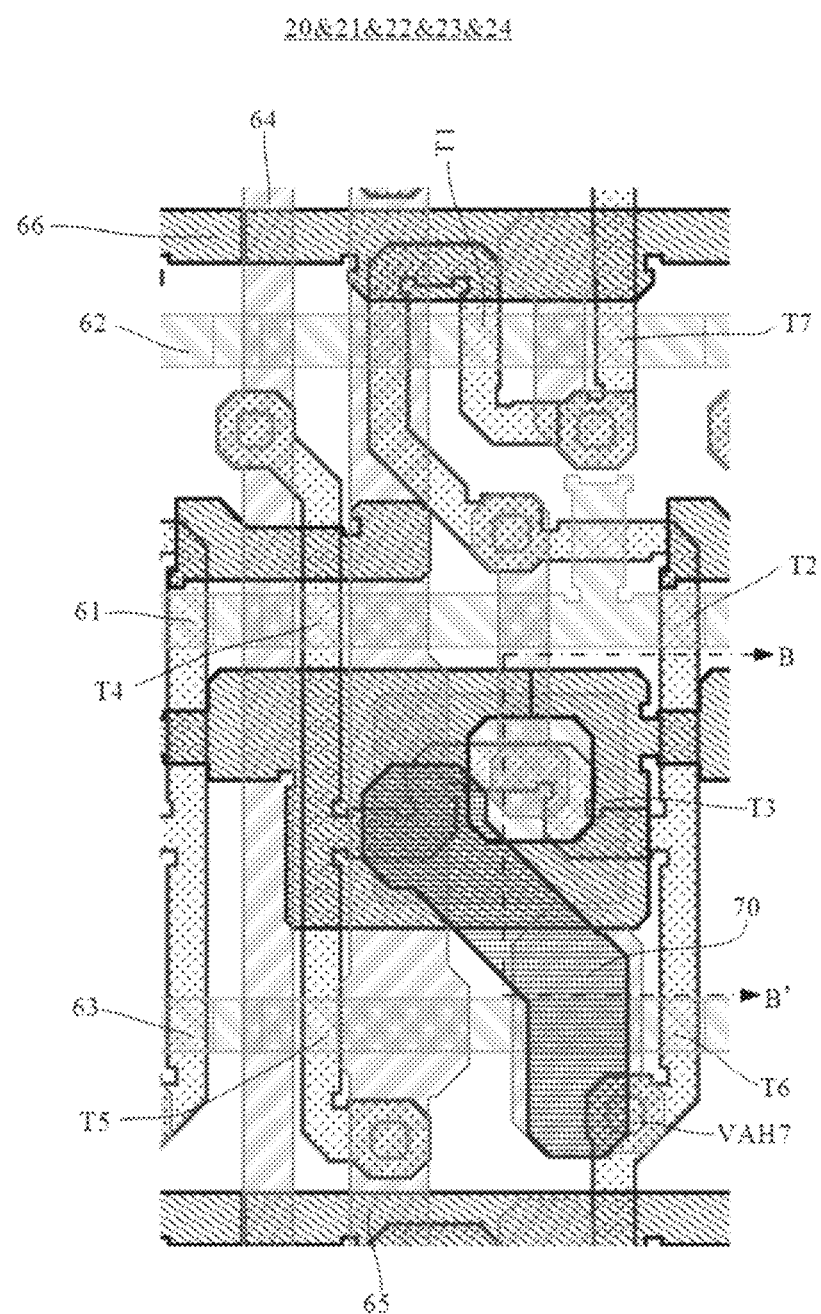
Figure 13:
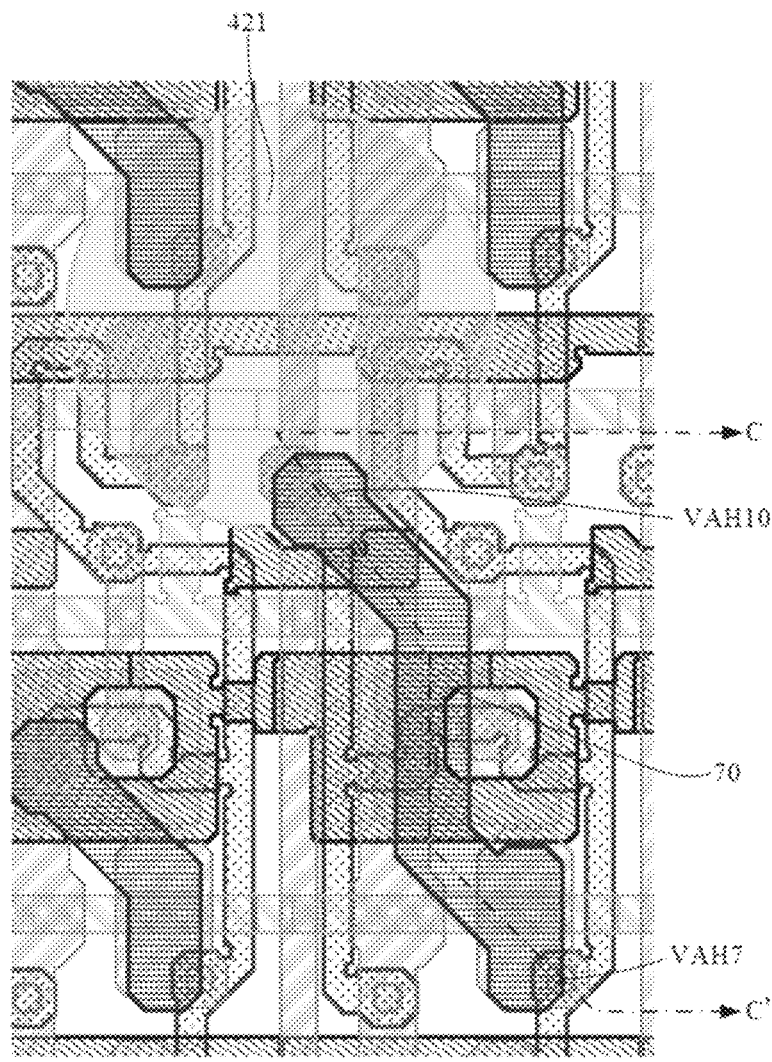
FIG. 13 shows a plan view of a combination of a semiconductor layer, a first conductive layer, a second conductive layer, a third conductive layer, a fourth conductive layer, and a fifth conductive layer of an exemplary embodiment of a sub-pixel included in a repeating unit in FIG. 7.
Figure 14A:
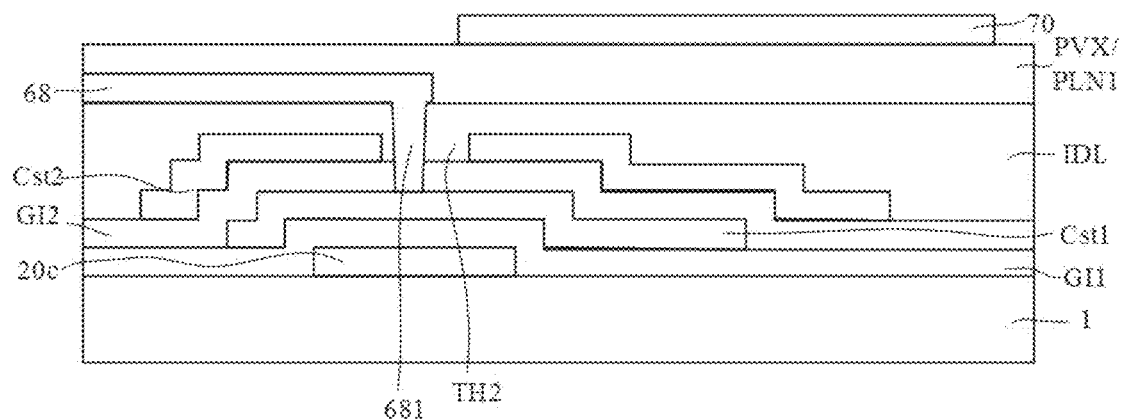
FIG. 14A shows a schematic cross-sectional view of a display substrate taken along a line BB' in FIG. 12B, according to some exemplary embodiments of the present disclosure.
Figure 14B:
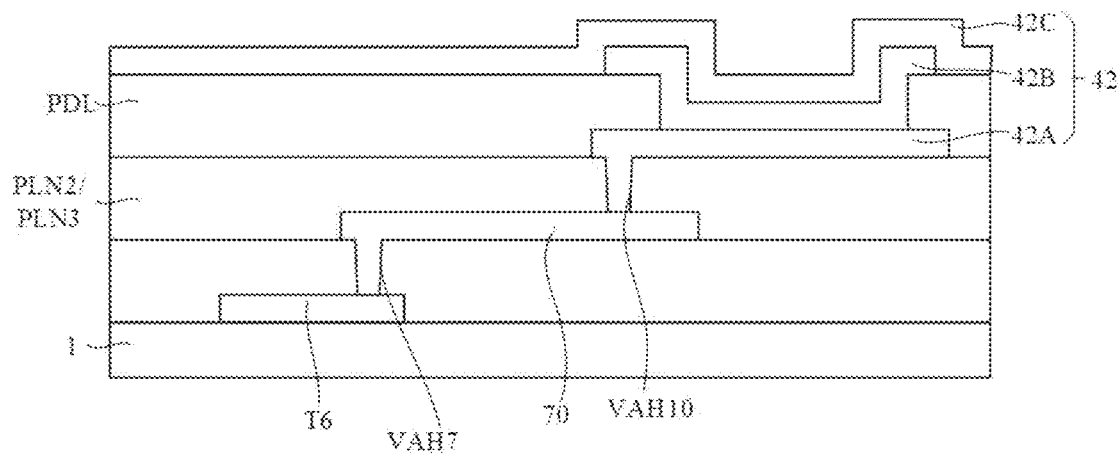
FIG. 14B shows a schematic cross-sectional view of a display substrate taken along a line CC' in FIG. 13, according to some exemplary embodiments of the present disclosure.

FIG. 6A shows an equivalent circuit diagram of a pixel driving circuit of a display substrate, according to some exemplary embodiments of the present disclosure. FIG. 7 shows a plan view of an exemplary embodiment of sub-pixels in a second display region AA2 of a display substrate according to some exemplary embodiments of the present disclosure, in which a plan view of a repeating unit in the second display region AA2 is schematically shown. FIG. 8 shows a plan view of a semiconductor layer of an exemplary embodiment of a sub-pixel included in a repeating unit in FIG. 7. FIG. 9 shows a plan view of a combination of a semiconductor layer and a first conductive layer of an exemplary embodiment of a sub-pixel included in a repeating unit in FIG. 7. FIG. 10 shows a plan view of a combination of a semiconductor layer, a first conductive layer, and a second conductive layer of an exemplary embodiment of a sub-pixel included in a repeating unit in FIG. 7. FIG. 11 shows a plan view of a combination of a semiconductor layer, a first conductive layer, a second conductive layer and a third conductive layer of an exemplary embodiment of a sub-pixel included in a repeating unit in FIG. 7. FIGS. 12A and 12B respectively show plan views of combinations of a semiconductor layer, a first conductive layer, a second conductive layer, a third conductive layer and a fourth conductive layer of exemplary embodiments of a sub-pixel included in a repeating unit in FIG. 7. FIG. 13 shows a plan view of a combination of a semiconductor layer, a first conductive layer, a second conductive layer, a third conductive layer, a fourth conductive layer, and a fifth conductive layer of an exemplary embodiment of a sub-pixel included in a repeating unit in FIG. 7. FIG. 14A shows a schematic cross-sectional view of a display substrate taken along a line BB' in FIG. 12B, according to some exemplary embodiments of the present disclosure. FIG. 14B shows a schematic cross-sectional view of a display substrate taken along a line CC' in FIG. 13, according to some exemplary embodiments of the present disclosure.

With reference to FIGS. 1 to 7, in the embodiments of the present disclosure, a plurality of pixels may be provided in the first display region AA1. The plurality of pixels may be arranged on the base substrate 1 in an array in a first direction X and a second direction Y. For example, each of the plurality of pixels may include a sub-pixel 11, a sub-pixel 12 and a sub-pixel 13. For ease of understanding, the sub-pixel 11, the sub-pixel 12 and the sub-pixel 13 may be respectively described as a red sub-pixel, a blue sub-pixel and a green sub-pixel. However, the embodiments of the present disclosure are not limited thereto.

A plurality of pixels may be provided in the second display region AA2. The plurality of pixels may be arranged on the base substrate 1 in an array in the first direction X and the second direction Y. For example, each of the plurality of pixels 20 may include a sub-pixel 21, a sub-pixel 22, and a sub-pixel 23. For ease of understanding, the sub-pixel 21, the sub-pixel 22 and the sub-pixel 23 may be respectively described as a red sub-pixel, a blue sub-pixel and a green sub-pixel. However, the embodiments of the present disclosure are not limited thereto.

In the embodiments of the present disclosure, a plurality of repeating units arranged in an array may be provided in the second display region AA2. For ease of description herein, a repeating unit located in the second display region AA2 is referred to as a second repeating unit P2. In some embodiments, a second repeating unit P2 may include at least one pixel. For example, in the embodiment shown in FIG. 7, a second repeating unit P2 includes two pixels. Accordingly, a second repeating unit P2 may include a plurality of sub-pixels, such as the above-mentioned sub-pixel 21, sub-pixel 22 and sub-pixel 23.

In the embodiments of the present disclosure, a plurality of repeating units arranged in an array are provided in the first display region AA1. For ease of description herein, a repeating unit located in the first display region AA1 is referred to as a first repeating unit P1. In some embodiments, a first repeating unit P1 may include at least one pixel. For example, in some embodiments, a first repeating unit P1 includes two pixels. Accordingly, a first repeating unit P1 may include a plurality of sub-pixels, such as the above-mentioned sub-pixel 11, sub-pixel 12 and sub-pixel 13.

It should be noted that, the embodiments of the present disclosure are described by taking red, green and blue as examples, however, the embodiments of the present disclosure are not limited thereto. That is, each repeating unit may include at least two different colors of sub-pixels, for example, a first color sub-pixel, a second color sub-pixel, and a third color sub-pixel, and the first color, the second color, and third color are different from each other. In some embodiments of the present disclosure, an arrangement of sub-pixels in each repeating unit may refer to an existing pixel arrangement, such as GGRB, RGBG, RGB, etc., which is not limited in the embodiments of the present disclosure.

It should be understood that, in the embodiments of the present disclosure, the sub-pixels located in the first display region AA1 and the second display region AA2 may include a pixel driving circuit and a light-emitting device. For example, the light-emitting device may be an OLED light-emitting device, and the OLED light-emitting device includes an anode, an organic light-emitting layer and a cathode that are stacked. The pixel driving circuit may include a plurality of thin film transistors and at least one storage capacitor.

It should be noted that, although in the illustrated embodiment, the first direction X and the second direction Y are perpendicular to each other, however, the embodiments of the present disclosure are not limited thereto.

Hereinafter, taking the 7T1C pixel driving circuit as an example, structures of pixel driving circuits of the sub-pixels located in the first display region AA1 and the second display region AA2 will be described in detail. However, the embodiments of the present disclosure are not limited to the 7T1C pixel driving circuit, and structures of other known pixel driving circuits may be applied to the embodiments of the present disclosure, under the condition of no conflict.

It should be understood that, in the embodiments of the present disclosure, with reference to FIGS. 13 and 14B, the display substrate 100 further includes a pixel defining layer PDL on a side of a first electrode (such as an anode) away from the pixel driving circuit. The pixel defining layer PDL includes a plurality of openings, and each sub-pixel corresponds to at least one opening (for example, one opening) in the pixel-defining layer, and an actual light-emitting region or a display region of a sub-pixel is substantially equivalent to an opening in the pixel-defining layer corresponding to the sub-pixel. In some embodiments, an area of an opening in the pixel defining layer corresponding to each sub-pixel or an actual light-emitting region of each sub-pixel is less than an area of the first electrode (such as an anode), and a projection of the opening in the pixel defining layer or the actual light-emitting region on the base substrate completely falls within a projection of the first electrode on the base substrate. For ease of illustration, in the embodiments of the present disclosure, only an approximate position and an approximate shape of the first electrode (such as an anode) of the sub-pixel are illustrated, so as to indicate a distribution of each sub-pixel.

With reference to FIGS. 7, 13 and 14B, each sub-pixel located in the second display region AA2 may include a light-emitting device (such as an OLED). For ease of description, a light-emitting device located in the second display region AA2 is referred to as a second light-emitting device 42. For example, the second light-emitting device 42 may include an anode 42A, a light-emitting material layer 42B, and a cathode 42C that are stacked. It should be noted that, for clarity, in the plan views, the anode of the second light-emitting device 42 is used to schematically illustrate the second light-emitting device 42, so as to schematically represent the sub-pixel located in the second display region AA2. For example, in the second display region AA2, the anode 42A of the second light-emitting device 42 may include an anode body portion 421 and an anode connection portion 422. An orthographic projection of the anode body portion 421 on the base substrate 1 may have a regular shape, such as a circle, an oval, a rectangle, a hexagon, an octagon, a rounded rectangle, and the like. The second display region AA2 is further provided with a pixel driving circuit (which will be described below) for driving the second light-emitting device 42, and the anode connection portion 422 is electrically connected to the pixel driving circuit for the second light-emitting device 42.

For example, referring to FIG. 7, the second repeating unit P2 may include a plurality of sub-pixels arranged in 4 rows and 4 columns. In the first row, a sub-pixel 21 and a sub-pixel 22 are arranged in the first column and the third column, respectively. In the second row, two sub-pixels 23 are arranged in the second column and the fourth column, respectively. In the third row, a sub-pixel 22 and a sub-pixel 21 are arranged in the first column and the third column, respectively. In the fourth row, two sub-pixels 23 are arranged in the second column and the fourth column, respectively.

It should be noted that, the arrangement of sub-pixels shown in FIG. 7 is only an exemplary arrangement of some embodiments of the present disclosure, and is not a limitation to the embodiments of the present disclosure. In other embodiments, the sub-pixels may be arranged in other ways.

For example, in some embodiments of the present disclosure, referring to FIG. 7, an area of an orthographic projection of an anode body portion 421 of a sub-pixel 21 on the base substrate 1 is less than an area of an orthographic projection of an anode body portion 421 of a sub-pixel 22 on the base substrate 1, and an area of an orthographic projection of an anode body portion 421 of a sub-pixel 23 on the base substrate 1 is less than the area of the orthographic projection of the anode body portion 421 of the sub-pixel 21 on the base substrate 1. That is, an actual light-emitting area of a green sub-pixel is the smallest, an actual light-emitting area of a blue sub-pixel is the largest, and an actual light-emitting area of a red sub-pixel is between the actual light-emitting areas of the green sub-pixel and the blue sub-pixel.

Referring to FIGS. 6A, 7 to 14B, the pixel driving circuit may include a plurality of thin film transistors and a storage capacitor Cst. The pixel driving circuit is used to drive an organic light-emitting diode (i.e., OLED). The plurality of thin film transistors include a first transistor T1, a second transistor T2, a third transistor T3, a fourth transistor T4, a fifth transistor T5, a sixth transistor T6, and a seventh transistor T7. Each transistor includes a gate, a source, and a drain.

The display substrate may further include a plurality of signal lines, for example, the plurality of signal lines include: a scan signal line 61 for transmitting a scan signal Sn, a reset signal line 62 for transmitting a reset control signal RESET (for example, the reset control signal RESET may be a scan signal of a previous row), a light-emitting control line 63 for transmitting a light-emitting control signal En, a data signal line 64 for transmitting a data signal Dm, a driving voltage line 65 for transmitting a driving voltage VDD, an initialization voltage line 66 for transmitting an initialization voltage Vint, and a power supply line 67 for transmitting a VSS voltage.

The storage capacitor Cst may include two capacitive plates Cst1 and Cst2. Herein, the capacitive plate Cst1 may be referred to as one end, a first end, or a first storage capacitor electrode of the storage capacitor Cst, and the capacitive plate Cst2 may be referred to as the other end, a second end, or a second storage capacitor electrode of the storage capacitor Cst.

The first transistor T1, the second transistor T2, the third transistor T3, the fourth transistor T4, the fifth transistor T5, the sixth transistor T6 and the seventh transistor T7 may be formed along an active layer as shown in FIG. 8. The active layer may have a curved or bent shape, and may include a first active layer 20a corresponding to the first transistor T1, a second active layer 20b corresponding to the second transistor T2, a third active layer 20c corresponding to the third transistor T3, a fourth active layer 20d corresponding to the fourth transistor T4, a fifth active layer 20e corresponding to the fifth transistor T5, a sixth active layer 20f corresponding to the sixth transistor T6, and a seventh active layer 20g corresponding to the seventh transistor T7.

The active layer may include, for example, polysilicon, and include, for example, a channel region, a source region, and a drain region. The channel region may not be doped, or a doping type thereof is different from doping types of the source region and the drain region, and therefore the channel region has a semiconductor characteristic. The source region and the drain region are respectively located on both sides of the channel region, and are doped with impurities, and therefore have electrical conductivity. The impurities may be changed according to whether the TFT is an N-type transistor or a P-type transistor.

The first transistor T1 includes the first active layer 20a and a first gate G1. The first active layer 20a includes a first channel region 201a, a first source region 203a, and a first drain region 205a. The gate G1 of the first transistor T1 is electrically connected to the reset signal line 62. A source S1 of the first transistor T1 is electrically connected to the initialization voltage line 66. A drain D1 of the first transistor T1 is electrically connected to the end Cst1 of the storage capacitor Cst, a drain D2 of the second transistor T2, and a gate G3 of the third transistor T3. As shown in FIG. 6A, the drain D1 of the first transistor T1, the end Cst1 of the storage capacitor Cst1, the drain D2 of the second transistor T2, and the gate G3 of the third transistor T3 are electrically connected at a node N1. The first transistor T1 is turned on according to the reset control signal RESET transmitted via the reset signal line 62, so as to transmit the initialization voltage Vint to the gate G3 of the third transistor T3, so that an initialization operation is performed to initialize a voltage at the gate G3 of the third transistor T3. That is, the first transistor T1 is also referred to as a reset transistor herein.

The second transistor T2 includes the second active layer 20b and a second gate G2. The second active layer 20b includes a second channel region 201b, a second source region 203b, and a second drain region 205b. The gate G2 of the second transistor T2 is electrically connected to the scan signal line 61, a source S2 of the second transistor T2 is electrically connected to a node N3, and the drain D2 of the second transistor T2 is electrically connected to the node N1. The second transistor T2 is turned on according to the scan signal Sn transmitted via the scan signal line 61, so as to electrically connect the gate G3 and a drain D3 of the third transistor T3 to each other, thereby implementing a diode connection of the third transistor T3. Herein, the second transistor T2 is also referred to as a compensation transistor.

The third transistor T3 includes the third active layer 20c and the third gate G3. The third active layer 20c includes a third source region 203c, a third drain region 205c, and a third channel region 201c connecting the third source region 203c and the third drain region 205c. The third source region 203c and the third drain region 205c extend in two opposite directions relative to the third channel region 201c. The third source region 203c of the third transistor T3 is connected to a fourth drain region 205d and a fifth drain region 205e. The third drain region 205c is connected to the second source region 203b and a sixth source region 203f. The gate G3 of the third transistor T3 is electrically connected to the node N1 through via holes VAH1 and VAH2, and a first connection portion 68. The gate G3 of the third transistor T3 is electrically connected to the node N1, a source S3 of the third transistor T3 is electrically connected to the node N2, and the drain D3 of the third transistor T3 is electrically connected to the node N3. The third transistor T3 receives the data signal Dm according to a switching operation of the fourth transistor T4, so as to provide a driving current Id to the OLED. Herein, the third transistor T3 is also referred to as a driving transistor.

The fourth transistor T4 includes the fourth active layer 20d and a fourth gate G4. The fourth active layer 20d includes a fourth channel region 201d, a fourth source region 203d, and a fourth drain region 205d. The fourth transistor T4 serves as a switching device for selecting a target light-emitting sub-pixel. The fourth gate G4 is connected to the scan signal line 61, the fourth source region 203d is connected to the data signal line 64 through a via hole VAH4, and the fourth drain region 205d is connected to the first transistor T1 and the fifth transistor T5, that is, electrically connected to the node N2. The fourth transistor T4 is turned on according to the scan signal Sn transmitted via the scan signal line 61, so as to perform a switching operation to transmit the data signal Dm to the source S3 of the third transistor T3. Herein, the fourth transistor T4 is also referred to as a switching transistor.

The fifth transistor T5 includes the fifth active layer 20e and a fifth gate G5. The fifth active layer 20e includes a fifth channel region 201e, a fifth source region 203e, and a fifth drain region 205e. The fifth source region 203e may be connected to the driving voltage line 65 through a via hole VAH6. The gate G5 of the fifth transistor T5 is electrically connected to the light-emitting control line 63, and a source S5 of the fifth transistor T5 is electrically connected to the driving voltage line 65. A drain D5 of the fifth transistor T5 is electrically connected to the node N2. Herein, the fifth transistor T5 is also referred to as an operation control transistor.

The sixth transistor T6 includes the sixth active layer 20f and a sixth gate G6, and the sixth active layer 20f includes a sixth channel region 201f, a sixth source region 203f, and a sixth drain region 205f. The sixth drain region 205f may be connected to an anode of the OLED through a via hole VAH7. The gate G6 of the sixth transistor T6 is electrically connected to the light-emitting control line 63, a source S6 of the sixth transistor T6 is electrically connected to the node N3, and a drain D6 of the sixth transistor T6 is electrically connected to a node N4, that is, electrically connected to the anode of the OLED. The fifth transistor T5 and the sixth transistor T6 are concurrently (for example, simultaneously) turned on according to the light-emitting control signal En transmitted via the light-emitting control line 63, so as to transmit the driving voltage VDD to the OLED, thereby allowing the driving current Id to flow into the OLED. Herein, the sixth transistor T6 is also referred to as a light-emitting control transistor.

The seventh transistor T7 includes the seventh active layer 20g and a seventh gate G7. The seventh active layer 20g includes a seventh source region 203g, a seventh drain region 205g, and a seventh channel region 201g. The seventh drain region 205g is connected to the first source region 203a of the first transistor T1. The seventh drain region 205g may be electrically connected to the initialization voltage line 66 through a via hole VAH8, a second connection portion 69, and a via hole VAH5. The gate G7 of the seventh transistor T7 is electrically connected to the reset signal line 62, a source S7 of the seventh transistor T7 is electrically connected to the node N4, and a drain D7 of the seventh transistor T7 is electrically connected to the initialization voltage line 66. Under the control of the seventh transistor T7, the initialization voltage Vint transmitted by the initialization voltage line 66 may be provided to the OLED, for example, to the first electrode (such as the anode) of the OLED, so as to initialize a voltage of the first electrode of the OLED. Herein, the seventh transistor T7 may also be referred to as an initialization transistor T7.

The end Cst1 (hereinafter referred to as the first storage capacitor electrode) of the storage capacitor Cst is electrically connected to the node N1, and the other end Cst2 (hereinafter referred to as the second storage capacitor electrode) of the storage capacitor Cst is electrically connected to the driving voltage line 65.

The anode of the OLED is electrically connected to the node N4, and a cathode of the OLED is electrically connected to the power supply line 67 to receive a common voltage VSS. Accordingly, the OLED receives the driving current Id from the third transistor T3 to emit light, thereby displaying an image.

It should be noted that, in FIG. 6A, each of the thin film transistors T1, T2, T3, T4, T5, T6, and T7 is a p-channel field effect transistor, however, the embodiments of the present disclosure are not limited thereto, and at least some of the thin film transistors T1, T2, T3, T4, T5, T6, and T7 may be n-channel field effect transistors.

In operation, in an initialization phase, the reset control signal RESET being at a low level is provided via the reset signal line 62. Subsequently, the first transistor T1 is turned on based on the reset control signal RESET being at a low level, and the initialization voltage Vint from the initialization voltage line 66 is transmitted to the gate G3 of the third transistor T3 via the first transistor T1. Therefore, the third transistor T3 is initialized due to the initialization voltage Vint.

In a data programming phase, the scan signal Sn being at a low level is provided via the scan signal line 61. Subsequently, the fourth transistor T4 and the second transistor T2 are turned on based on the scan signal Sn being at a low level. Therefore, the third transistor T3 is in a diode-connected state as the second transistor T2 is turned on, and the third transistor T3 is positive biased.

Subsequently, a compensation voltage (Dm+Vth) (for example, Vth is a negative value), which is obtained by subtracting a threshold voltage Vth of the third transistor T3 from the data signal Dm provided via the data signal line 64, is applied to the gate G3 of the third transistor T3. Subsequently, the driving voltage VDD and the compensation voltage (Dm+Vth) are applied to the two ends of the storage capacitor Cst, so that electric charges corresponding to a voltage difference between corresponding ends are stored in the storage capacitor Cst.

In a light-emitting phase, the light-emitting control signal En from the light-emitting control line 63 changes from being at a high level to being at a low level. Subsequently, in the light-emitting phase, the fifth transistor T5 and the sixth transistor T6 are turned on based on the light-emitting control signal En being at a low level.

Subsequently, a driving current is generated based on a difference between a voltage at the gate G3 of the third transistor T3 and the driving voltage VDD. The driving current Id corresponding to a difference between the driving current and a bypass current is provided to the OLED via the sixth transistor T6.

In the light-emitting phase, based on a current-voltage relationship of the third transistor T3, a gate-source voltage of the third transistor T3 is maintained at ((Dm+Vth)−VDD) due to the storage capacitor Cst. The driving current Id is proportional to $(Dm-VDD)^2$. Therefore, the driving current Id may not be affected by variation of the threshold voltage Vth of the third transistor T3.

Referring to FIGS. 7 to 14B, the display substrate includes a base substrate 1 and a plurality of film layers arranged on the base substrate 1. In some embodiments, the plurality of film layers include at least a semiconductor layer 20, a first conductive layer 21, a second conductive layer 22, a third conductive layer 23, and a fourth conductive layer 24. The semiconductor layer 20, the first conductive layer 21, the second conductive layer 22, and the third conductive layer 23 are arranged away from the base substrate 1 sequentially. The plurality of film layers further include at least a plurality of insulating film layers. For example, the plurality of insulating film layers may include a first gate insulating layer GI1, a second gate insulating layer GI2, an interlayer insulating layer IDL, and a passivation layer PVX. The first gate insulating layer GI1 may be arranged between the semiconductor layer 20 and the first conductive layer 21, the second gate insulating layer GI2 may be arranged between the first conductive layer 21 and the second conductive layer 22, and the interlayer insulating layer IDL may be arranged between the second conductive layer 22 and the third conductive layer 23, and the passivation layer PVX may be arranged between the third conductive layer 23 and the fourth conductive layer 24.

For example, the semiconductor layer 20 may be made of a semiconductor material such as low-temperature polysilicon, and a film thickness thereof may be within a range of 400 angstroms to 800 angstroms, such as 500 angstroms. The first conductive layer 21 and the second conductive layer 22 may be made of a conductive material used to form a gate of a thin film transistor, for example, the conductive material may be Mo, and a film thickness of the first conductive layer 21 and the second conductive layer 22 may be within a range of 2000 angstroms to 4000 angstroms, such as 3000 angstroms. The third conductive layer 23 and the fourth conductive layer 24 may be made of a conductive material used to form a source and drain of a thin film transistor, for example, the conductive material may include Ti, Al, etc. The third conductive layer 23 may have a stack structure formed of Ti/Al/Ti, a film thickness of the third conductive layer 23 may range from 6000 angstroms to 9000 angstroms. For example, in a case that the third conductive layer 23 or the fourth conductive layer 24 has a stack structure formed of Ti/Al/I, thicknesses of respective layers of Ti/Al/Ti may be about 500 angstroms, 6000 angstroms, and 500 angstroms. For example, the first gate insulating layer GI1 and the second gate insulating layer GI2 may be made of silicon oxide, silicon nitride or silicon oxynitride, and each layer may have a thickness ranging from about 1000 angstroms to 2000 angstroms. For example, the interlayer insulating layer IDL and the passivation layer PVX may be made of silicon oxide, silicon nitride or silicon oxynitride, with a thickness ranging from about 3000 angstroms to 6000 angstroms.

The display substrate includes the scan signal line 61, the reset signal line 62, the light-emitting control line 63 and the initialization voltage line 66 arranged in a row direction X to respectively apply the scan signal Sn, the reset control signal RESET, the light-emitting control signal En, and the initialization voltage Vint to each sub-pixel. The display substrate may further include the data signal line 64 and the driving voltage line 65 intersecting the scan signal line 61, the reset signal line 62, the light-emitting control line 63 and the initialization voltage line 66, so as to respectively apply the data signal Dm and the driving voltage VDD to each sub-pixel.

As shown in FIGS. 9, 12A and 12B, each of the scan signal line 61, the reset signal line 62, and the light-emitting control line 63 is located in the first conductive layer 21. Each of the gates G1 to G7 of the transistors described above is also located in the first conductive layer 21. For example, parts of the reset signal line 62 overlapping the semiconductor layer 20 respectively form the gate G1 of the first transistor T1 and the gate G7 of the seventh transistor T7, parts of the scan signal line 61 overlapping the semiconductor layer 20 respectively form the gate G2 of the second transistor T2 and the gate G4 of the fourth transistor T4, and parts of the light-emitting control line 63 overlapping the semiconductor layer 20 respectively form the gate G6 of the sixth transistor T6 and the gate G5 of the fifth transistor T5.

With reference to FIG. 9, the display substrate may further include a plurality of first storage capacitor electrodes Cst1. The plurality of first storage capacitor electrodes Cst1 are also located in the first conductive layer 21. A part of the first storage capacitor electrode Cst1 overlapping the semiconductor layer 20 forms the third gate G3 of the third transistor T3. The first storage capacitor electrode Cst1 also forms an end of the storage capacitor Cst. That is, the first storage capacitor electrode Cst1 simultaneously serves as the gate G3 of the third transistor T3 and an electrode of the storage capacitor Cst.

For example, an orthographic projection of the first storage capacitor electrode Cst1 on the base substrate 1 may have a substantially rectangular shape. The "substantially rectangular shape" may include a shape such as a rectangle, a rectangle with at least one corner rounded, and a rectangle with at least one corner chamfered.

As shown in FIG. 10, the initialization voltage line 66 is located in the second conductive layer 22. The display substrate may further include a plurality of second storage capacitor electrodes Cst2. The plurality of second storage capacitor electrodes Cst2 are also located in the second conductive layer 22. The plurality of second storage capacitor electrodes Cst2 are arranged corresponding to the plurality of first storage capacitor electrodes Cst1, respectively. That is, an orthographic projection of the plurality of second storage capacitor electrodes Cst2 on the base substrate 1 and an orthographic projection of the corresponding first storage capacitor electrodes Cst1 on the base substrate 1 at least partially overlap. The second storage capacitor electrode Cst2 forms the other end of the storage capacitor Cst. That is, the first storage capacitor electrode Cst1 and the second storage capacitor electrode Cst2 are oppositely arranged, the orthographic projections of the two on the base substrate 1 at least partially overlap each other, and the second gate insulating layer G12 is arranged between the two. For example, the first storage capacitor electrode Cst1 may be electrically connected to the node N1 through the via holes VAH1 and VAH2, and the first connection portion 68, and the second storage capacitor electrode Cst2 may be electrically connected to the driving voltage line 65 through a via hole VAH9, that is, the first storage capacitor electrode Cst1 and the second storage capacitor electrode Cst2 are connected to different voltage signals. In this way, a part where the first storage capacitor electrode Cst1 and the second storage capacitor electrode Cst2 overlap each other may form the storage capacitor Cst.

With reference to FIGS. 10, 12A, 12B, and 14A, the second storage capacitor electrode Cst2 may include a through hole TH2, so that the first storage capacitor electrode Cst1 under the second storage capacitor electrode Cst2 is connected with a component located in the third conductive layer 23. For example, a part of the first connection portion 68 is formed in the via hole VAH1 to form a conductive plug 681. The conductive plug 681 extends through the through hole TH2 to be electrically connected with the first storage capacitor electrode Cst1. In this way, an end of the first connection portion 68 is electrically connected with an end Cst1 of the storage capacitor.

For example, an orthographic projection of the through hole TH2 on the base substrate 1 may have a substantially rectangular shape. The "substantially rectangular shape" may include a shape such as a rectangle or a square, a rectangle or square with at least one corner rounded, and a rectangle or square with at least one corner chamfered.

Referring FIG. 11, the data signal line 64 and the driving voltage line 65 are located in the third conductive layer 23. In addition, the first connection portion 68 and the second connection portion 69 are also located in the third conductive layer 23.

Referring to FIGS. 12A, 12B and 13, a third connection portion 70 is located in the fourth conductive layer 24. One end of the third connection portion 70 is electrically connected to the sixth transistor T6, and the other end of the third connection portion 70 is electrically connected to the anode of the OLED.

Referring to FIGS. 13 and 14B, the display substrate 100 may further include an insulating layer arranged between the fourth conductive layer 24 and the fifth conductive layer 25, such as a planarization layer PLN. For example, the planarization layer PLN may include a single film layer or a plurality of film layers. In a case that the planarization layer PLN includes the plurality of film layers, the plurality of film layers of the planarization layer PLN may be represented as a first planarization layer PLN1, a second planarization layer PLN2, and a third planarization layer PLN3, respectively. A via hole VAH10 may pass through the planarization layer PLN. The anode 42A of the second light-emitting device 42 is located in the fifth conductive layer 25. A part of the anode connection portion 422 is formed in the via hole VAH10, and this part extends downward to be electrically connected with a part of the third connection portion 70.

One end of the third connection portion 70 is electrically connected with the sixth transistor T6 through the via hole VAH7, and the other end of the third connection portion 70 is electrically connected to the anode connection portion 422 through the via hole VAH10. In order to meet the requirements of the preset PPI, each sub-pixel on the display substrate needs to be arranged in a prescribed manner. In this way, extension lengths of third connection portions 70 in respective sub-pixels may be the same or different from each other.

For example, referring to FIGS. 7, 12A, and 12B, FIG. 12A shows a plan view of a pixel driving circuit of the sub-pixel 21 or the sub-pixel 21, and FIG. 12B shows a plan view of a pixel driving circuit of the sub-pixel 23. In the embodiments of the present disclosure, an extension length of a third connection portion 70 in the sub-pixel 23 may be less than an extension length of a third connection portion 70 in the sub-pixel 21 or the sub-pixel 22.

Figure 6B:
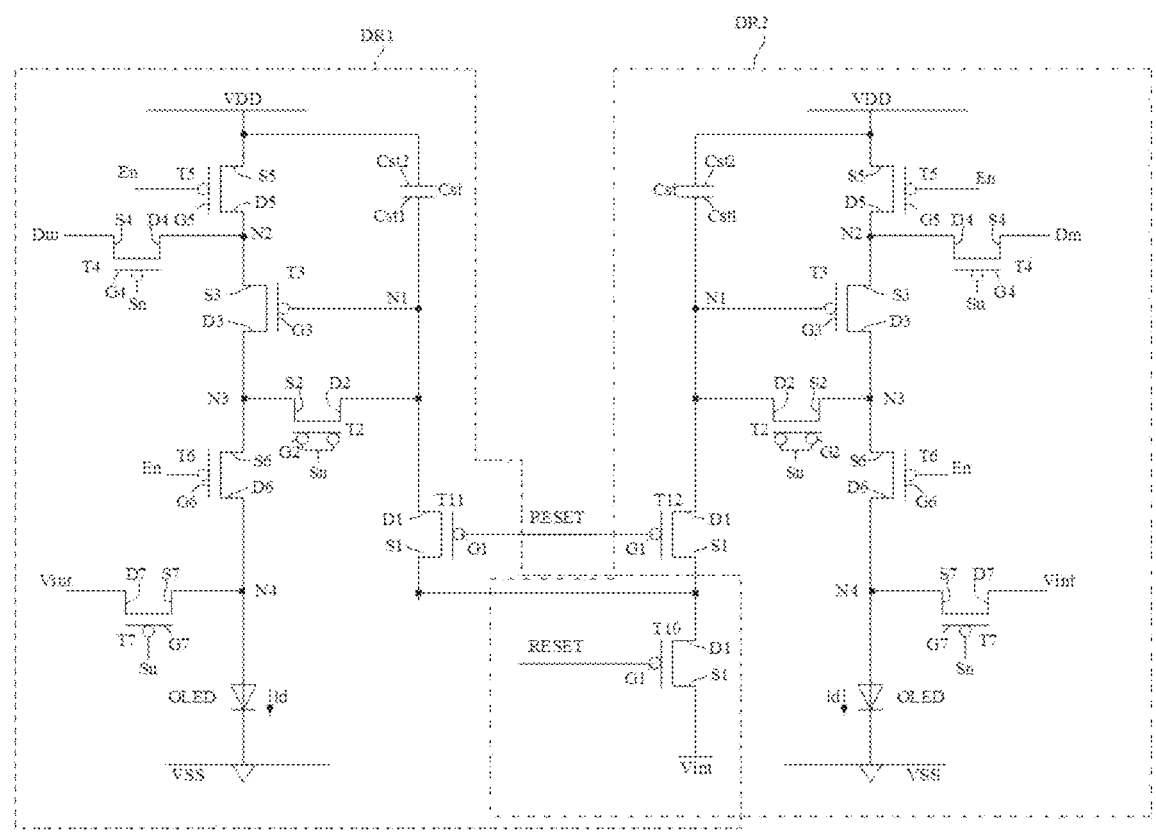
FIG. 6B shows an equivalent circuit diagram of a pixel driving circuit of a sub-pixel located in a first display region of a display substrate according to some exemplary embodiments of the present disclosure.
Figure 15:
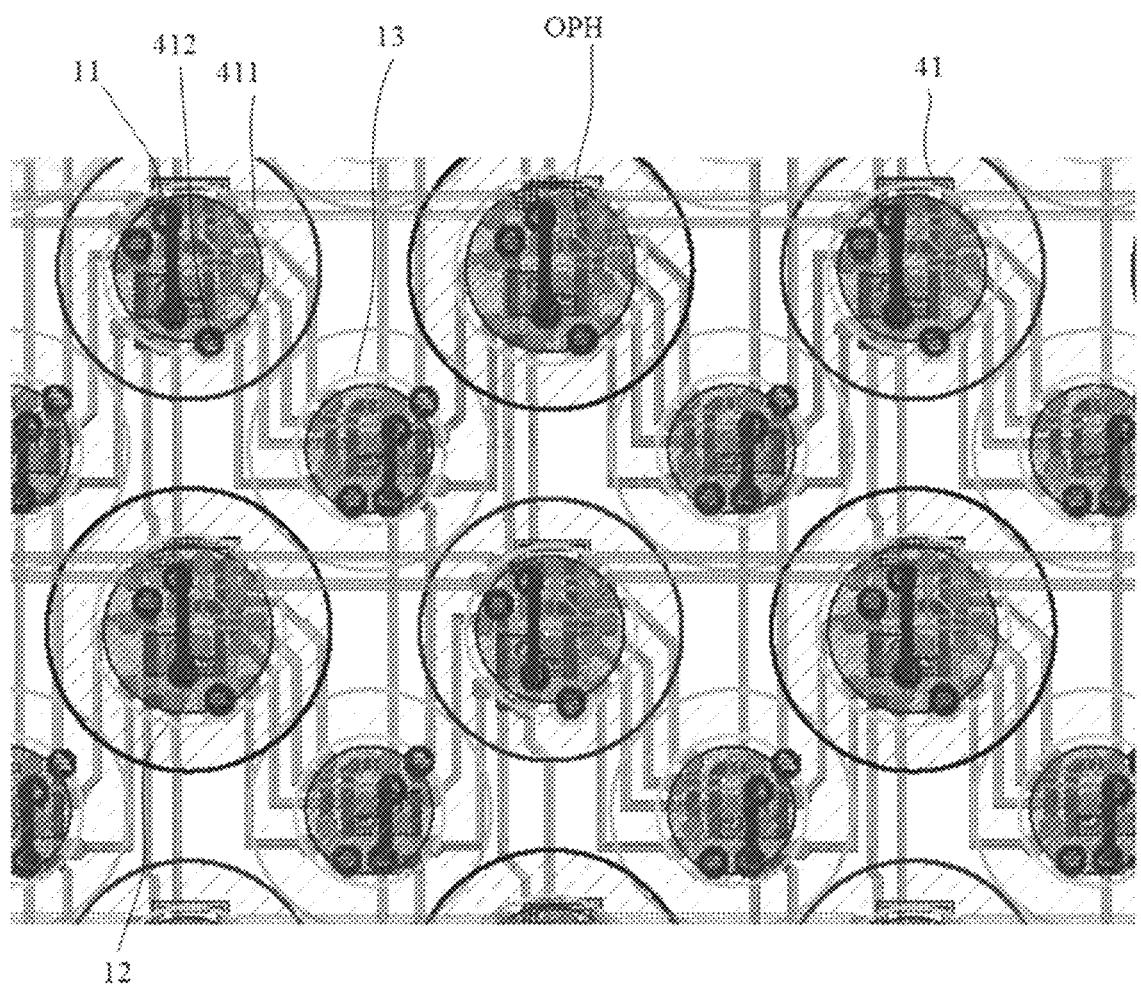
FIG. 15 shows a plan view of an exemplary embodiment of sub-pixels in a first display region of a display substrate, according to some exemplary embodiments of the present disclosure, in which a plan view of a repeating unit in the first display region is schematically shown.
Figure 16A:
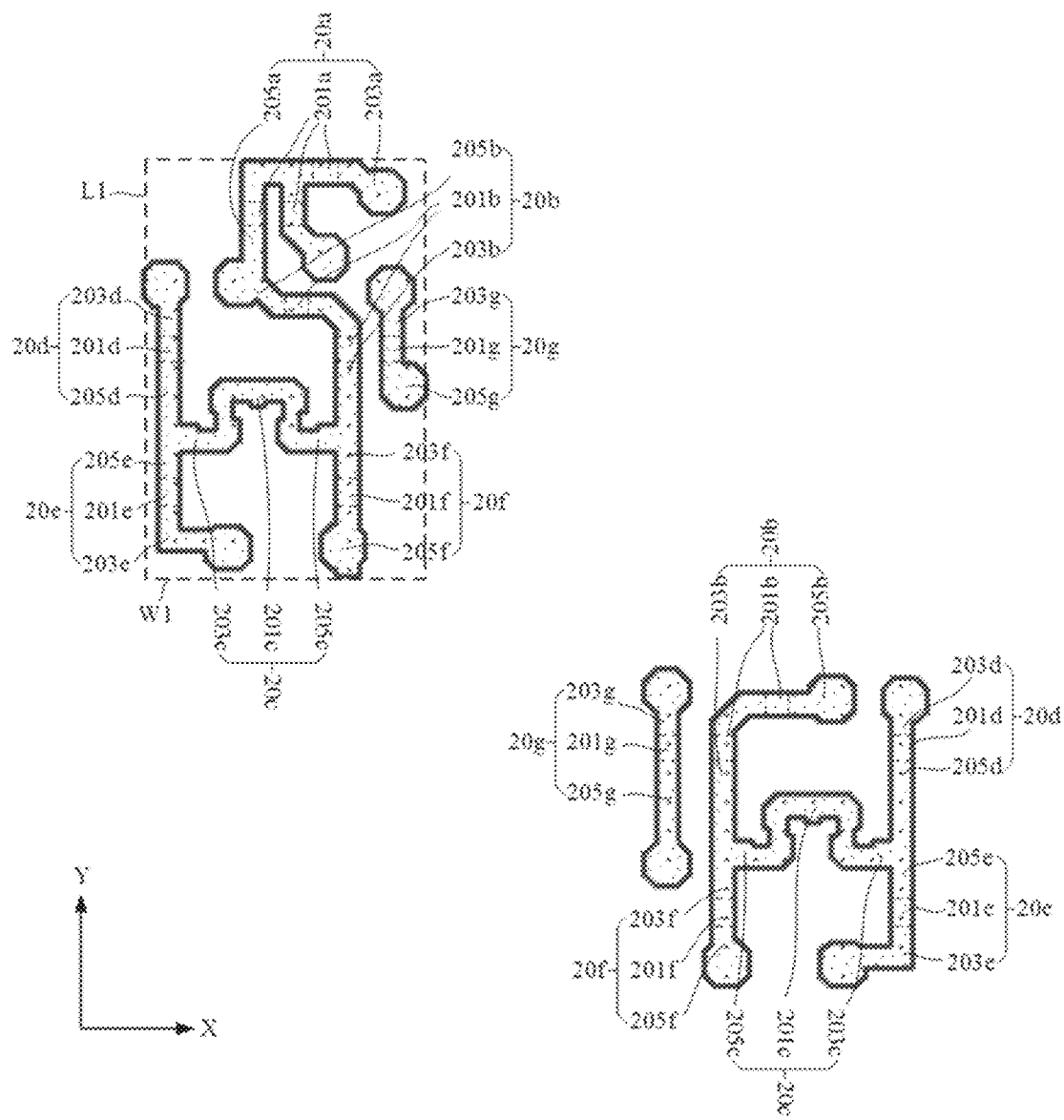
FIG. 16A shows a plan view of a semiconductor layer of an exemplary embodiment of a sub-pixel included in a repeating unit in FIG. 15.
Figure 16B:
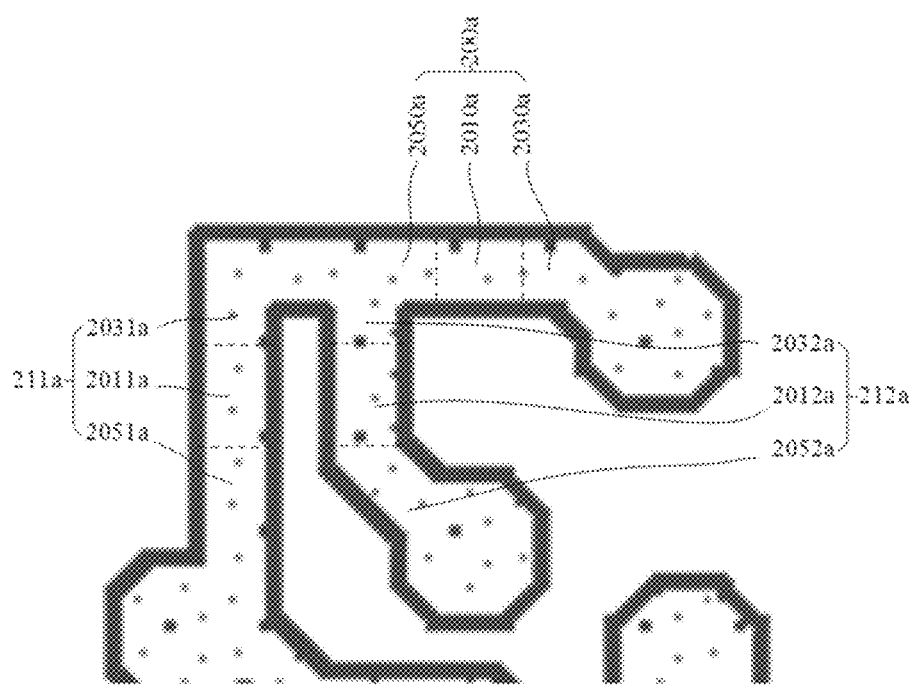
FIG. 16B shows a partial enlarged view of a semiconductor layer illustrated in FIG. 16A at a reset transistor.
Figure 17A:
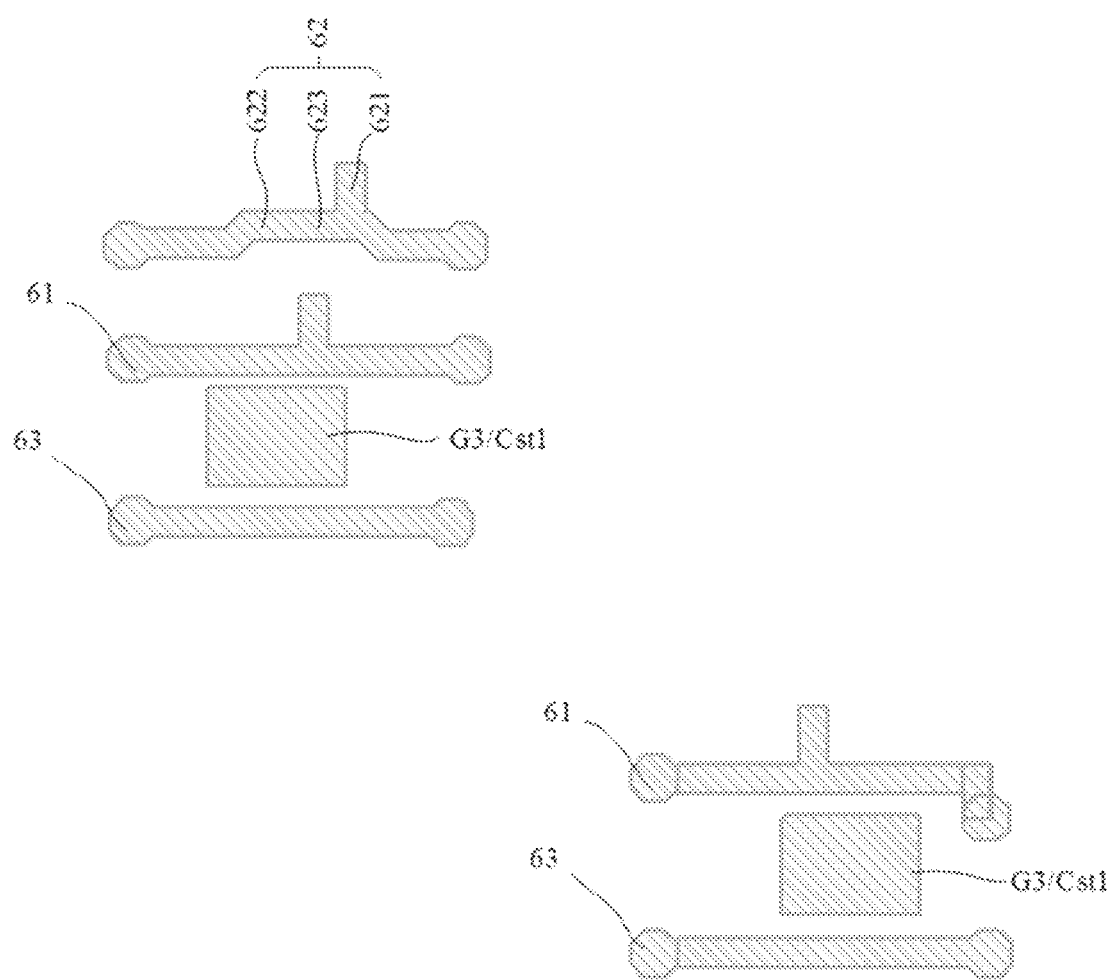
FIG. 17A shows a plan view of a first conductive layer of a sub-pixel group in a first display region of a display substrate, according to some exemplary embodiments of the present disclosure.
Figure 17B:
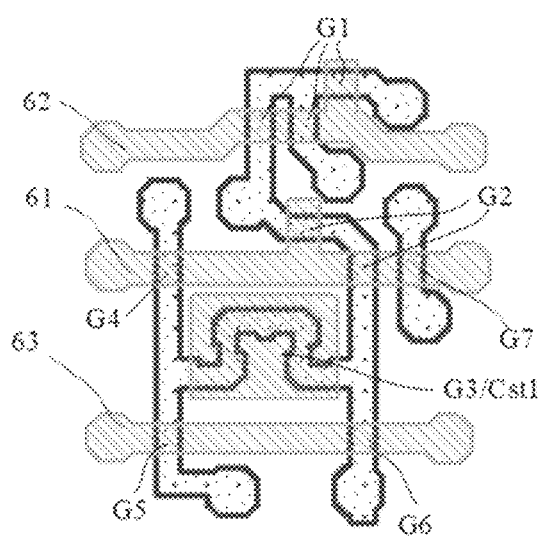
FIG. 17B show a plan view of a combination of a semiconductor layer and a first conductive layer of a sub-pixel group in a first display region of a display substrate, according to some exemplary embodiments of the present disclosure.
Figure 18A:
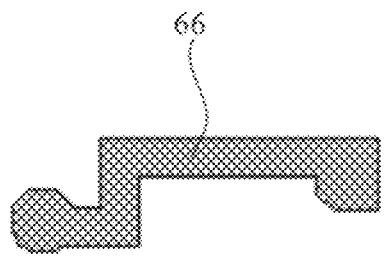
FIG. 18A shows a plan view of a second conductive layer of a sub-pixel group in a first display region of a display substrate, according to some exemplary embodiments of the present disclosure.
Figure 18A:
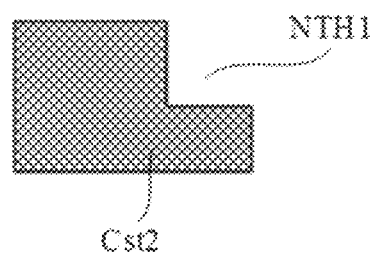
Figure 18A:
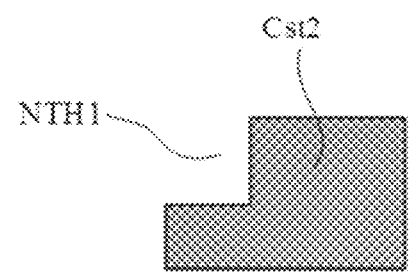
Figure 18B:
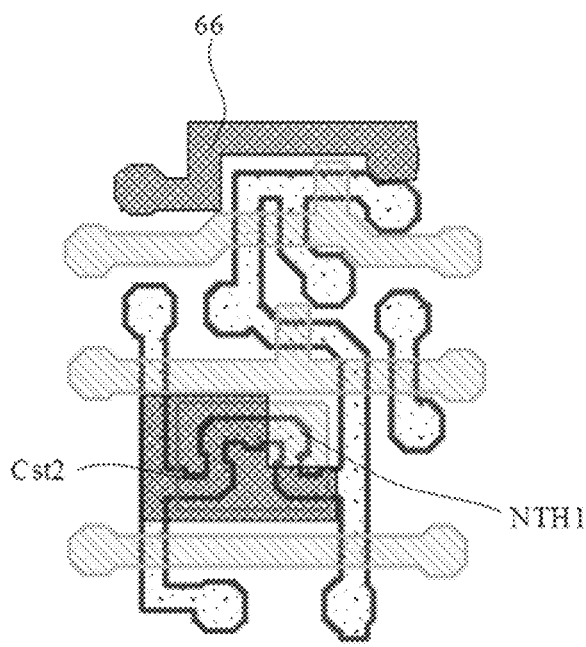
FIG. 18B shows a plan view of a combination of a semiconductor layer, a first conductive layer, and a second conductive layer of a sub-pixel group in a first display region of a display substrate, according to some exemplary embodiments of the present disclosure.
Figure 18B:
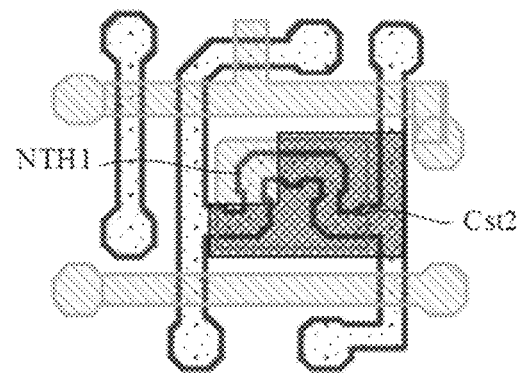
Figure 19A:
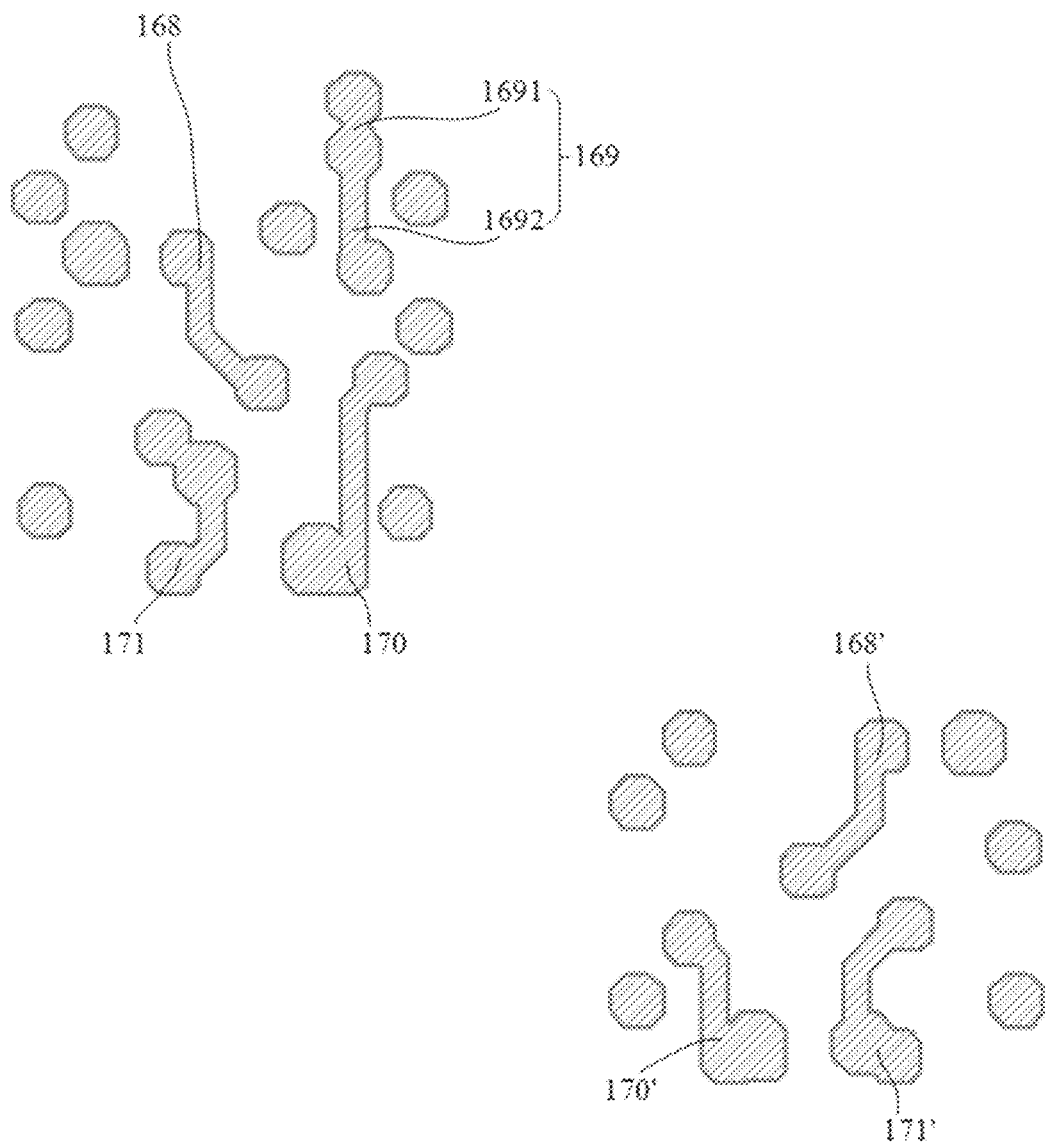
FIG. 19A shows a plan view of a third conductive layer of a sub-pixel group in a first display region of a display substrate, according to some exemplary embodiments of the present disclosure
Figure 19B:
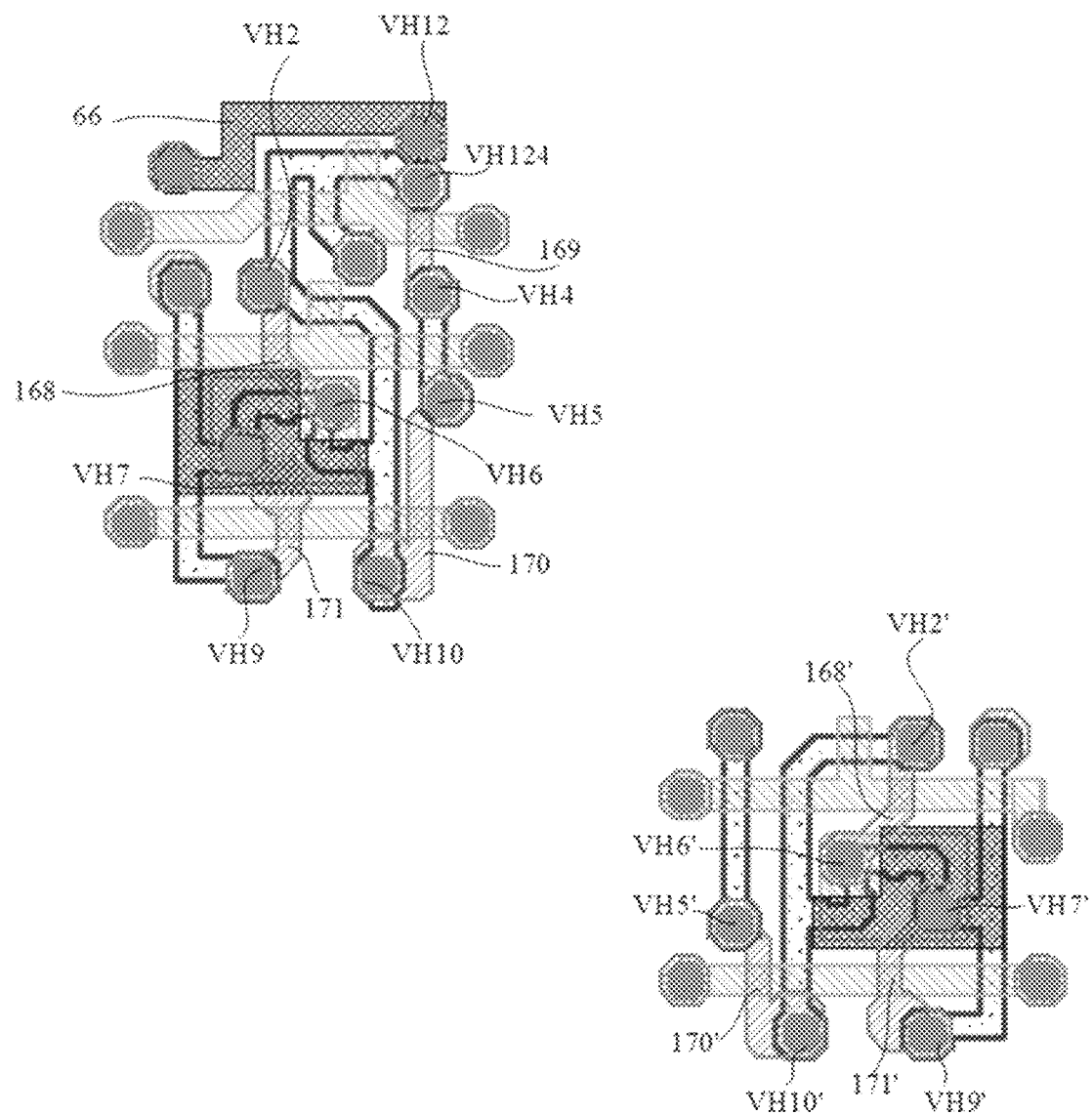
FIG. 19B shows a plan view of a combination of a semiconductor layer, a first conductive layer, a second conductive layer, and a third conductive layer of a sub-pixel group in a first display region of a display substrate, according to some exemplary embodiments of the present disclosure.
Figure 20A:
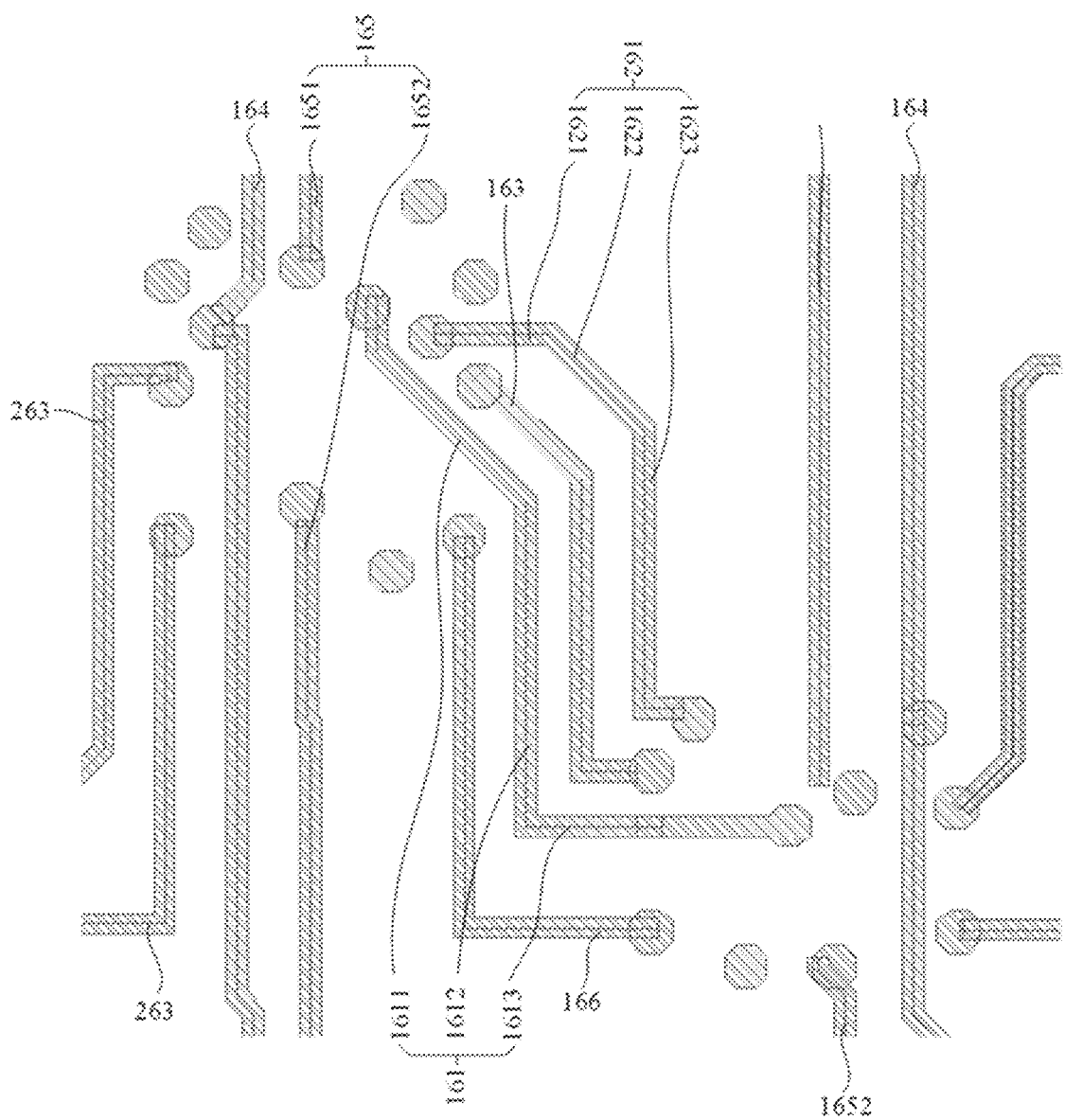
FIG. 20A shows a plan view of a first transparent conductive layer of a sub-pixel group in a first display region of a display substrate, according to some exemplary embodiments of the present disclosure
Figure 20B:
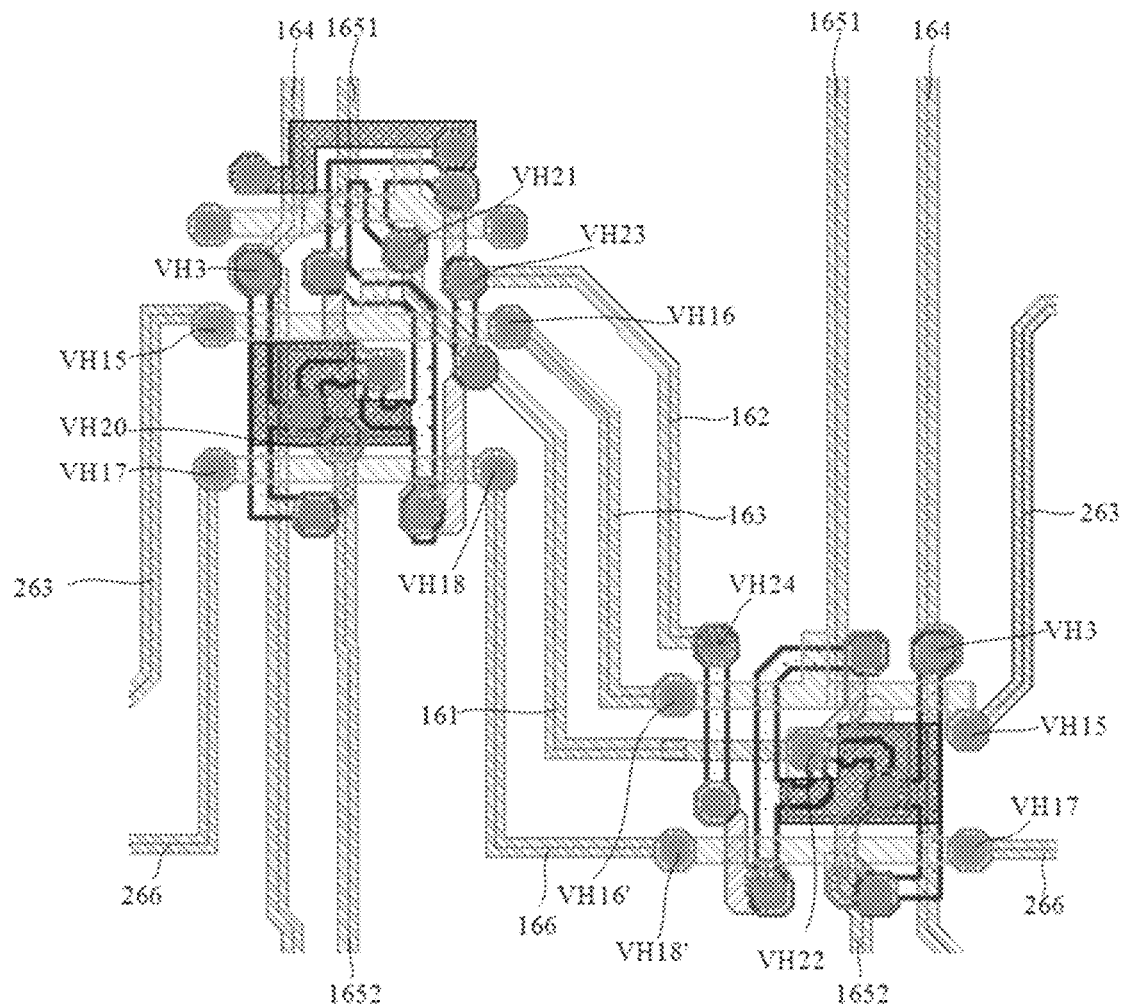
FIG. 20B shows a plan view of a combination of a semiconductor layer, a first conductive layer, a second conductive layer, and a first transparent conductive layer of a sub-pixel group in a first display region of a display substrate, according to some exemplary embodiments of the present disclosure.
Figure 21A:
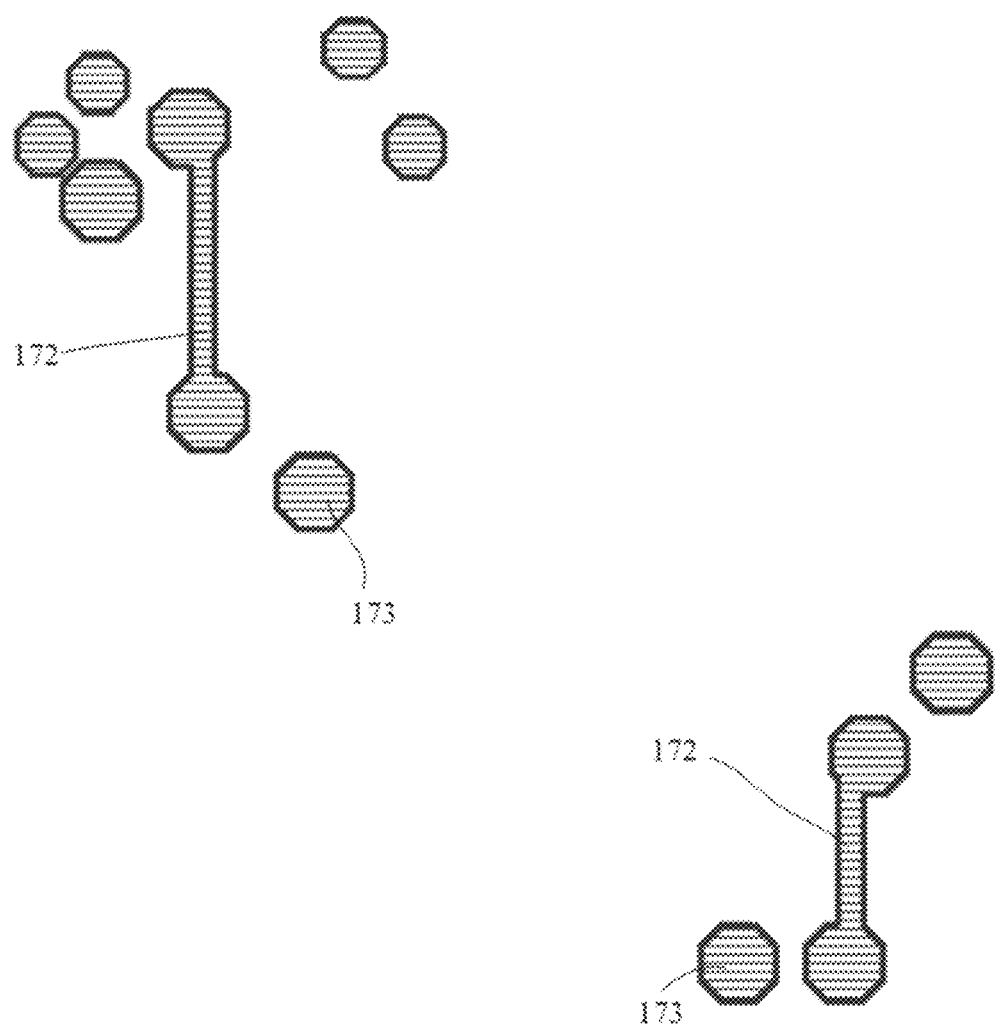
FIG. 21A shows a plan view of a fourth conductive layer of a sub-pixel group in a first display region of a display substrate, according to some exemplary embodiments of the present disclosure.
Figure 21B:
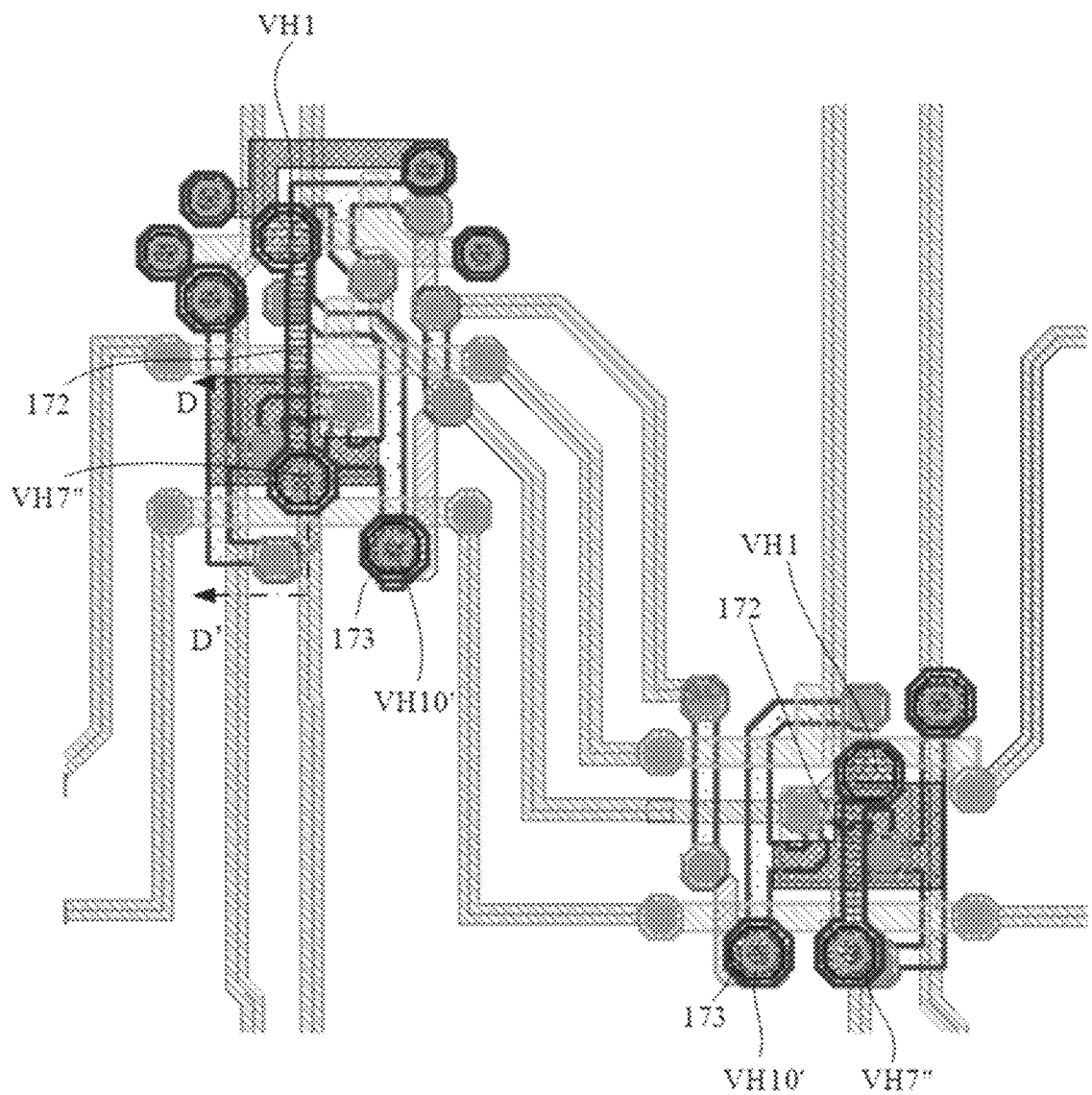
FIG. 21B shows a plan view of a combination of a semiconductor layer, a first conductive layer, a second conductive layer, a first transparent conductive layer, and a fourth conductive layer of a sub-pixel group in a first display region of a display substrate, according to some exemplary embodiments of the present disclosure.
Figure 22A:
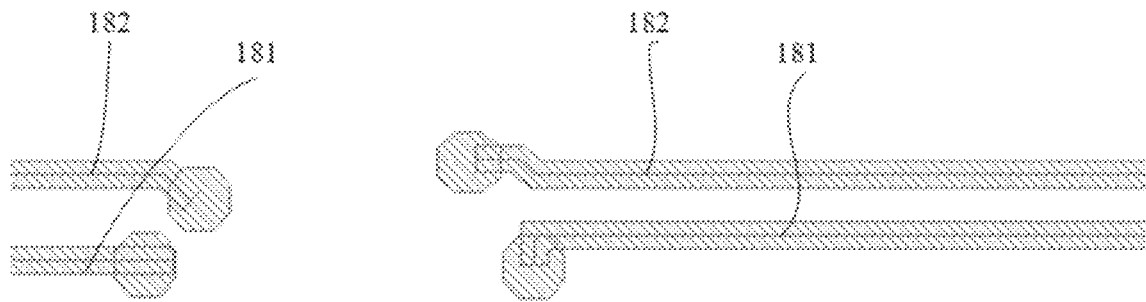
FIG. 22A shows a plan view of a second transparent conductive layer of a sub-pixel group in a first display region of a display substrate, according to some exemplary embodiments of the present disclosure
Figure 22B:
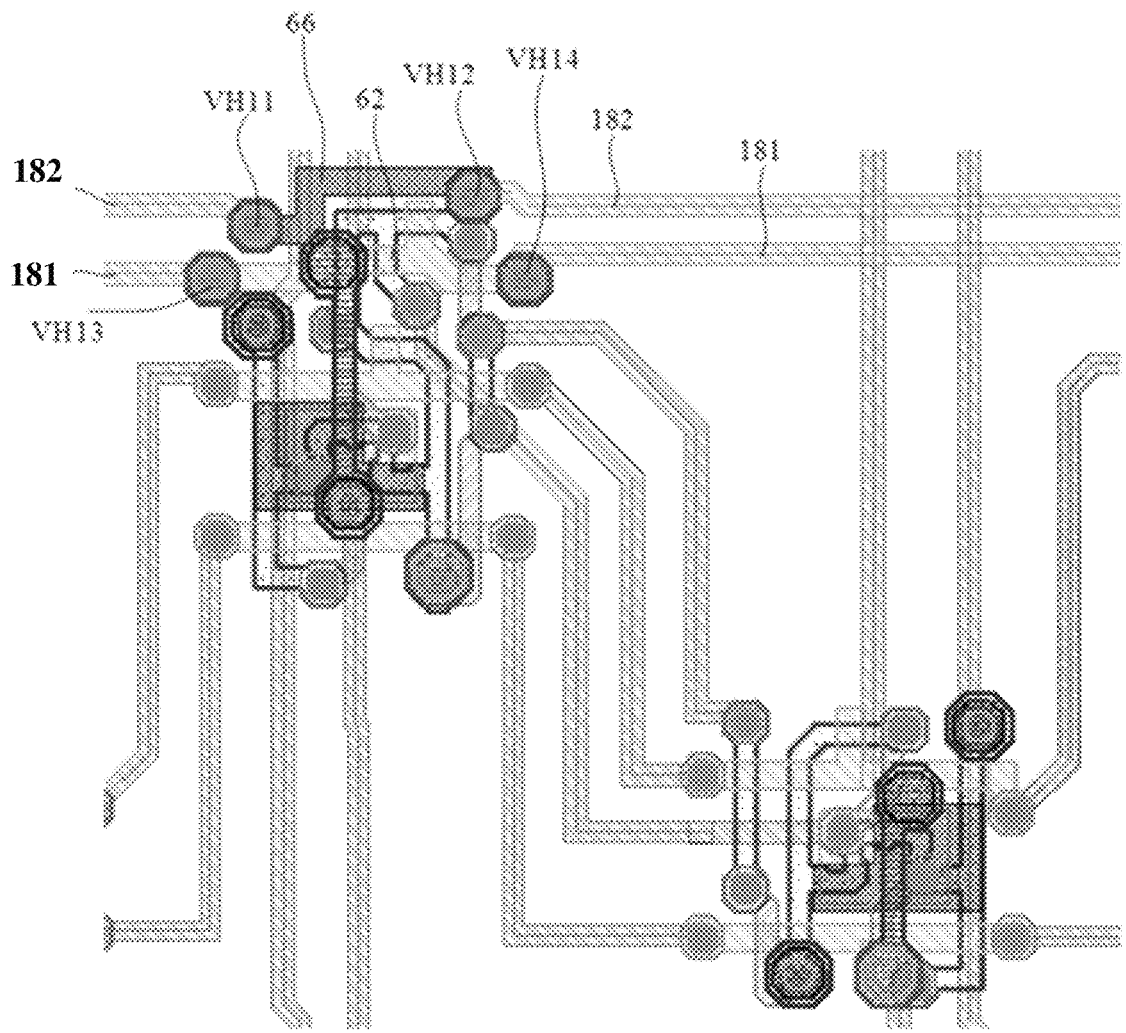
FIG. 22B shows a plan view of a combination of a semiconductor layer, a first conductive layer, a second conductive layer, a first transparent conductive layer, a fourth conductive layer and a second transparent conductive layer of a sub-pixel group in a first display region of a display substrate, according to some exemplary embodiments of the present disclosure.
Figure 23A:
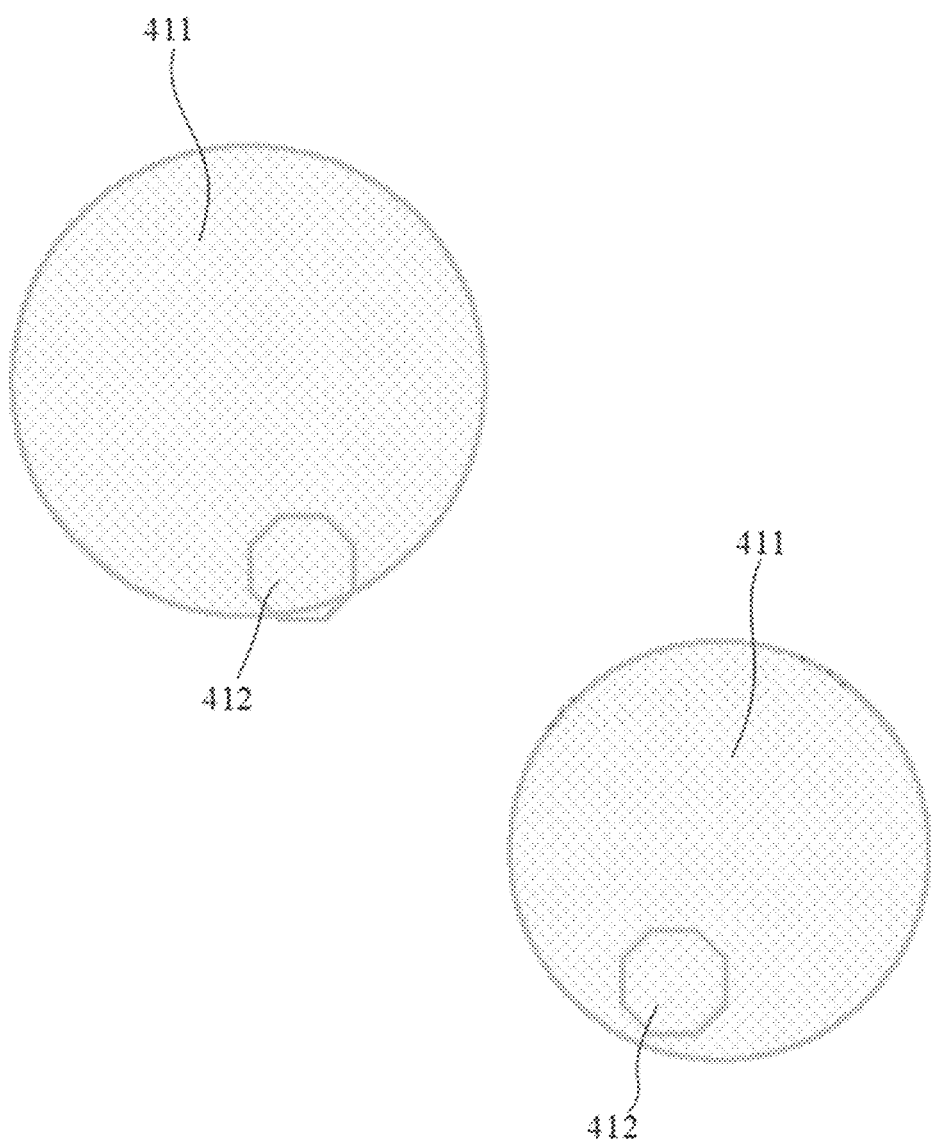
FIG. 23A shows a plan view of a fifth conductive layer of a sub-pixel group in a first display region of a display substrate, according to some exemplary embodiments of the present disclosure.
Figure 23B:
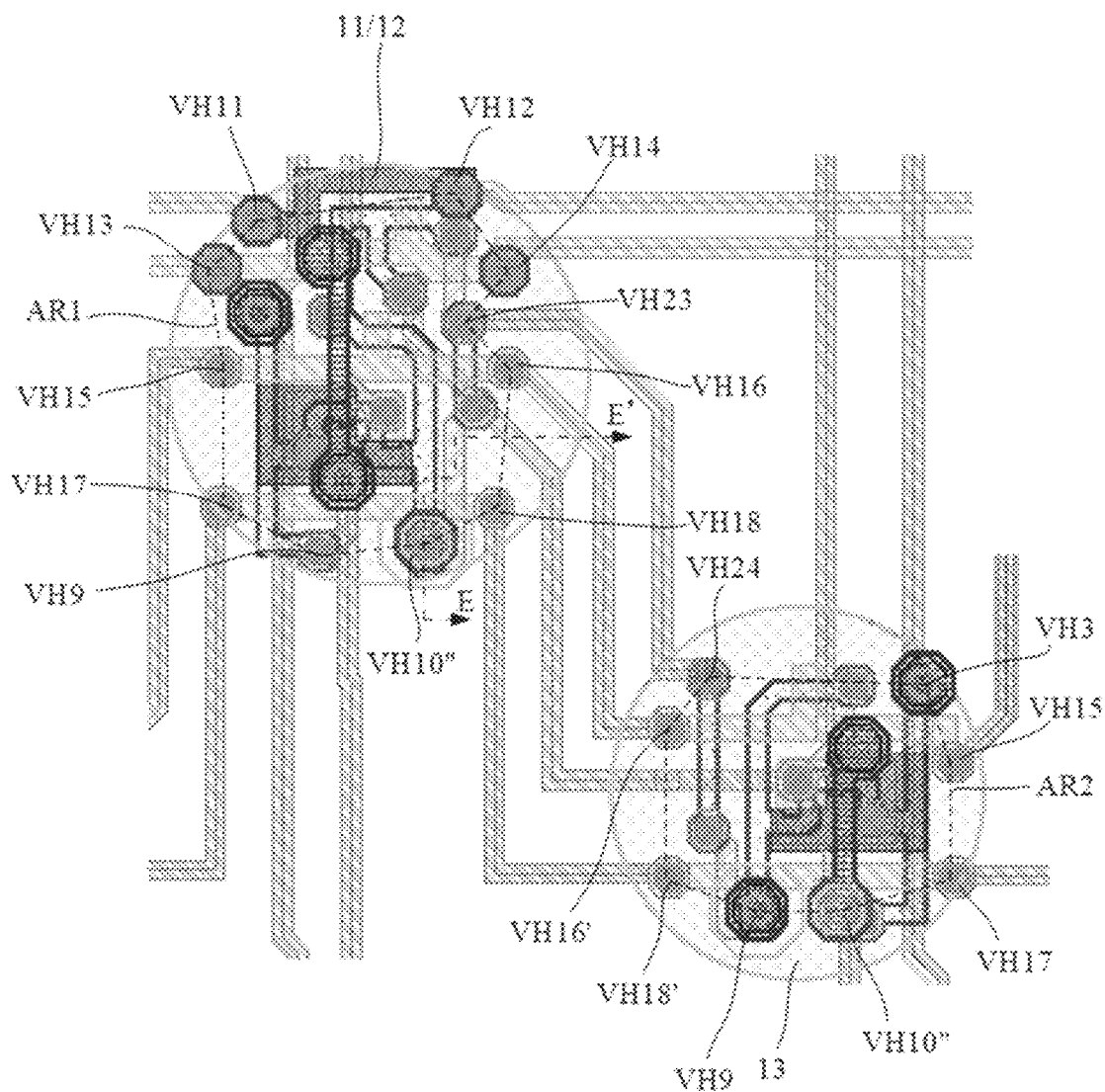
FIG. 23B shows a plan view of a combination of a semiconductor layer, a first conductive layer, a second conductive layer, a first transparent conductive layer, a fourth conductive layer, a second transparent conductive layer and a fifth conductive layer of a sub-pixel group in a first display region of the display substrate, according to some exemplary embodiments of the present disclosure.
Figure 24A:
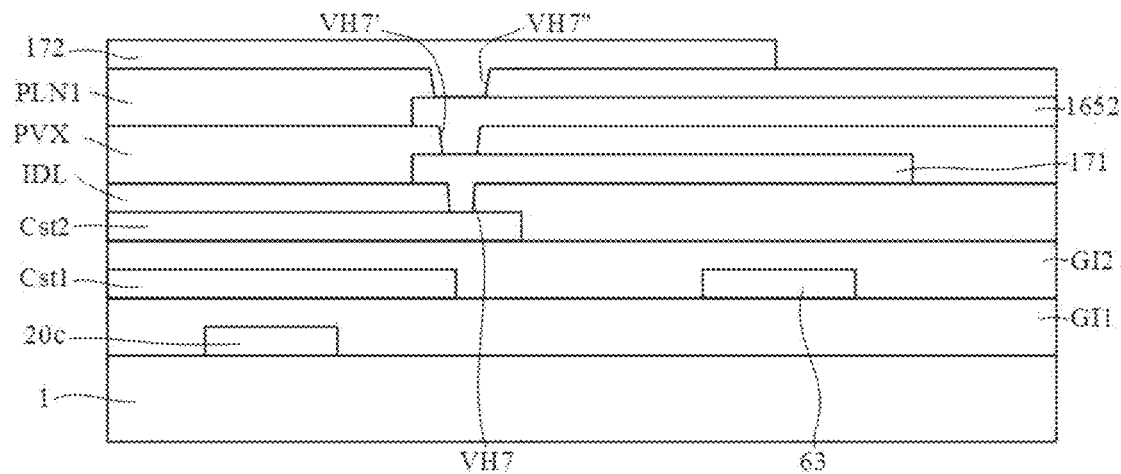
FIG. 24A shows a schematic cross-sectional view of a display substrate taken along a line DD' in FIG. 21B, according to some exemplary embodiments of the present disclosure.
Figure 24B:
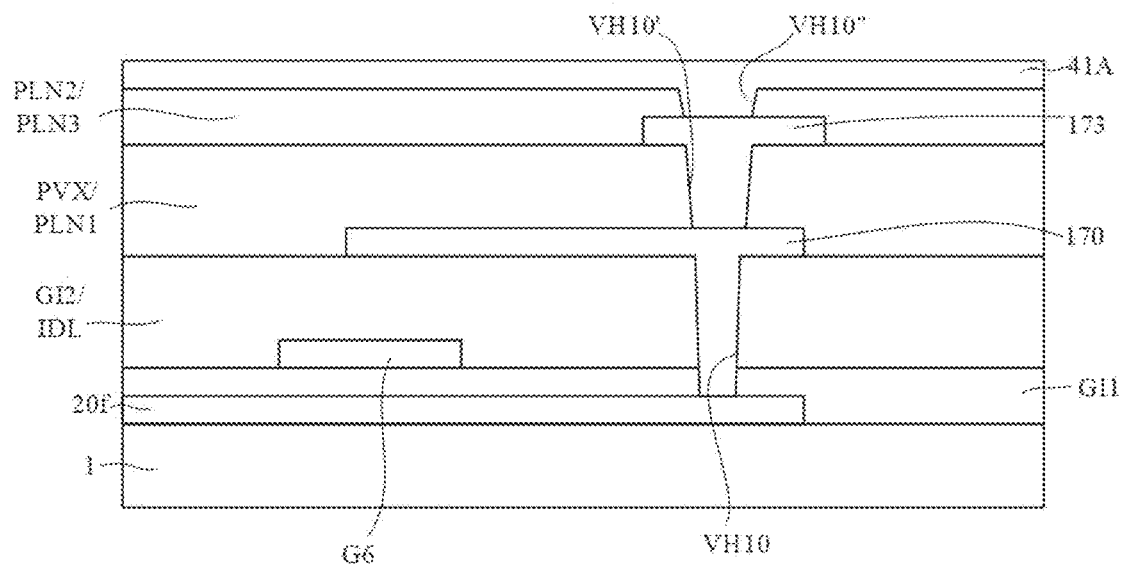
FIG. 24B shows a schematic cross-sectional view of a display substrate taken along a line EE' in FIG. 23A, according to some exemplary embodiments of the present disclosure.

FIG. 6B shows an equivalent circuit diagram of a pixel driving circuit of a sub-pixel group in a first display region of a display substrate according to some exemplary embodiments of the present disclosure. FIG. 15 shows a plan view of an exemplary embodiment of sub-pixels in a first display region AA1 of a display substrate according to some exemplary embodiments of the present disclosure, in which a plan view of a repeating unit in the first display region AA1 is schematically shown. FIG. 16A shows a plan view of a semiconductor layer of a sub-pixel group in a first display region AA1 of a display substrate according to some exemplary embodiments of the present disclosure. FIG. 16B shows a partial enlarged view of a semiconductor layer shown in FIG. 16A at a reset transistor. FIG. 17A shows a plan view of a first conductive layer of a sub-pixel group in a first display region AA1 of a display substrate according to some exemplary embodiments of the present disclosure. FIG. 17B shows a plan view of a combination of a semiconductor layer and a first conductive layer of a sub-pixel group in a first display region AA1 of a display substrate according to some exemplary embodiments of the present disclosure. FIG. 18A shows a plan view of a second conductive layer of a sub-pixel group in a first display region AA1 of a display substrate according to some exemplary embodiments of the present disclosure. FIG. 18B shows a plan view of a combination of a semiconductor layer, a first conductive layer and a second conductive layer of a sub-pixel group in a first display region AA1 of a display substrate according to some exemplary embodiments of the present disclosure. FIG. 19A shows a plan view of a third conductive layer of a sub-pixel group in a first display region AA1 of a display substrate according to some exemplary embodiments of the present disclosure. FIG. 19B shows a plan view of a combination of a semiconductor layer, a first conductive layer, a second conductive layer and a third conductive layer of a sub-pixel group in a first display region AA1 of a display substrate according to some exemplary embodiments of the present disclosure. FIG. 20A shows a plan view of a first transparent conductive layer of a sub-pixel group in a first display region AA1 of a display substrate according to some exemplary embodiments of the present disclosure. FIG. 20B shows a plan view of a combination of a semiconductor layer, a first conductive layer, a second conductive layer and a first transparent conductive layer of a sub-pixel group in a first display region AA1 of a display substrate according to some exemplary embodiments of the present disclosure. FIG. 21A shows a plan view of a fourth conductive layer of a sub-pixel group in a first display region AA1 of a display substrate according to some exemplary embodiments of the present disclosure. FIG. 21B shows a plan view of a combination of a semiconductor layer, a first conductive layer, a second conductive layer, a first transparent conductive layer and a fourth conductive layer of a sub-pixel group in a first display region AA1 of a display substrate according to some exemplary embodiments of the present disclosure. FIG. 22A shows a plan view of a second transparent conductive layer of a sub-pixel group in a first display region AA1 of a display substrate according to some exemplary embodiments of the present disclosure. FIG. 22B shows a plan view of a combination of a semiconductor layer, a first conductive layer, a second conductive layer, a first transparent conductive layer, a fourth conductive layer and a second transparent conductive layer of a sub-pixel group in a first display region AA1 of a display substrate according to some exemplary embodiments of the present disclosure. FIG. 23A shows a plan view of a fifth conductive layer of a sub-pixel group in a first display region AA1 of a display substrate according to some exemplary embodiments of the present disclosure. FIG. 23B shows a plan view of a combination of a semiconductor layer, a first conductive layer, a second conductive layer, a first transparent conductive layer, a fourth conductive layer, a second transparent conductive layer and a fifth conductive layer of a sub-pixel group in a first display region AA1 of a display substrate according to some exemplary embodiments of the present disclosure. FIG. 24A shows a schematic cross-sectional view of a display substrate taken along a line DD' in FIG. 21B, according to some exemplary embodiments of the present disclosure. FIG. 24B shows a schematic cross-sectional view of a display substrate taken along a line EE' in FIG. 23A, according to some exemplary embodiments of the present disclosure.

It should be noted that, in the following description, a difference between a structure of a sub-pixel located in the first display region AA1 and a structure of a sub-pixel located in the second display region AA2 are primarily described, and for their similarities, the above description may be referred to.

It should also be noted that, in order to make the description of the present disclosure more concise, in the following, elements having the same or similar functions and/or structures in the first display region and the second display region may be indicated by the same reference signs. For example, a transistor, storage capacitor and signal line located in the first display region may be respectively indicated by reference signs indicating a transistor, a storage capacitor and signal line located in the second display region. It should be understood that, in the following description, these elements and structures are located in the first display region AA1.

With reference to FIGS. 6B and 15 to 24B, in the first display region AA1, a pixel driving circuit in the sub-pixels 11, 12, and 13 may include: a plurality of thin film transistors and a storage capacitor Cst. The pixel driving circuit is used to drive an organic light-emitting diode (i.e., OLED). The plurality of thin film transistors include a first transistor T1, a second transistor T2, a third transistor T3, a fourth transistor T4, a fifth transistor T5, a sixth transistor T6, and a seventh transistor T7. Each transistor includes a gate, a source, and a drain.

The plurality of signal lines include: a scan signal line 61 for transmitting a scan signal Sn, and a reset signal line 62 for transmitting a reset control signal RESET (for example, the reset control signal RESET may be a scan signal of a previous row), a light-emitting control line 63 for transmitting a light-emitting control signal En, a data signal line 164 for transmitting a data signal Dm, a driving voltage line 165 for transmitting a driving voltage VDD, an initialization voltage line 66 for transmitting an initialization voltage Vint, and a power supply line 67 for transmitting a VSS voltage.

It should be understood that, similar to the above-mentioned second display region AA2, in the embodiments of the present disclosure, in the first display region AA1, the display substrate further includes a pixel defining layer on a side of the first electrode away from the pixel driving circuit. The pixel defining layer includes a plurality of openings, each sub-pixel corresponds to at least one (for example, one) opening in the pixel defining layer, and an actual light-emitting region or a display region of a sub-pixel is substantially equivalent to an opening in the pixel defining layer corresponding to the sub-pixel. In some embodiments, an area of an opening in the pixel defining layer corresponding to each sub-pixel or the actual light-emitting region of each sub-pixel is less than an area of the first electrode (such as an anode), and a projection of the opening in the pixel defining layer or the actual light-emitting region on the base substrate completely falls within a projection of the first electrode on the base substrate.

As shown in FIGS. 15A and 23A to 23B, each sub-pixel located in the first display region AA1 may include a light-emitting device (such as an OLED). For ease of description, a light-emitting device located in the first display region AA1 is referred to as a first light-emitting device 41. For example, the first light-emitting device 41 may include an anode 41A (with reference to FIG. 24B), a light-emitting material layer and a cathode that are stacked. It should be noted that, for clarity, the related drawings schematically show the first light-emitting device 41 using the anode of the first light-emitting device 41, thereby schematically illustrating the sub-pixel located in the first display region AA1. For example, in the first display region AA1, the anode of the first light-emitting device 41 includes an anode body portion 411 and an anode connection portion 412. An orthographic projection of the anode body portion 411 on the base substrate 1 may have a regular shape, such as a circle, an oval, a rectangle, a hexagon, an octagon, and a rounded rectangle. The first display region AA1 is further provided with a pixel driving circuit (to be described below) for driving the first light-emitting device 41, and the anode connection portion 412 is electrically connected to a pixel driving circuit for the first light-emitting device 41.

Referring to FIG. 15, an opening in the pixel defining layer and an anode are schematically illustrated. Similar to the anode body portion, an orthographic projection of an opening OPH on the base substrate 1 may have a regular shape, such as a circle, an oval, a rectangle, a hexagon, an octagon, and a rounded rectangle. A projection of the opening OPH on the base substrate 1 completely falls within a projection of the anode body portion 411 on the base substrate 1.

It should be noted that, for ease of illustration, in the embodiments of the present disclosure, an approximate position and an approximate shape of the first electrode (such as an anode) of the sub-pixel are primarily illustrated to represent a distribution of each sub-pixel.

For example, in some embodiments of the present disclosure, an arrangement of the sub-pixels in each repeating unit may refer to an existing pixel arrangement, such as GGRB, RGBG, RGB, etc., which is not limited in the embodiments of the present disclosure.

Similar to the second repeating unit P2, referring to FIG. 15, the first repeating unit P1 may include a plurality of sub-pixels arranged in 4 rows and 4 columns. In a first row, a sub-pixel 11 and a sub-pixel 12 are arranged in a first column and a third column, respectively. In a second row, two sub-pixels 13 are arranged in a second column and a fourth column, respectively. In a third row, a sub-pixel 12 and a sub-pixel 11 are arranged in the first column and the third column, respectively. In a fourth row, two sub-pixels 13 are arranged in the second column and the fourth column, respectively.

It should be noted that, the arrangement of sub-pixels shown in FIG. 15 is only an exemplary arrangement of some embodiments of the present disclosure, rather than a limitation on the embodiments of the present disclosure. In other embodiments, the sub-pixels may be arranged in other ways.

Referring to FIGS. 6B and 15 to 23B, in the embodiments of the present disclosure, the display substrate may include a plurality of sub-pixel groups located in the first display region AA1. For example, a sub-pixel group may include at least two sub-pixels. For ease of description, two of the at least two sub-pixels are referred to as a first sub-pixel and a second sub-pixel, respectively. For example, the first sub-pixel may be one of the above-mentioned sub-pixels 11, 12 or 13, and the second sub-pixel may be another one of the above-mentioned sub-pixels 11, 12 or 13 different from the first sub-pixel. For example, the first sub-pixel and the second sub-pixel may be sub-pixels of different colors.

For example, in some embodiments of the present disclosure, referring to FIG. 15, an area of an orthographic projection of an anode main body portion 421 of a sub-pixel 11 on the base substrate 1 is less than an area of an orthographic projection of an anode main body portion 421 of a sub-pixel 12 on the base substrate 1, and an area of an orthographic projection of an anode body portion 42 of a sub-pixel 13 on the base substrate 1 is less than an area of an orthographic projection of an anode body portion 421 of a sub-pixel 11 on the base substrate 1. That is, an actual light-emitting area of a green sub-pixel is the smallest, an actual light-emitting area of a blue sub-pixel is the largest, and an actual light-emitting area of a red sub-pixel is between the actual light-emitting areas of the green sub-pixel and the blue sub-pixel.

In the embodiments of the present disclosure, in a sub-pixel group, the first sub-pixel may be one of a red sub-pixel or a blue sub-pixel, and the second sub-pixel may be a green sub-pixel. In this way, in the following, it is taken as an example that the first sub-pixel is the sub-pixel 11 or the sub-pixel 12, and the second sub-pixel is the sub-pixel 13, to describe some exemplary embodiments of the present disclosure.

It should be noted that, FIGS. 15 to 23B show plan views of a sub-pixel group located in the first display region AA1, in which in each plan view, the upper left figure is a plan view of the first sub-pixel 11(12), and the lower right figure is a plan view of the second sub-pixel 13.

Referring to FIG. 6B, in the equivalent circuit diagram of a sub-pixel group, a first sub-pixel driving circuit and a second sub-pixel driving circuit are provided. Schematically, a dashed box on the left in FIG. 6B shows a first sub-pixel driving circuit DR1, and a dashed box on the right in FIG. 6B shows a second sub-pixel driving circuit DR2. The first sub-pixel driving circuit DR1 is used to drive the first light-emitting device 41 of the first sub-pixel 11(12) to emit light. The second sub-pixel driving circuit DR2 is used to drive the first light-emitting device 41 of the second sub-pixel 13 to emit light.

Similar to the pixel driving circuit of the sub-pixel shown in FIG. 6A, each of the first sub-pixel driving circuit DR1 and the second sub-pixel driving circuit DR2 may include: a plurality of thin film transistors and a storage capacitor Cst. For example, the plurality of thin film transistors may include a first transistor (also referred to as a reset transistor) T1, a second transistor (also referred to as a compensation transistor) T2, a third transistor (also referred to as a driving transistor) T3, a fourth transistor (also referred to as a switching transistor) T4, a fifth transistor (also referred to as an operation control transistor) T5, a sixth transistor (also referred to as a light-emitting control transistor) T6, and a seventh transistor (also referred to as an initialization transistor) T7. Each transistor includes a gate, a source, and a drain.

In the embodiments of the present disclosure, for ease of description, the plurality of thin film transistors T1 to T7 included in the first sub-pixel driving circuit DR1 are respectively referred to as a first reset transistor T1, a first compensation transistor T2, and a first driving transistor T3, a first switching transistor T4, a first operation control transistor T5, a first light-emitting control transistor T6, and a first initialization transistor T7; the plurality of thin film transistors T1 to T7 included in the second sub-pixel driving circuit DR2 are respectively referred to as a second reset transistor T1', a second compensation transistor T2, a second driving transistor T3, a second switching transistor T4, a second operation control transistor T5, a second light-emitting control transistor T6, and a second initialization transistor T7.

In the embodiments of the present disclosure, the first reset transistor T1 of the first sub-pixel driving circuit DR1 and the second reset transistor T1' of the second sub-pixel driving circuit DR2 are at least partially shared with each other.

It should be noted that, in the present disclosure, "the first reset transistor and the second reset transistor are at least partially shared with each other" means that the first reset transistor and the second reset transistor have a common portion, that is, this portion not only serves as a part of the first reset transistor and functions in the first sub-pixel driving circuit, but also serves as a part of the second reset transistor and functions in the second sub-pixel driving circuit.

For example, referring to FIG. 6B, the first reset transistor may include a common transistor T10 and a first sub-transistor T11, and the second reset transistor includes the common transistor T10 and a second sub-transistor T12. Thus, in the exemplary embodiments, the common transistor T10 is not only used as a part of the first reset transistor, but also used as a part of the second reset transistor, and functions in the first sub-pixel driving circuit DR1 and the second sub-pixel driving circuit DR2, respectively.

For example, with reference to FIG. 6B, each of the common transistor T10, the first sub-transistor T11 and the second sub-transistor T12 includes a gate G1, a source S1 and a drain D1. The gate of each of the common transistor T10, the first sub-transistor T11 and the second sub-transistor T12 is connected to the reset control signal RESET. One of the source or the drain of the common transistor T10 is connected to the initialization voltage signal Vint, and the other of the source or the drain of the common transistor T10 is electrically connected to the first sub-transistor T11 and the second sub-transistor T12, respectively.

In the embodiments of the present disclosure, in the under-screen imaging region, the pixel driving circuits of the plurality of sub-pixels may share at least part of the reset transistors, which is conducive to a reduction of an area of a region occupied by pixel driving circuits corresponding to some sub-pixels, thereby achieving a relatively high PPI of the under-screen imaging region, while ensuring that a light transmittance of the under-screen imaging region meets the requirements.

Referring to FIGS. 15 to 24B, the display substrate includes a base substrate 1 and a plurality of film layers arranged on the base substrate 1. In some embodiments, the plurality of film layers include at least a semiconductor layer 20, a first conductive layer 21, a second conductive layer 22, a third conductive layer 23, a first transparent conductive layer 26, a fourth conductive layer 24, a second transparent conductive layer 28 and a fifth conductive layer 25. The semiconductor layer 20, the first conductive layer 21, the second conductive layer 22, the third conductive layer 23, the first transparent conductive layer 26, the fourth conductive layer 24, the second transparent conductive layer 28 and the fifth conductive layer 25 are arranged away from the base substrate 1, sequentially. The plurality of film layers further include at least a plurality of insulating layers. For example, the plurality of insulating layers may include a first gate insulating layer GI1, a second gate insulating layer GI2, an interlayer insulating layer IDL, a passivation layer PVX and a planarization layer PLN. The first gate insulating layer GI1 may be arranged between the semiconductor layer 20 and the first conductive layer 21, the second gate insulating layer GI2 may be arranged between the first conductive layer 21 and the second conductive layer 22, and the interlayer insulating layer IDL may be arranged between the second conductive layer 22 and the third conductive layer 23, and the passivation layer PVX may be arranged between the third conductive layer 23 and the first transparent conductive layer 26. For example, the planarization layer PLN may include a plurality of film layers, which are respectively referred to as a first planarization layer PLN1, a second planarization layer PLN2 and a third planarization layer PLN3 for ease of description. In some embodiments, the first planarization layer PLN1 may be arranged between the first transparent conductive layer 26 and the fourth conductive layer 24, the second planarization layer PLN2 may be arranged between the fourth conductive layer 24 and the second transparent conductive layer 28, and the third planarization layer PLN3 may be arranged between the second transparent conductive layer 28 and the fifth conductive layer 25.

In the first display region AA1, a pixel driving circuit of each sub-pixel includes a reset transistor T1, a compensation transistor T2, a driving transistor T3, a switching transistor T4, an operation control transistor T5, a light-emitting control transistor T6, and an initialization transistor T7, which are formed along an active layer shown in FIG. 16A. The active layer may have a curved or bent shape, and may include a first active layer 20a corresponding to the reset transistor T1, a second active layer 20b corresponding to the transistor T2, a third active layer 20c corresponding to the driving transistor T3, a fourth active layer 20d corresponding to the switching transistor T4, a fifth active layer 20e corresponding to the operation control transistor T5, a sixth active layer 20f corresponding to the light-emitting control transistor T6, and a seventh active layer 20g corresponding to the initialization transistor T7.

Referring to FIG. 16A, in a sub-pixel group, the active layers 20a to 20f of the first reset transistor T1, the first compensation transistor T2, the first driving transistor T3, the first switching transistor T4, the first operation control transistor T5, and the first light-emitting control transistor T6 in the first sub-pixel driving circuit DR1 of the first sub-pixel 11(12), are formed as a continuously extending part of the semiconductor layer 20; the active layers 20b to 20f of the second compensation transistor T2, the second driving transistor T3, the second switching transistor T4, the second operation control transistor T5, and the second light-emitting control transistor T6 in the second sub-pixel driving circuit DR2 of the second sub-pixel 13, are formed as a continuously extending part of the semiconductor layer 20.

It should be noted that, "continuously extending" herein means that there is no disconnection between components.

In a sub-pixel group, the seventh active layer 20g of the first initialization transistor T7 in the first sub-pixel driving circuit DR1 of the first sub-pixel 11(12) is spaced apart from other parts of the first sub-pixel driving circuit DR1 located in the semiconductor layer 20 (i.e., the active layers 20a to 20f of the first reset transistor T1, the first compensation transistor T2, the first driving transistor T3, the first switching transistor T4, the first operation control transistor T5 and the first light-emitting control transistor T6 in the first sub-pixel driving circuit DR1); the seventh active layer 20g of the second initialization transistor T7 in the second sub-pixel driving circuit DR2 of the second sub-pixel 13 is spaced apart from other parts of the second sub-pixel driving circuit DR2 located in the semiconductor layer 20 (i.e., the active layers 20a to 20f of the second reset transistor T1', the second compensation transistor T2, the second driving transistor T3, the second switching transistor T4, the second operation control transistor T5 and the second light-emitting control transistor T6 in the second sub-pixel driving circuit DR2).

In a sub-pixel group, the active layer 20a of the first reset transistor T1 in the first sub-pixel driving circuit DR1 of the first sub-pixel 11(12) and the active layer 20a of the second reset transistor T1' in the second sub-pixel driving circuit DR2 of the second sub-pixel 13 are at least partially shared with each other. For example, referring to FIG. 16B, the common transistor T10 includes a common active layer 200a, and the common active layer 200a includes a common channel portion 2010a, a common source portion 2030a, and a common drain portion 2050a. The first sub-transistor T11 includes a first sub-active layer 211a, and the first sub-active layer 211a includes a first channel portion 2011a, a first sub-source portion 2031a, and a first sub-drain portion 2051a. The second sub-transistor T12 includes a second sub-active layer 212a, and the second sub-active layer 212a includes a second channel portion 2012a, a second sub-source portion 2032a, and a second sub-drain portion 2052a. The common source portion 2030a and the common drain portion 2050a are respectively located on both sides of the common channel portion 2010a, and the first sub-source portion 2031a and the first sub-drain portion 2051a are respectively located on both sides of the first channel portion 2011a, the second sub-source portion 2032a and the second sub-drain portion 2052a are respectively located on both sides of the second channel portion 2012a. The common active layer 200a, the first sub-active layer 211a, and the second sub-active layer 212a extend continuously. For example, an end of the common active layer 200a is connected to both the first sub-active layer 211a and the second sub-active layer 212a.

In the embodiments of the present disclosure, the common active layer 200a and the first sub-active layer 211a constitute the active layer 20a of the first reset transistor T1 in the first sub-pixel driving circuit DR1 of the first sub-pixel 11(12). The common active layer 200a and the second sub-active layer 212a constitute the active layer 20a of the second reset transistor T1' in the second sub-pixel driving circuit DR2 of the second sub-pixel 13. That is, the active layer 20a of the first reset transistor T1 and the active layer 20a of the second reset transistor T1' have at least a common portion—the common active layer 200a.

In the embodiments of the present disclosure, the active layer 20a of the second reset transistor T1' in the second sub-pixel driving circuit DR2 is formed in an occupied region of the first sub-pixel driving circuit DR1, which is conducive to the reduction of an area of an occupied region of the second sub-pixel driving circuit DR2.

With reference to FIG. 16A, in the first sub-pixel driving circuit DR1, the active layer 20g of the first initialization transistor T7 is spaced apart from the active layer 20a of the first reset transistor T1. The active layer 20a of the first reset transistor T1 is connected to the active layer 20b of the first compensation transistor T2, and the active layer 20b of the first compensation transistor T2 is connected to the active layer 20c of the first driving transistor T3 and the active layer 20f of the first light-emitting control transistor T6, the active layer 20c of the first driving transistor T3 is connected to the active layer 20d of the first switching transistor T4 and the active layer 20e of the first operation control transistor T5. That is, the common active layer 200a, the first sub-active layer 211a and the second sub-active layer 212a, the active layer 20b of the first compensation transistor T2, the active layer 20c of the first driving transistor T3, the active layer 20f of the first light-emitting control transistor T6, the active layer 20d of the first switching transistor T4, and the active layer 20e of the first operation control transistor T5 extend continuously. The active layer 20g of the first initialization transistor T7 is spaced apart from these active layers.

In the second sub-pixel driving circuit DR2, the active layer 20b of the second compensation transistor T2 is connected to the active layer 20c of the second driving transistor T3 and the active layer 20f of the second light-emitting control transistor T6, and the active layer 20c of the second driving transistor T3 is connected to the active layer 20d of the second switching transistor T4 and the active layer 20e of the second operation control transistor T5. That is, the active layer 20b of the second compensation transistor T2, the active layer 20c of the second driving transistor T3, the active layer 20f of the second light-emitting control transistor T6, the active layer 20d of the second switching transistor T4, and the active layer 20e of the second operation control transistor T5 extend continuously. The active layer 20g of the second initialization transistor T7 is spaced apart from these active layers.

Referring to FIGS. 8 and 9, for a sub-pixel located in the second display region AA2, the active layer 20g of the first initialization transistor T7 extends from the active layer 20a of the first reset transistor T1 in a direction away from the scan signal line 61 of the sub-pixel, that is, the active layer 20g of the first initialization transistor T7 is located at the upper right of the active layer 20a of the first reset transistor T1. Through such arrangement, the active layer 20g of the first initialization transistor T7 may extend toward an active layer of an upper adjacent sub-pixel in the same column, so that the active layers of the sub-pixels located in the same column are formed to be a continuous extending structure.

Figure 17B:
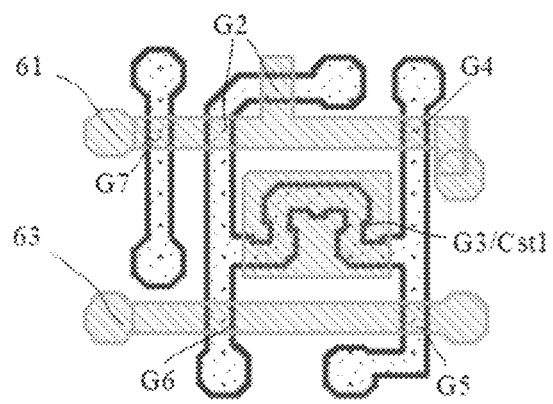

Referring to FIGS. 16A and 17, for a sub-pixel located in the first display region AA1, the active layer 20g of the first initialization transistor T7 extends in a direction close to the scan signal line 61 of the sub-pixel relative to the active layer 20a of the first reset transistor T1, that is, the active layer 20g of the first initialization transistor T7 is located at the lower right of the active layer 20a of the first reset transistor T1. Through such arrangement, an occupied region of the active layer of the sub-pixel in the first display region AA1 has an outline of a square or a substantially square.

In the present disclosure, the expression "occupied region" represents the largest region covered by an orthographic projection of a pattern, a layer structure, or the like on the base substrate. Specifically, the orthographic projection of the pattern, the layer structure, or the like on the base substrate has two sides farthest apart in the first direction X and two sides farthest apart in the second direction Y, and extension lines of these four sides will cross to form a region, which is the occupied region of the pattern, the layer structure, or the like.

Specifically, referring to FIGS. 8 and 16A, for a sub-pixel located in the second display region AA2, the occupied region of the active layer thereof has a rectangular or substantially rectangular shape. As shown in FIG. 8, the occupied region of the active layer of a sub-pixel located in the second display region AA2 is schematically illustrated using a dashed box, and the occupied region has a size in the first direction X (i.e., a width W2) and a size in the second direction Y (i.e., a length L2), and the length L2 is greater than the width W2, or in other words, the length L2 is greater than 1.2 times the width W2. That is, the occupied region has a rectangular shape.

For a sub-pixel located in the first display region AA1, the occupied region of the active layer thereof has a square or substantially square shape. As shown in FIG. 16A, the occupied region of the active layer of a sub-pixel in the first display region AA1 is schematically illustrated using a dashed box, and the occupied region has a size in the first direction X (i.e., a width W1) and a size in the second direction Y (i.e., a length L1), and the length L1 is substantially equal to the width W1.

In the embodiments of the present disclosure, an area of an occupied region of an active layer of a sub-pixel located in the first display region AA1 is less than an area of an occupied region of an active layer of a sub-pixel of the same color located in the second display region AA2. In this way, the area of the occupied region of the pixel driving circuit of the sub-pixel located in the first display region AA1 may be reduced, which will be described in further detail below.

Similarly, as shown in FIGS. 17A and 17B, the scan signal line 61, the reset signal line 62, and the light-emitting control line 63 are located in the first conductive layer 21. The gates G1 to G7 of the above-mentioned transistors are also located in the first conductive layer 21. The first storage capacitor electrode Cst1 is also located in the first conductive layer 21. The first conductive layer 21 is located on a side of the semiconductor layer 20 away from the base substrate 1.

Referring to FIGS. 17A and 17B, the first sub-pixel 11(12) and the second sub-pixel 13 share a reset signal line 62. That is, the reset signal line 62 is only provided in the occupied region of the first sub-pixel driving circuit DR1 of the first sub-pixel 11(12), and there is no reset signal line 62 provided in the occupied region of the second sub-pixel driving circuit DR2 of the second sub-pixel 13. That is, a scan signal line 61, a reset signal line 62, and a light-emitting control line 63 are provided in the occupied region of the first sub-pixel driving circuit DR1 of the first sub-pixel 11(12); a scan signal line 61 and a light-emitting control line 63 are provided in the occupied region of the second sub-pixel driving circuit DR2 of the second sub-pixel 13.

Referring to FIGS. 6B and 17B, in the first sub-pixel 11(12), parts where the scan signal line 61 overlaps the semiconductor layer 20 respectively form the gate G2 of the first compensation transistor T2 and the gate G4 of the first switching transistor T4, and another part where the scan signal line 61 overlaps the semiconductor layer 20 further forms the gate G7 of the first initialization transistor T7. That is, in the embodiments of the present disclosure, in the first display region AA1, the scan signal Sn is provided to each of the gates of the first initialization transistor T7, the first compensation transistor T2, and the first switching transistor T4.

As described above, under the control of the first initialization transistor T7, the initialization voltage Vint transmitted by the initialization voltage line 66 may be supplied to the OLED, for example, to a first electrode (such as an anode) of the OLED, so as to initialize a voltage at the first electrode of the OLED.

In the second sub-pixel 13, parts where the scan signal line 61 overlaps the semiconductor layer 20 respectively form the gate G2 of the second compensation transistor T2 and the gate G4 of the second switching transistor T4, and another part where the scan signal line 61 overlaps with the semiconductor layer 20 further forms the gate G7 of the second initialization transistor T7. That is, in the embodiments of the present disclosure, in the first display region AA1, the scan signal Sn is supplied to each of the gates of the second initialization transistor T7, the second compensation transistor T2, and the second switching transistor T4.

With reference to FIG. 17A, in a sub-pixel, a reset signal line 62 includes a first part 621, a second part 622 and a third part 623 located in the first display region AA1. Orthographic projections of the first part 621, the second part 622 and the third part 623 on the base substrate 1 respectively coincide with orthographic projections of the common channel portion 2010a, the first channel portion 2011a and the second channel portion 2012a on the base substrate 1. The gate of the common transistor T10 includes the first part 621, the gate of the first sub-transistor T11 includes the second part 622, and the gate of the second sub-transistor T12 includes the third part 623.

For example, the first part 621 of the reset signal line 62 may extend substantially in the second direction Y, and the second part 622 and the third part 623 of the reset signal line 62 may extend substantially in the first direction X, that is, the first part 621 of the reset signal line 62 is substantially perpendicular to the second part 622 and the third part 623 of the reset signal line 62.

In this way, each of the gates of the common transistor T10, the first sub-transistor T11 and the second sub-transistor T12 is connected to the reset control signal RESET.

As such, in the embodiments of the present disclosure, an orthographic projection of each of the first reset transistor T1 (including the common transistor T10 and the first sub-transistor T11) of the first sub-pixel driving circuit DR1 and the second reset transistors T1' (including the common transistor T10 and the second sub-transistor T12) of the second sub-pixel driving circuit DR2 on the base substrate 1 falls within the orthographic projection of the occupied region of the first sub-pixel driving circuit DR1 on the base substrate 1. In this way, the area of the occupied region of the second sub-pixel driving circuit DR2 of the second sub-pixel may be reduced.

It should be noted that, an orthographic projection of the first reset transistor T1 in the first sub-pixel driving circuit DR1 on the base substrate 1 may be represented by an orthographic projection of the channel region of the first reset transistor T1 in the first sub-pixel driving circuit DR1 on the base substrate 1. An orthographic projection of the second reset transistor T1' in the second sub-pixel driving circuit DR2 on the base substrate 1 may be represented by an orthographic projection of the channel region of the second reset transistor T1' in the second sub-pixel driving circuit DR2 on the base substrate 1.

As shown in FIGS. 18A and 18B, the initialization voltage line 66 and the second storage capacitor electrode Cst2 are located in the second conductive layer 22. The second conductive layer 22 is located on a side of the first conductive layer 21 away from the base substrate 1.

Referring to FIGS. 18A and 18B, the first sub-pixel 11(12) and the second sub-pixel 13 share an initialization voltage line 66. That is, the initialization voltage line 66 is only provided in the occupied region of the first sub-pixel driving circuit DR1 of the first sub-pixel 11(12), whereas there is no initialization voltage line 66 provided in the occupied region of the second sub-pixel driving circuit DR2 of the second sub-pixel 13.

Referring to FIG. 10, for a sub-pixel located in the second display region AA2, the second storage capacitor electrode Cst2 includes a through hole TH2, and an orthographic projection of a combination of a physical part of the second storage capacitor electrode Cst2 and the through hole TH2 on the base substrate 1 is in a shape of a rectangle or a rounded rectangle.

Referring to FIGS. 18A and 18B, for a sub-pixel located in the first display region AA1, the second storage capacitor electrode Cst2 has a notch NTH1 at a corner, that is, an orthographic projection of the second storage capacitor electrode Cst2 on the base substrate 1 has an "L" shape. In other words, an orthographic projection of a combination of a physical part of the second storage capacitor electrode Cst2 and the notch NTH1 on the base substrate 1 is in a shape of a rectangle or a rounded rectangle.

The notch NTH1 exposes a part of the first storage capacitor electrode Cst1 located under the second storage capacitor electrode Cst2, so that the first storage capacitor electrode Cst1 can be electrically connected with other parts.

In the embodiments of the present disclosure, an area of the orthographic projection of the second storage capacitor electrode Cst2 of a sub-pixel located in the first display region AA1 on the base substrate 1 is less than an area of the orthographic projection of the second storage capacitor electrode Cst2 of a sub-pixel located in the second display region AA2. On this basis, the second storage capacitor electrode Cst2 of the sub-pixel located in the first display region AA1 is designed into an "L" shape, without forming a through hole in the second storage capacitor electrode Cst2, which is beneficial to ensure that an overlapping area of the first storage capacitor electrode Cst1 and the second storage capacitor electrode Cst2 of the sub-pixel in the first display region AA1 is relatively large, that is, it is ensured that a capacitance value of the storage capacitor Cst is relatively large.

As shown in FIGS. 19A and 19B, a connection portion 168, a connection portion 169, a connection portion 170, and a connection portion 171 are located in the third conductive layer 23. The third conductive layer 23 is located on a side of the second conductive layer 22 away from the base substrate 1.

A part of the connection portion 168 is formed in a via hole VH6, and extends downward to be electrically connected to a part of the first storage capacitor electrode Cst1 exposed by the notch NTH1. Another part of the connection portion 168 is formed in a via hole VH2, and extends downward to be electrically connected to the drain D2 of the first compensation transistor T2 and the drain D1 of the first reset transistor T1. Through the connection portion 168, the first storage capacitor electrode Cst1, the drain D2 of the first compensation transistor T2 and the drain D1 of the first reset transistor T1 may be electrically connected, and the node N1 shown in FIG. 6B is formed.

The connection portion 169 includes a first connection sub-portion 1691 and a second connection sub-portion 1692. The first connection sub-portion 1691 and the second connection sub-portion 1692 are connected to each other to form the continuously extending connection portion 169. A part of the first connection sub-portion 1691 is formed in a via hole VH12, and extends downward to be electrically connected to the initialization voltage line 66. Another part of the first connection sub-portion 1691 is formed in a via hole VH124, and extends downward to be electrically connected to one of the common source portion 2030a or the common drain portion 2050a of the common transistor T10. In this way, by electrically connecting the initialization voltage line 66 with the source or the drain of the common transistor T10, the initialization voltage Vint transmitted by the initialization voltage line 66 may be supplied to the source or the drain of the first reset transistor T1 in the first sub-pixel driving circuit DR1, and the source or the drain of the second reset transistor T1' in the second sub-pixel driving circuit DR2.

Another part of the second connection sub-portion 1692 is formed in a via hole VH4, and extends downward to be electrically connected to the drain D7 of the first initialization transistor T7. In this way, the initialization voltage Vint transmitted by the initialization voltage line 66 may be supplied to the drain D7 of the first initialization transistor T7.

A part of the connection portion 170 is formed in a via hole VH5, and extends downward to be electrically connected to the source S7 of the first initialization transistor T7. Another part of the connection portion 170 is formed in a via hole VH10, and extends downward to be electrically connected to the drain D6 of the first light-emitting control transistor T6. Through the connection portion 170, the source S7 of the first initialization transistor T7 and the drain D6 of the first light-emitting control transistor T6 may be electrically connected, and the node N4 shown in FIG. 6B is formed.

A part of the connection portion 171 is formed in a via hole VH7, and extends downward to be electrically connected to the second storage capacitor electrode Cst2. Another part of the connection portion 171 is formed in a via hole VH9, and extends downward to be electrically connected to the source S5 of the first operation control transistor T5. Through the connection portion 171, the second storage capacitor electrode Cst2 may be electrically connected to the source S5 of the first operation control transistor T5.

With continued reference to FIGS. 19A and 19B, in a region where the second sub-pixel 13 is located, a connection portion 168', a connection portion 170', and a connection portion 171' are located in the third conductive layer 23.

A part of the connection portion 168' is formed in a via hole VH6', and extends downward to be electrically connected to a part of the first storage capacitor electrode Cst1 exposed by the notch NTH1. Another part of the connection portion 168' is formed in a via hole VH2', and extends downward to be electrically connected to the drain D2 of the second compensation transistor T2. Through the connection portion 168', the first storage capacitor electrode Cst1 and the drain D2 of the second compensation transistor T2 may be electrically connected.

A part of the connection portion 170' is formed in a via hole VH5', and extends downward to be electrically connected to the source S7 of the second initialization transistor T7. Another part of the connection portion 170' is formed in a via hole VH10', and extends downward to be electrically connected to the drain D6 of the second light-emitting control transistor T6. Through the connection portion 170', the source S7 of the second initialization transistor T7 and the drain D6 of the second light-emitting control transistor T6 may be electrically connected.

A part of the connection portion 171' is formed in a via hole VH7', and extends downward to be electrically connected to the second storage capacitor electrode Cst2. Another part of the connection portion 171' is formed in a via hole VH9', and extends downward to be electrically connected to the source S5 of the second operation control transistor T5. Through the connection portion 171', the second storage capacitor electrode Cst2 may be electrically connected to the source S5 of the second operation control transistor T5.

Referring to FIGS. 20A and 20B, in the first display region AA1, the first transparent conductive layer 26 is provided. For example, the first transparent conductive layer 26 may be made of a transparent conductive material such as indium tin oxide (i.e., ITO).

In the first display region AA1, the data signal line 164 and the driving voltage line 165 are located in the first transparent conductive layer 26. That is, the data signal line 164 and the driving voltage line 165 are made of a transparent conductive material such as indium tin oxide (i.e., ITO).

The display substrate may further include a plurality of transparent conductive connection portions located in the first transparent conductive layer 26. For example, the plurality of transparent conductive connection portions may include a first transparent conductive connection portion 161, a second transparent conductive connection portion 162, a third transparent conductive connection portion 163, and a fourth transparent conductive connection portion 166. That is, these transparent conductive connection portions are each made of a transparent conductive material such as indium tin oxide (i.e., ITO).

The display substrate may further include a plurality of conductive wires located in the first transparent conductive layer 26. For example, the plurality of conductive wires may include a third conductive wire 263 and a fourth conductive wire 266. That is, these conductive wires are each made of a transparent conductive material such as indium tin oxide (i.e., ITO).

It should be noted that, in the present disclosure, a component for electrically connecting elements in pixel driving circuits of a plurality of sub-pixels in a sub-pixel group is referred to as a conductive connection portion, and a component for electrically connecting elements in pixel driving circuits of a plurality of sub-pixels in different sub-pixel groups (e.g., adjacent sub-pixel groups) is referred to as a conductive wire. Such expressions are only for convenience of description, and are not intended to specifically limit these components to be different. For example, some features of these components may be the same, for example, at least some of these components may be located in the same conductive layer, such as located in the first transparent conductive layer 26, or at least some of these components may be made of the same conductive material, for example, made of a transparent conductive material such as indium tin oxide (i.e., ITO).

For example, the data line 164 may substantially continuously extend in the second direction Y. A part of the data signal line 164 is formed in a via hole VH3, and extends downward to be electrically connected to the source S4 of the first switching transistor T4, so that the data signal Dm transmitted by the data signal line 164 is supplied to the first switching transistor T4.

The driving voltage line 165 is disconnected at the pixel driving circuit of the sub-pixel in the first display region AA1, and is divided into two portions. For ease of description, the two portions are represented as a first driving voltage sub-line 1651 and a second driving voltage sub-line 1652, respectively.

For example, an orthographic projection of the first driving voltage sub-line 1651 on the base substrate 1 intersects with an orthographic projection of the initialization voltage line 66 on the base substrate 1, and the orthographic projection of the first driving voltage sub-line 1651 on the base substrate 1 at least partially overlaps an orthographic projection of the reset signal line 62 on the base substrate 1.

For another example, an orthographic projection of the second driving voltage sub-line 1652 on the base substrate 1 intersects with an orthographic projection of the light-emitting control line 63 on the base substrate 1, and the orthographic projection of the second driving voltage sub-line 1652 on the base substrate 1 at least partially overlaps an orthographic projection of the second storage capacitor electrode Cst2 on the base substrate 1. A part of the second driving voltage sub-line 1652 is formed in a via hole VH20, and extends downward to be electrically connected to a part of the connection portion 171, so as to be electrically connected to the second storage capacitor electrode Cst2. In this way, electrical connections among the driving voltage line, the second storage capacitor electrode Cst2 and the source S5 of the first operation control transistor T5 may be achieved.

The first driving voltage sub-line 1651 and the second driving voltage sub-line 1652 are spaced apart from each other by a certain distance in the second direction Y. For example, an orthographic projection of an end of the first driving voltage sub-line 1651 close to the second driving voltage sub-line 1652 on the base substrate 1 partially overlaps the orthographic projection of the reset signal line 62 on the base substrate 1, and an orthographic projection of an end of the second driving voltage sub-line 1652 close to the first driving voltage sub-line 1651 on the base substrate 1 partially overlaps an orthographic projection of a part of the second storage capacitor electrode Cst2 close to the light-emitting control line 63 on the base substrate 1. The first driving voltage sub-line 1651 and the second driving voltage sub-line 1652 that are spaced apart from each other are electrically connected together by a connection portion, which will be described in detail below.

In the embodiments of the present disclosure, the first transparent conductive connection portion 161 is arranged between the first sub-pixel and the second sub-pixel, and is used to electrically connect the second reset transistor T1' (including the common transistor T10 and the second sub-transistor T12) located in the occupied region of the first sub-pixel into the second sub-pixel driving circuit DR2.

Referring to FIGS. 20A and 20B, one end of the first transparent conductive connection portion 161 is electrically connected to one of the second sub-source portion 2032a or the second sub-drain portion 2052a through a via hole VH21, and the other end of the transparent conductive connection portion 161 is electrically connected to the gate of the second driving transistor T3 in the second sub-pixel driving circuit DR2 through a via hole VH22. In this way, the second reset transistor T1' (including the common transistor T10 and the second sub-transistor T12) located in the occupied region of the first sub-pixel may be electrically connected into the second sub-pixel driving circuit DR2.

For example, an orthographic projection of the first transparent conductive connection portion 161 on the base substrate 1 partially overlaps an orthographic projection of the active layer 20g of the first initialization transistor T7 on the base substrate 1, and the orthographic projection of the first transparent conductive connection portion 161 on the base substrate 1 partially overlaps an orthographic projection of the active layer 20g of the second initialization transistor T7 on the base substrate 1.

For example, the first transparent conductive connection portion 161 includes at least a first part 1611, a second part 1612 and a third part 1613. The second part 1612 is located between the first part 1611 and the third part 1613, and connects the first part 1611 and the third part 1613. That is, the first transparent conductive connection portion 161 is a continuously extending connection portion. The third part 1613 of the first transparent conductive connection portion extends in the first direction X, the second part 1612 of the first transparent conductive connection portion extends in the second direction Y, and the first part 1611 of the first transparent conductive connection portion extends in an oblique direction that is oblique relative to both the first direction X and the second direction Y.

An orthographic projection of the first part 1611 of the first transparent conductive connection portion on the base substrate 1 partially overlaps the orthographic projection of the active layer 20g of the first initialization transistor T7 on the base substrate 1. An orthographic projection of the third part 1613 of the first transparent conductive connection portion on the base substrate 1 partially overlaps the orthographic projection of the active layer 20g of the second initialization transistor T7 on the base substrate 1. The second part 1612 of the first transparent conductive connection portion is located in a light-transmitting area between the first sub-pixel and the second sub-pixel. For example, a part of the first part 1611 of the first transparent conductive connection portion and a part of the third part 1613 of the first transparent conductive connection portion are also located in the light-transmitting area between the first sub-pixel and the second sub-pixel.

In the embodiments of the present disclosure, a second transparent conductive connection portion 162 is arranged between the first sub-pixel and the second sub-pixel, and is used to electrically connect the reset signal line 62 located in the occupied region of the first sub-pixel into the second sub-pixel driving circuit DR2, so that the reset signal RESET is provided to the second sub-pixel driving circuit DR2.

In some exemplary embodiments of the present disclosure, the resistance of the first transparent conductive connection portion 161 may be reduced. For example, a line width of the first transparent conductive connection portion 161 may be increased. For example, the line width of the first transparent conductive connection portion 161 may be greater than a line width of each of the conductive connection portions 162, 163 and 166. For example, an extension length of the first transparent conductive connection portion 161 may be shortened. For example, conductive portions located in two conductive layers may be connected in parallel to form the first transparent conductive connection portion. For example, the first part of the first transparent conductive connection portion may be located in the first transparent conductive layer, the second part of the first transparent conductive connection portion may be located in the third conductive layer, the fourth conductive layer or the second transparent conductive layer, and the first part and the second part are connected in parallel, so as to form the first transparent conductive connection portion.

In some exemplary embodiments of the present disclosure, among the transparent conductive connection portions 161, 162, 163 and 166, the first transparent conductive connection portion 161 may be arranged on a side closest to edge. That is, an arrangement order of the transparent conductive connection portions 161, 162, 163 and 166 is not limited to the manner shown in FIGS. 20A to 20B. For example, the first transparent conductive connection portion 161 may be arranged on a side of the second conductive connection portion 162 away from the third conductive connection portion 163. In this way, an influence of other electronic components or the electrical environment on the first transparent conductive connection portion 161 may be minimized, so that the stability of the reset signal transmitted by the first transparent conductive connection portion 161 may be ensured.

Figure 6C:
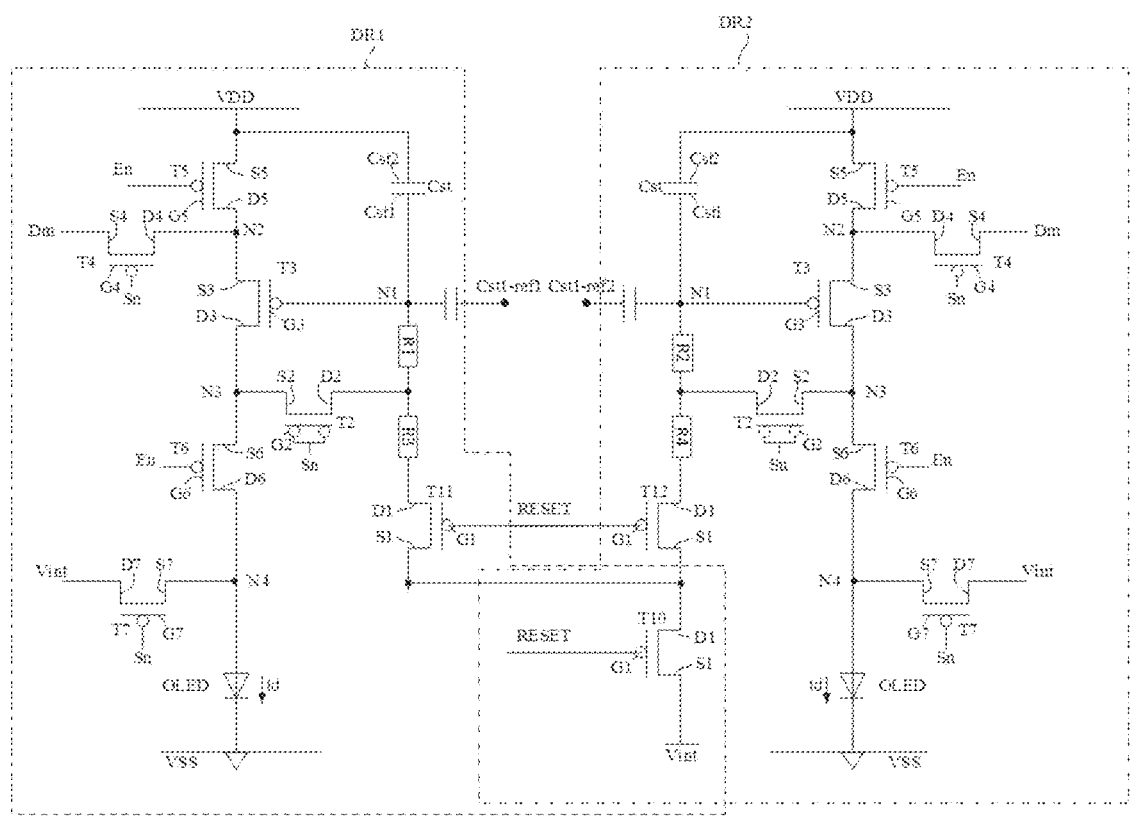
FIG. 6C shows an equivalent circuit diagram of a pixel driving circuit of a sub-pixel located in a first display region of a display substrate according to some exemplary embodiments of the present disclosure.

In some exemplary embodiments of the present disclosure, referring to FIGS. 6C and 20B, by adjusting resistances on paths through which the reset signal is transmitted to the gates of the driving transistors T3 in two sub-pixels, the resistances on the transmission paths of the reset signal may be substantially the same, in other words, the resistances on the transmission paths of the reset signal in different sub-pixels are adjustable. For example, resistors R1 and R3 in FIG. 6C schematically indicate the resistances on the path through which the reset signal is transmitted to the gate of the driving transistor T3 in the first sub-pixel, and resistors R2 and R4 schematically indicate the resistances on the path through which the reset signal is transmitted to the gate of the driving transistor T3 in the second sub-pixel.

For example, as described above, the line width of the first transparent conductive connection portion 161 may be increased, the extension length of the first transparent conductive connection portion 161 may be shortened, or the conductive portions in two conductive layers (such as the first transparent conductive layer and the second conductive layer) are connected in parallel to form the first transparent conductive connection portion, so as to adjust the resistance on the path through which the reset signal is transmitted to the gate of the driving transistor T3 in the second sub-pixel, so that the resistances on the paths through which the reset signal is transmitted to the gates of the driving transistors T3 in the two sub-pixels are substantially the same.

With continued reference to FIGS. 6C and 20B, a coupling capacitance acting on the node N1 may be adjusted to adjust potentials at nodes N1 of different sub-pixels, so that the potentials at the nodes N1 of different sub-pixels remains stable, that is, the potentials are substantially the same. For example, Cst1-ref1 shown in FIG. 6C schematically indicates a coupling capacitance acting on the node N1 of the first sub-pixel driving circuit DR1, and Cst1-ref2 shown in FIG. 6C schematically indicates a coupling capacitance acting on the node N1 of the second sub-pixel driving circuit DR2.

For example, the first transparent conductive connection portion 161 (that is, a line used to transmit the reset signal to the gate of the driving transistor in the second sub-pixel driving circuit) may be moved to the vicinity of the driving voltage line (e.g., the first driving voltage sub-line 1651), that is, positions of the transparent conductive connection portions 161, 162 and 163 may be exchanged; or, the first transparent conductive connection portion 161 may overlap a film layer with a VDD potential; or, a part of the initialization signal line 66 may be extended downward so as to overlap the first transparent conductive connection portion 161. That is, in some exemplary embodiments, the first transparent conductive connection portion 161 may be arranged to overlap a conductive portion or a film layer with a constant potential, so as to form the coupling capacitance acting on the node N1. For another example, overlapping areas of two sub-pixels (for example, the first sub-pixel and the second sub-pixel) sharing a reset transistor may be different to achieve the differentiated design of different sub-pixels, so as to adjust the electrical environment of the conductive portion at the node N1. In this way, the potentials at the nodes N1 in the pixel driving circuits of different sub-pixels may be kept consistent, which is conducive to the improvement of the uniformity of the display substrate.

It should be noted that, although the resistors R1 to R4 and the coupling capacitors Cst1-ref1 and Cst1-ref2 shown in FIG. 6C are provided, the embodiments of the present disclosure are not limited thereto. For example, in some embodiments, only the resistors R1 to R4 may be provided to adjust the resistances on the paths through which the reset signal is transmitted to the gates of the driving transistors T3 of the two sub-pixels. In some embodiments, only the coupling capacitances acting on the nodes N1 may be provided to adjust the potentials at the nodes N1 of different sub-pixels.

Referring to FIGS. 20A and 20B, one end of the second transparent conductive connection portion 162 is electrically connected to the connection portion 169 through a via hole VH23, and the other end of the second transparent conductive connection portion 162 is electrically connected to an end of the active layer 20g of the second initialization transistor T7 in the second sub-pixel driving circuit DR2 through a via hole VH24. For example, an orthographic projection of the via hole VH23 on the base substrate 1 and an orthographic projection of the via hole VH4 on the base substrate 1 at least partially overlap. That is, one end of the second transparent conductive connection portion 162 is electrically connected to an end (the lower end shown in FIG. 20B) of the connection portion 169 through the via hole VH23. The other end of the second transparent conductive connection portion 162 is electrically connected to the seventh source region 203g or the seventh drain region 205g of the second initialization transistor T7 through the via hole VH24. In this way, the reset signal RESET transmitted by the reset signal line 62 may be supplied to the source or drain of the second initialization transistor T7 in the second sub-pixel driving circuit DR2.

For example, the second transparent conductive connection portion 162 includes at least a first part 1621, a second part 1622 and a third part 1623, and the second part 1622 is between the first part 1621 and the third part 1623. The first part 1621 of the second transparent conductive connection portion extends in the first direction X, the third part 1623 of the second transparent conductive connection portion extends in the second direction Y, and the second part 1622 of the second transparent conductive connection portion extends in an oblique direction that is oblique relative to both the first direction X and the second direction Y.

The second transparent conductive connection portion 162 may be located in the light-transmitting region between the first sub-pixel and the second sub-pixel. For example, the first part 1621, the second part 1622 and the third part 1623 of the second transparent conductive connection portion 162 are located in the light-transmitting region between the first sub-pixel and the second sub-pixel.

As shown in FIGS. 21A and 21B, a connection portion 172 and a conductive connection portion 173 are located in the fourth conductive layer 24.

A part of the connection portion 172 is formed in a via hole VH1, and extends downward to be electrically connected to the first driving voltage sub-line 1651. Another part of the connection portion 172 is formed in a via hole VH7", and extends downward to be electrically connected to the second driving voltage sub-line 1652. That is, the first driving voltage sub-line 1651 and the second driving voltage sub-line 1652 may be electrically connected through the connection portion 172, so that driving voltage lines of respective sub-pixels located in the same column may be connected, so as to supply the driving voltage signal VDD to respective sub-pixels.

In some embodiments of the present disclosure, the first driving voltage sub-line 1651 and the second driving voltage sub-line 1652 may not be disconnected at the pixel driving circuit. In this way, the connection portion 172 may be omitted.

In some embodiments of the present disclosure, the first driving voltage sub-line 1651 and the second driving voltage sub-line 1652 may be disconnected at the pixel driving circuit, while the connection portion 172 may also be provided. In this way, the connection portion 172 is connected in parallel with a part of the driving voltage line 165, which is conducive to a reduction of the resistance of the driving voltage line 165.

A part of the conductive connection portion 173 is formed in a via hole VH10', and the via hole VH10' exposes a part of the connection portion 170, as such, the conductive connection portion 173 may be electrically connected to the connection portion 170.

As shown in FIGS. 22A and 22B, a second transparent conductive layer 28 is provided in the first display region AA1. For example, the second transparent conductive layer 28 may be made of a transparent conductive material such as indium tin oxide (i.e., ITO). The second transparent conductive layer 28 is located on a side of the fourth conductive layer 24 away from the base substrate 1. The display substrate further includes a first conductive wire 181 and a second conductive wire 182 arranged on the base substrate 1. The first conductive wire 181 and the second conductive wire 182 may be located in the second transparent conductive layer 28. That is, the first conductive wire 181 and the second conductive wire 182 are made of a transparent conductive material such as indium tin oxide (i.e., ITO).

As shown in FIGS. 22A and 22B, in addition to the reset transistors T1 and T1', other transistors T2 to T7 in the first sub-pixel driving circuit DR1 and the second sub-pixel driving circuit DR2 may be mirrored.

Figure 25A:
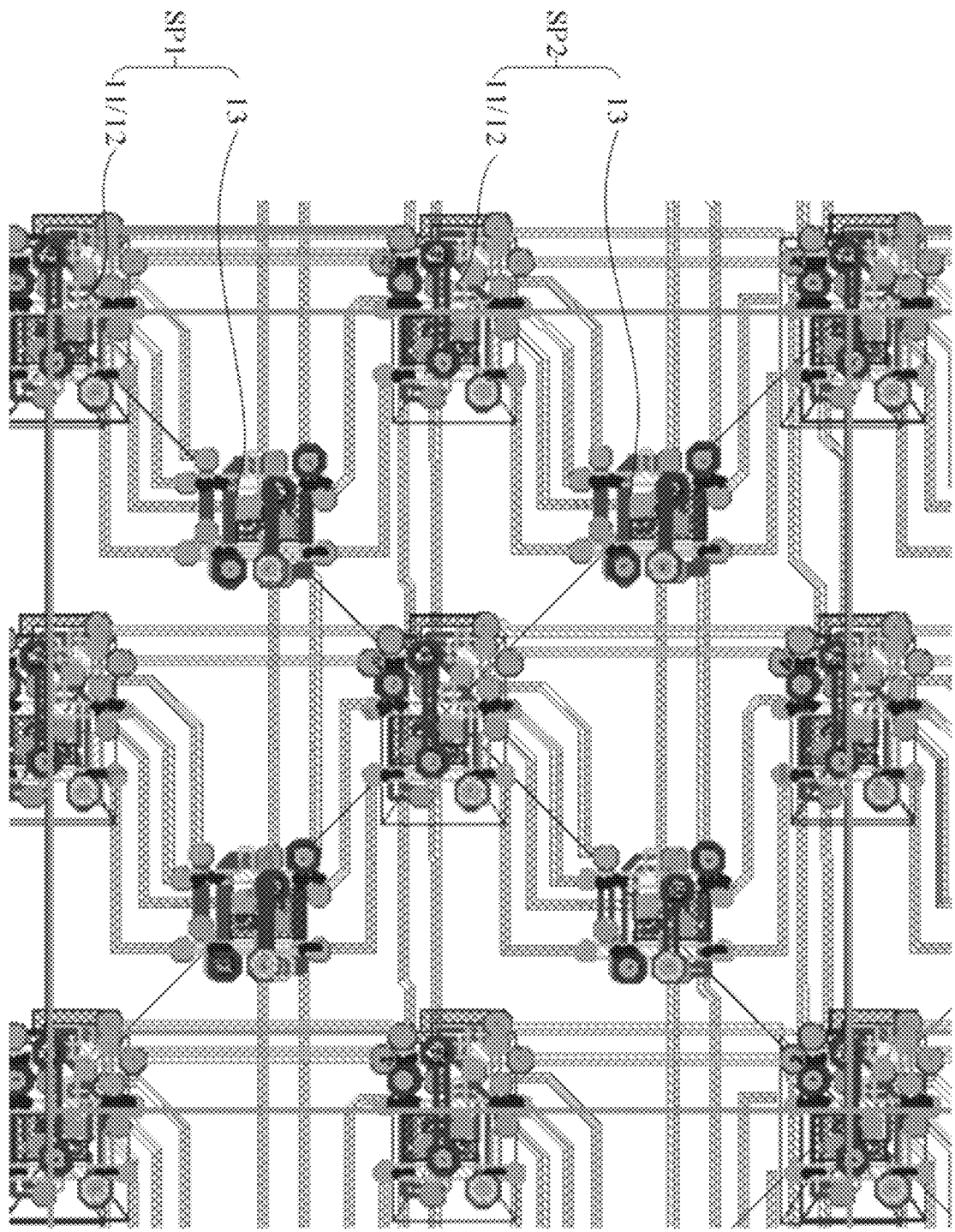
FIGS. 25A and 25B show plan views of exemplary embodiments of a plurality of sub-pixel groups in a first display region of a display substrate, according to some exemplary embodiments of the present disclosure.
Figure 25B:
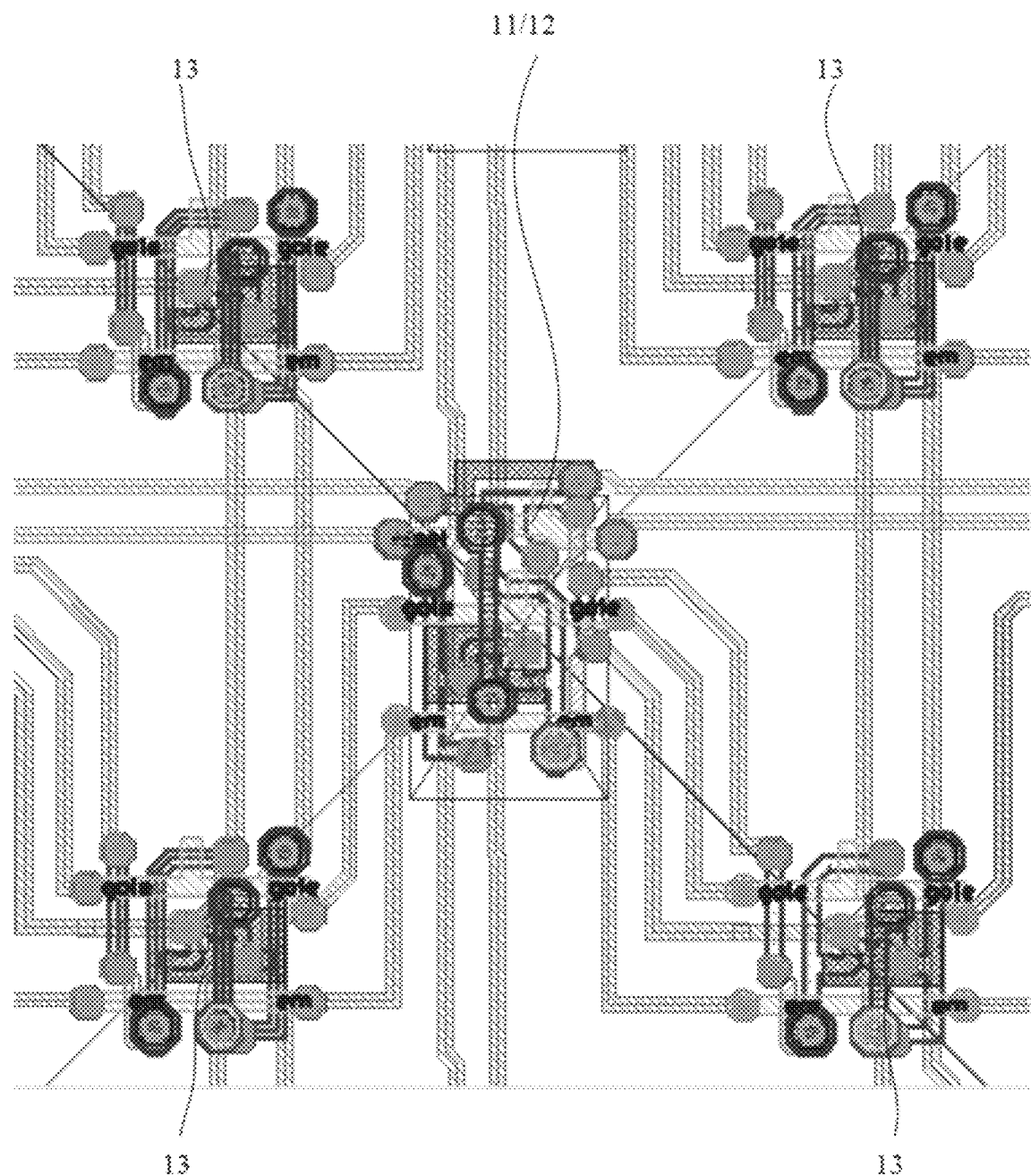

FIGS. 25A and 25B show plan views of exemplary embodiments of a plurality of sub-pixel groups in a first display region AA1 of a display substrate, according to some exemplary embodiments of the present disclosure. With reference to FIGS. 20A, 20B, 22A, 22B, 25A and 25B, in the first display region AA1, the scan signal line 61, reset signal line 62, light-emitting control line 63 and the initialization voltage line 66 extending in the first direction X are respectively electrically connected by conductive wires or transparent conductive connection portions located in the transparent conductive layer. In this way, in the light-transmitting region of the first display region AA1, only the transparent conductive wires and the transparent conductive connection portions are provided, and conductive wires made of an opaque material such as metal are not provided. In this way, it may be ensured that the light transmittance of the first display region AA1 is relatively great.

For example, in a sub-pixel group, the first scan signal line 61 of the first sub-pixel 11(12) and the second scan signal line 61 of the second sub-pixel 13 are electrically connected through a third transparent conductive connection portion 163, and the first light-emitting control line 63 of the first sub-pixel 11(12) and the second light-emitting control line 63 of the second sub-pixel 13 are electrically connected through a fourth transparent conductive connection portion 166.

For example, the third conductive wires 263 are respectively arranged on both sides of a sub-pixel group to electrically connect the scan signal lines 61 of respective sub-pixel groups in the same row. A part of a third conductive wire 263 on the left side is formed in a via hole VH15, and extends downward to be electrically connected to an end of a first scan signal line 61. A part of a third conductive wire 263 on the right side is formed in a via hole VH15, and extends downward to be electrically connected to an end of a second scan signal line 61. Through the third transparent conductive connection portion 163 and the third conductive wire 263, the scan signal lines 61 of the sub-pixels in the same row may be electrically connected, so as to supply the scan signal Sn.

The fourth conductive wires 266 are respectively arranged on both sides of a sub-pixel group to electrically connect the light-emitting control lines 63 of respective sub-pixel groups in the same row. A part of a fourth conductive wire 266 on the left side is formed in a via hole VH17, and extends downward to be electrically connected to an end of a first light-emitting control line 63. A part of a fourth conductive wire 266 on the right side is formed in a via hole VH17, and extends downward to be electrically connected to an end of a second light-emitting control line 63. Through the fourth transparent conductive connection portion 166 and the fourth conductive wire 266, the light-emitting control lines 63 of the sub-pixels in the same row may be electrically connected, so as to supply the light-emitting control signal Em.

The first conductive wires 181 are respectively arranged on both sides of the reset signal line 62 of a sub-pixel group. A part of one first conductive wire 181 is formed in a via hole VH13, and extends downward to be electrically connected to one end of the reset signal line 62. A part of the other first conductive wire 181 is formed in a via hole VH14, and extends downward to be electrically connected to the other end of the reset signal line 62. Through the first conductive wire 181, the reset signal lines 62 of the sub-pixel groups in the same row may be electrically connected, so as to supply the reset signal Reset.

The second conductive wires 182 are respectively arranged on both sides of the initialization voltage line 66 of a sub-pixel group. A part of one second conductive wire 182 is formed in a via hole VH11, and extends downward to be electrically connected to one end of the initialization voltage line 66. A part of the other second conductive wire 182 is formed in a via hole VH12, and extends downward to be electrically connected to the other end of the initialization voltage line 66. Through the second conductive wire 182, the initialization voltage lines 66 of the sub-pixel groups in the same row may be electrically connected, so as to supply the initialization voltage signal Vint.

In other words, referring to FIGS. 25A and 25B, the plurality of sub-pixel groups include at least a first sub-pixel group SP1 and a second sub-pixel group SP2 that are located in the same row and adjacent to each other. One end of a first conductive wire 181 is electrically connected to a reset signal line 62 in the first sub-pixel group SP1 through a via VH13, and the other end of the first conductive wire 181 is electrically connected to a reset signal line 62 in the second sub-pixel group SP2 through a via hole VH14. One end of a second conductive wire 182 is electrically connected to an initialization voltage line 66 in the first sub-pixel group SP1 through a via hole VH11, and the other end of the second conductive wire 182 is electrically connected to an initialization voltage line 66 in the second sub-pixel group SP2 through a via hole VH12.

In the embodiments of the present disclosure, an orthographic projection of at least one of the first conductive wire 181 or the second conductive wire 182 on the base substrate 1 intersects with an orthographic projection of at least one of the data line 164 or the driving voltage line 165 (i.e., the first driving voltage sub-line 1651 and/or the second driving voltage sub-line 1652) on the base substrate 1.

As shown in FIGS. 23A and 23B, the first electrode (e.g., the anode) of the first light-emitting device 41 may be located in the fifth conductive layer 25. As described above, the anode of the first light-emitting device 41 includes the anode body portion 411 and the anode connection portion 412.

In the first sub-pixel 11(12), a part of the anode connection portion 412 may be formed in a via hole VH10", and the via hole VH10" exposes a part of the conductive connection portion 173, so that the anode connection portion 412 is electrically connected to the conductive connection portion 173 and then connected to the connection portion 170. That is, through the conductive connection portion 173 and the connection portion 170, in the first sub-pixel, the anode of the first light-emitting device 41, the source S7 of the first initialization transistor T7, and the drain D6 of the first light-emitting control transistor T6 may be electrically connected, and the node N4 shown in FIG. 6B is formed.

In the second sub-pixel 13, a part of the anode connection portion 412 may be formed in a via hole VH10", and the via hole VH10" exposes a part of the conductive connection portion 173, so that the anode connection portion 412 is electrically connected to the conductive connection portion 173 and then connected to the connection portion 170. That is, through the conductive connection portion 173 and the connection portion 170, in the second sub-pixel, the anode of the first light-emitting device 41, the source S7 of the second initialization transistor T7, and the drain D6 of the second light-emitting control transistor T6 may be electrically connected, and the node N4 shown in FIG. 6B is formed.

With reference to FIGS. 4, 23A, 23B, 25A and 25B, in the first display region AA1, each of pixel driving circuits of the sub-pixel 11, the sub-pixel 12, and the sub-pixel 13 may be substantially reduced to the size of the first light-emitting device 41, and may be placed under the light-emitting device 41. In this way, in the first display region AA1 (i.e., the under-screen imaging region), the pixel driving circuit of each sub-pixel may be built into a corresponding sub-pixel, without placing it outside in the spacer region SR, which may avoid the various above-mentioned problems caused by placing the pixel driving circuit outside. Moreover, in the embodiments of the present disclosure, the pixel driving circuit of each sub-pixel is built into the corresponding sub-pixel and hidden under the light-emitting device of the corresponding sub-pixel, which may ensure that the light transmittance of the first display region is relatively great, that is, it is conducive to the high light transmittance of the first display region. Referring to FIG. 4, in the first display region AA1, a light-transmitting region TRA exists between adjacent sub-pixels. The pixel driving circuit of each sub-pixel may be substantially reduced to the size of the first light-emitting device 41 and placed under the light-emitting device 41, which is conducive to a relatively large area of the light-transmitting region TRA, thereby ensuring the light transmittance of the first display region is relatively large. In addition, in the light-transmitting region TRA, only transparent conductive wires are provided without any opaque wires, thereby further ensuring that the light transmittance of the first display region is relatively great.

Referring to FIGS. 7 and 13, in the second display region AA2, an area of the occupied region of the pixel driving circuit in each of the sub-pixels 21, 22 and 23 is relatively large. For example, the area of the occupied region of the pixel driving circuit in the sub-pixel 23 (i.e., the green sub-pixel) is greater than the area of the occupied region of the pixel driving circuit in the sub-pixel 13 (i.e., the green sub-pixel).

In the present disclosure, in the second display region AA2, the occupied region of the pixel driving circuit in each of the sub-pixels 21, 22 and 23 may be represented by the following region. Referring to FIGS. 12A and 12B, for the pixel driving circuit of each of the sub-pixels 21, 22 and 23, in the first direction X, the data signal line 64 and the sixth active layer 20f of the first light-emitting control transistor T6 are respectively located on the leftmost side and the rightmost side, that is, the distance between the two in the first direction X is the largest; in the second direction Y, the initialization voltage line 66 and the light-emitting control line 63 are respectively located at the uppermost side and the lowermost side, that is, the distance between the two in the second direction Y is the largest. In this way, in the orthographic projection of the pixel driving circuit of a sub-pixel on the base substrate, the data signal line 64 has a first side away from the sixth active layer 20f of the first light-emitting control transistor T6, and the sixth active layer 20f of the first light-emitting control transistor T6 has a second side away from the data signal line 64, the initialization voltage line 66 has a third side away from the light-emitting control line 63, and the light-emitting control line 63 has a fourth side away from the initialization voltage line 66. The first side and the second side extend in the second direction Y, and the third side and the fourth side extend in the first direction X. Extension lines of these four sides will cross, to enclose and form a region, which is the occupied region of the pixel driving circuit of a sub-pixel in the second display region AA2, referring to the region AR22 enclosed by a dashed box shown in FIG. 12A.

In the present disclosure, in the first display region AA1, the occupied region of the pixel driving circuit in each of the sub-pixels 11, 12 and 13 may be represented by the following region. Referring to FIGS. 23A and 23B, for the first sub-pixel 11(12), the via holes VH11, VH12, VH13, VH14, VH15, VH16, VH17, VH18 and VH23 are respectively located at the outermost side of the pixel driving circuit, and the via holes VH9 and VH10" are located at the outermost side of the pixel driving circuit. By connecting centers of every two adjacent via holes in the eleven via holes sequentially, a region may be enclosed and formed, referring to the region AR1 enclosed by a dashed box shown in FIG. 23B. The region AR1 may be located in the occupied region of the first sub-pixel driving circuit of a first sub-pixel in the first display region AA1. For the second sub-pixel 13, the via holes VH24, VH16', VH18', VH9, VH10", VH17, VH15 and VH3 are respectively located on the outermost side of the pixel driving circuit. By sequentially connecting centers of every two adjacent via holes in the eight via holes, a region is enclosed and formed, as the region AR2 enclosed by a dashed box shown in FIG. 23B. The region AR2 may be located in the occupied region of the second sub-pixel driving circuit of a second sub-pixel in the first display region AA1.

In the present disclosure, unless otherwise specified, the occupied region of the light-emitting device of a sub-pixel in the second display region AA2 may be represented by a region covered by the orthographic projection of the anode of the light-emitting device on the base substrate. Similarly, the occupied region of the light-emitting device of a sub-pixel in the first display region AA1 may be represented by a region covered by the orthographic projection of the anode of the light-emitting device on the base substrate.

In the embodiments of the present disclosure, the PPI in the first display region AA1 is substantially equal to the PPI in the second display region. That is, within the same area, the number of first repeating units P1 arranged in the first display region AA1 is substantially equal to the number of second repeating units P2 arranged in the second display region AA2, in other words, the number of sub-pixels arranged in the first display region AA1 is substantially equal to the number of sub-pixels of the same color arranged in the second display region AA2. In this way, both the first display region and the second display region may have relatively high PPI and display quality, and the display uniformity is relatively good.

In the present disclosure, unless otherwise specified, the expressions "substantially equal to", "substantially the same as", etc. may indicate that a ratio of the two values being compared is approximately equal to 1, for example, the ratio of the two values being compared may be within a range from 0.8 to 1.2.

In some embodiments, an area of an occupied region of light-emitting devices of respective sub-pixels in the first display region AA1 is substantially the same as an area of an occupied region of light-emitting devices of sub-pixels of the same color in the second display region AA2. For example, the area of the orthographic projection of the anode of the first light-emitting device 41 in the sub-pixel 11 on the base substrate 1 is substantially equal to the area of the orthographic projection of the anode of the second light-emitting device 42 in the sub-pixel 21 on the base substrate 1; the area of the orthographic projection of the anode of the first light-emitting device 41 in the sub-pixel 12 on the base substrate 1 is substantially equal to the area of the orthographic projection of the anode of the second light-emitting device 42 in the sub-pixel 22 on the base substrate 1; the area of the orthographic projection of the anode of the first light-emitting device 41 in the sub-pixel 13 on the base substrate 1 is substantially equal to the area of the orthographic projection of the anode of the second light-emitting device 42 in the sub-pixel 23 on the base substrate 1. Such arrangement is conducive to substantial equality of the PPI in the first display region AA1 and the PPI in the second display region. In addition, the display uniformity between the first display region and the second display region may also be better, and the lifetime uniformity of the light-emitting material between the first display region and the second display region is also better.

It should be noted that, the embodiments of the present disclosure are not limited to the above-mentioned embodiments. In other embodiments, the area of the occupied region of the light-emitting devices of respective sub-pixels in the first display region AA1 may also be unequal to the area of the occupied region of the light-emitting devices of the sub-pixels of the same color in the second display region AA2, as long as the PPI in the first display region AA1 is enabled to be substantially equal to the PPI in the second display region.

In the embodiments of the present disclosure, the area of the occupied region of the pixel driving circuit of each of the sub-pixels 11, 12, 13 in the first display region AA1 is reduced, which is conducive to hiding the pixel driving circuits of the respective sub-pixels in the first display region AA1 under respective light-emitting devices of the sub-pixels.

As described above, referring to FIG. 17B, for a first sub-pixel in the first display region AA1, the active layer 20g of the first initialization transistor T7 extends in a direction close to the scan signal line 61 of the sub-pixel relative to the active layer 20a of the first reset transistor T1. That is, the active layer 20g of the first initialization transistor T7 is located at the lower right of the active layer 20a of the first reset transistor T1. Through this arrangement, an outline of the occupied region of the active layer of the first sub-pixel located in the first display region AA1 has a square or a substantially square shape. Referring to FIGS. 23A and 23B, the orthographic projection of the anode body portion of the first light-emitting device 41 in the first sub-pixel 11(12) on the base substrate is in a shape of a circle. Such arrangement is conducive to achieving that the anode of each sub-pixel covers the pixel driving circuit of the sub-pixel.

Referring to FIG. 23B, the orthographic projection of the anode of the first light-emitting device 41 in the first sub-pixel 11(12) on the base substrate 1 and the orthographic projection of the occupied region AR1 of the pixel driving circuit in the first sub-pixel 11(12) on the base substrate 1 at least partially overlap. For example, the orthographic projection of the anode of the first light-emitting device 41 in the first sub-pixel 11(12) on the base substrate 1 substantially completely covers the orthographic projection of the occupied region AR1 of the pixel driving circuit in the first sub-pixel 11(12) on the base substrate 1.

In the present disclosure, unless otherwise specified, the expression "substantially completely cover" means to cover more than 90% of the overall area of a certain orthographic projection.

Referring to FIG. 23B, the orthographic projection of the anode of the first light-emitting device 41 in the second sub-pixel 13 on the base substrate 1 and the orthographic projection of the occupied region AR2 of the pixel driving circuit in the second sub-pixel 13 on the base substrate 1 at least partially overlap. For example, the orthographic projection of the anode of the first light-emitting device 41 in the second sub-pixel 13 on the base substrate 1 substantially completely covers the orthographic projection of the occupied region AR2 of the pixel driving circuit in the second sub-pixel 13 on the base substrate 1.

In the embodiments of the present disclosure, an area of the orthographic projection of the anode of the first light-emitting device 41 in the sub-pixel 13 on the base substrate 1 is less than an area of the orthographic projection of the anode of the first light-emitting device 41 in the sub-pixel 11 on the base substrate 1. An area of the orthographic projection of the anode of the first light-emitting device 41 in the sub-pixel 11 on the base substrate 1 is less than an area of the orthographic projection of the anode of the first light-emitting device 41 in the sub-pixel 12 on the base substrate 1.

In the embodiments of the present disclosure, the reset transistor in the pixel driving circuit of the second sub-pixel 13 is arranged to be at least partially shared with the reset transistor in the pixel driving circuit of the first sub-pixel 11(12), which may reduce the number of the transistors needed to be provided in the occupied region AR2 of the pixel driving circuit in the second sub-pixel 13, so that the area of the occupied region AR2 of the pixel driving circuit in the second sub-pixel 13 may be reduced. In this way, although the area of the anode of the first light-emitting device 41 in the second sub-pixel 13 is small, it may still be ensured that the anode of the first light-emitting device 41 in the second sub-pixel 13 can substantially cover the pixel driving circuit in the second sub-pixel 13, that is, the pixel driving circuit of the second sub-pixel 13 is hidden under the anode of the light-emitting device of the second sub-pixel 13.

For example, in the first display region AA1, the orthographic projection of the anode of the first light-emitting device 41 of each sub-pixel on the base substrate 1 at least covers orthographic projections of the storage capacitor Cst (including the first storage capacitor electrode Cst1 and the second storage capacitor electrode Cst2) and the plurality of transistors of the pixel driving circuit in the sub-pixel on the base substrate 1.

In the present disclosure, unless otherwise specified, the expression "an orthographic projection of a transistor on a base substrate" includes a combination of orthographic projections of the active layer, gate, source and drain of the transistor on the base substrate.

For example, referring to FIG. 23B, the orthographic projection of the anode of the first light-emitting device 41 in the second sub-pixel 13 on the base substrate 1 covers the orthographic projections of the second compensation transistor T2, the second driving transistor T3, the second switching transistor T4, the second operation control transistor T5, the second light-emitting control transistor T6, the second initialization transistor T7 and the storage capacitor Cst in the pixel driving circuit of the second sub-pixel 13 on the base substrate 1.

For example, referring to FIG. 23B, the orthographic projection of the anode of the first light-emitting device 41 in the first sub-pixel 11(12) on the base substrate 1 covers the orthographic projections of the first reset transistor T1, the first compensation transistor T2, the first driving transistor T3, the first switching transistor T4, the first operation control transistor T5, the first light-emitting control transistor T6, the first initialization transistor T7 and the storage capacitor Cst in the pixel driving circuit of the first sub-pixel 11(12) on the base substrate 1. In addition, the orthographic projection of the anode of the first light-emitting device 41 in the first sub-pixel 11(12) on the base substrate 1 further covers the orthographic projection of the second reset transistor T1' of the pixel driving circuit in the second sub-pixel 13 on the base substrate 1.

In the embodiments of the present disclosure, through such arrangement, the pixel driving circuit in each sub-pixel may be arranged under each light-emitting device (e.g., the anode), so that the pixel driving circuit may not occupy a light-transmitting region between the sub-pixels, which is conducive to the high light transmittance of first display region, while achieving the high PPI of the first display region, that is, it is conducive to the high display quality of the under-screen imaging region.

Figure 26A:
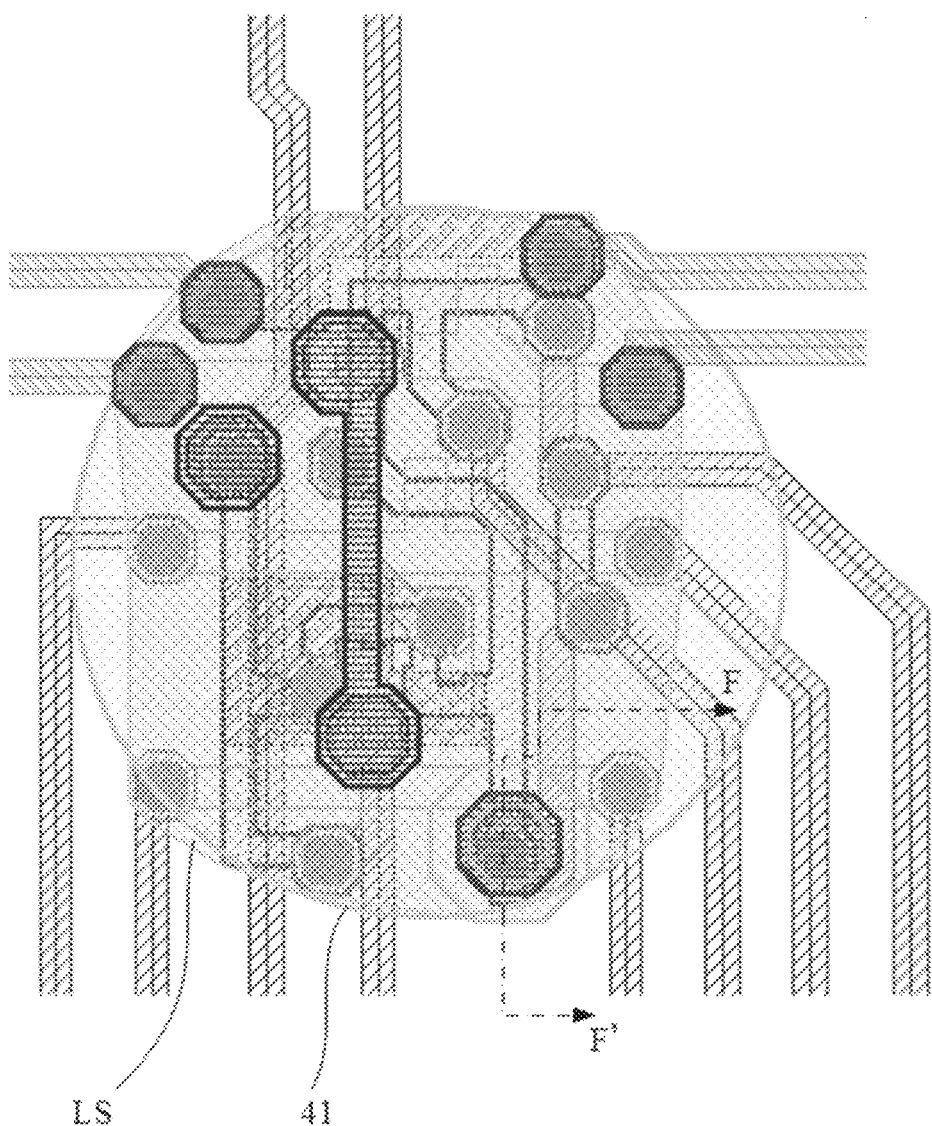
FIGS. 26A, 26B, and 26C respectively show plan views of combinations of a light shielding layer, a semiconductor layer, a first conductive layer, a second conductive layer, a third conductive layer, a first transparent conductive layer, a fourth conductive layer, a second transparent conductive layer, and a fifth conductive layer of exemplary embodiments of three sub-pixels included in a repeating unit in FIG. 15, according to some exemplary embodiments of the present disclosure.
Figure 26B:
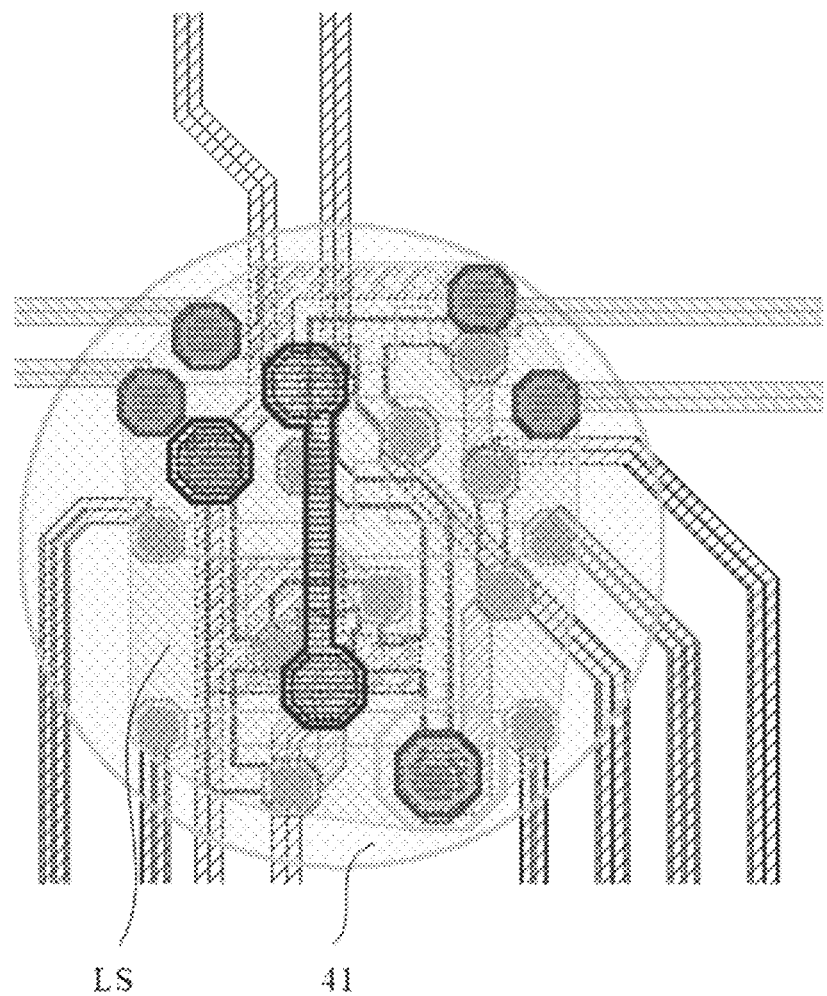
Figure 26C:
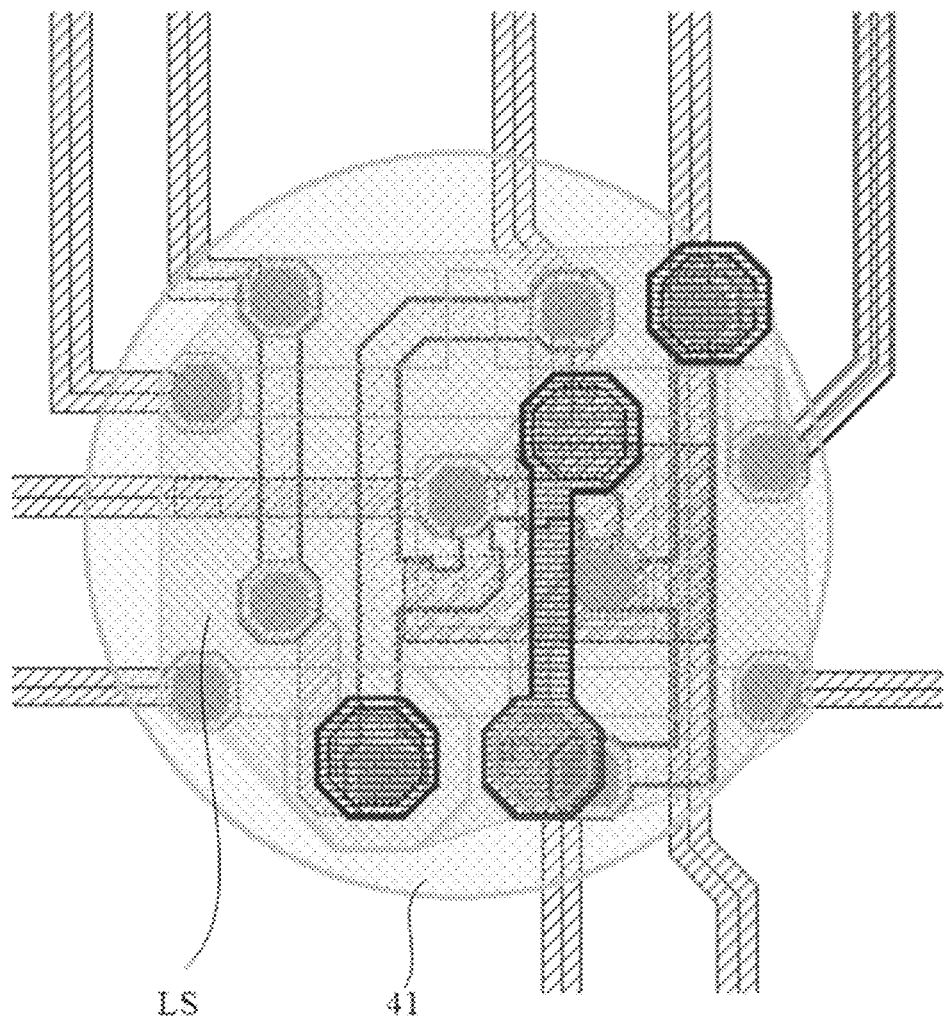
Figure 27:
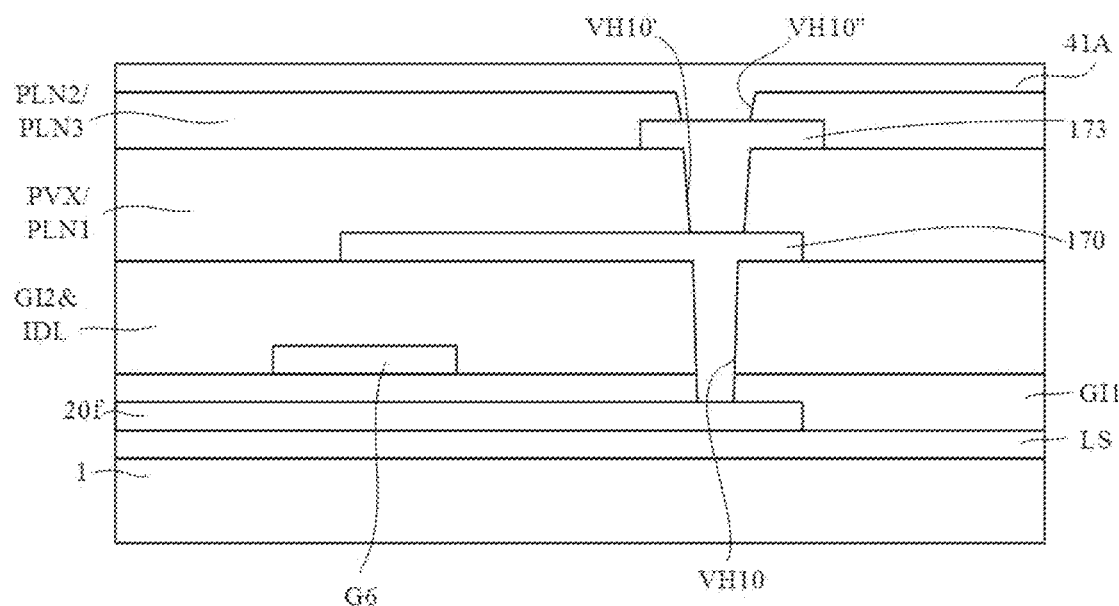
FIG. 27 shows a schematic cross-sectional view of a display substrate taken along a line FF' in FIG. 26A, according to some exemplary embodiments of the present disclosure.

FIGS. 26A, 26B, and 26C respectively show plan views of combinations of a light shielding layer, a semiconductor layer, a first conductive layer, a second conductive layer, a third conductive layer, a first transparent conductive layer, a fourth conductive layer, a second transparent conductive layer, and a fifth conductive layer of exemplary embodiments of three sub-pixels included in a repeating unit in FIG. 15. FIG. 27 shows a schematic cross-sectional view of a display substrate taken along a line FF' in FIG. 26A, according to some exemplary embodiments of the present disclosure.

Referring to FIGS. 26A to 27, in the embodiments of the present disclosure, the display substrate may further include a light shielding layer LS. The light shielding layer LS may be arranged between the base substrate 1 and the semiconductor layer 20, and used for protecting the semiconductor layer 20, so as to prevent the active layer of each transistor of the pixel driving circuit in each sub-pixel from being affected by external light.

For example, the light shielding layer LS may be made of an opaque metal material. The light shielding layer LS may also include a semiconductor film layer of amorphous silicon, polysilicon, or the like.

An orthographic projection of the light shielding layer LS for each sub-pixel on the base substrate 1 may cover the orthographic projection of the occupied region AR1 or AR2 of pixel driving circuit in the sub-pixel on the base substrate 1. Through such arrangement, the pixel driving circuit in each sub-pixel may be prevented from being affected by external light.

For example, the light shielding layer LS may access to a fixed voltage to prevent the light shielding layer LS from being in a floating state.

In some embodiments, the light shielding layer LS may have a planar shape or a grid shape. The orthographic projection of the light shielding layer LS on the base substrate 1 may at least partially overlap an orthographic projection of a structure or a part in the first transparent conductive layer and/or the second transparent conductive layer on the base substrate 1.

With reference to FIG. 4, the first light-emitting device 41 may include an anode, a light-emitting material layer, and a cathode that are stacked. The display substrate may include a sixth conductive layer, and the cathode CAT is located in the sixth conductive layer.

In some embodiments, in the first display region AA1, the sixth conductive layer may be patterned. That is, the sixth conductive layer may include a plurality of cathodes CAT and a plurality of cathode openings 271. A cathode opening 271 may be located between adjacent cathodes CAT.

For example, in the first display region AA1, an orthographic projection of the cathode CAT of the first light-emitting device 41 in each sub-pixel on the base substrate 1 may cover the orthographic projection of the anode of the first light-emitting device 41 in the sub-pixel on the base substrate 1. An orthographic projection of each cathode opening 271 on the base substrate 1 may overlap the orthographic projection of the light-transmitting region TRA between the sub-pixels on the base substrate 1. Through such arrangement, it may be ensured that the light transmittance of the light-transmitting region in the first display region AA1 is relatively high.

At least some embodiments of the present disclosure further provide a display panel including the display substrate as described above. For example, the display panel may be an OLED display panel.

Referring to FIG. 1, at least some embodiments of the present disclosure further provide a display apparatus. The display apparatus may include the display substrate as described above.

The display apparatus may include any device or product with a display function. For example, the display apparatus may be a smart phone, a mobile phone, an e-book reader, a desktop computer (PC), a laptop PC, a netbook PC, a personal digital assistant (PDA), a portable multimedia player (PMP), a digital audio player, a mobile medical device, a camera, a wearable device (such as a head-mounted device, an electronic clothing, an electronic bracelet, an electronic necklace, an electronic accessory, an electronic tattoo, or a smart watch), a television, etc.

It should be understood that, the display panel and the display apparatus according to the embodiments of the present disclosure have all the characteristics and advantages of the above-mentioned display substrate. For details, please refer to the above description, which is not repeated here.

Although some embodiments according to a general inventive concept of the present disclosure have been illustrated and described, those skilled in the art will understand that changes may be made to these embodiments without departing from the principle and spirit of the present general inventive concept. The scope of the present disclosure shall be defined by the claims and their equivalents.

What is claimed is:

1. A display substrate, comprising a first display region and a second display region, a light transmittance of the first display region being greater than a light transmittance of the second display region, wherein the display substrate comprises:
   a base substrate;
   a plurality of sub-pixels arranged on the base substrate and located in the first display region, the sub-pixels located in the first display region comprising a first pixel driving circuit and a first light-emitting device, the first pixel driving circuit being electrically connected to the first light-emitting device and configured to drive the first light-emitting device to emit light; and a plurality of sub-pixels arranged on the base substrate and located in the second display region, the sub-pixels located in the second display region comprising a second pixel driving circuit and a second light-emitting device, the second pixel driving circuit being electrically connected to the second light-emitting device and configured to drive the second light-emitting device to emit light, wherein the plurality of sub-pixels located in the first display region comprise a plurality of sub-pixel groups, each of the plurality of sub-pixel groups comprises a first sub-pixel and a second sub-pixel, the first pixel driving circuit comprises a first sub-pixel driving circuit and a second sub-pixel driving circuit, the first sub-pixel driving circuit is configured to drive the first light-emitting device of the first sub-pixel to emit light, and the second sub-pixel driving circuit is configured to drive the first light-emitting device of the second sub-pixel to emit light, the first sub-pixel driving circuit comprises at least a first reset transistor, the second sub-pixel driving circuit comprises at least a second reset transistor, and the first reset transistor of the first sub-pixel driving circuit and the second reset transistor of the second sub-pixel driving circuit are at least partially shared with each other.

2. The display substrate according to claim 1, wherein an orthographic projection of each of the first reset transistor of the first sub-pixel driving circuit and the second reset transistor of the second sub-pixel driving circuit on the base substrate falls within an orthographic projection of an occupied region of the first sub-pixel driving circuit on the base substrate.

3. The display substrate according to claim 1, wherein the first reset transistor comprises a common transistor and a first sub-transistor, and the second reset transistor comprises the common transistor and a second sub-transistor, and each of the common transistor, the first sub-transistor and the second sub-transistor comprises a gate, a source and a drain, and the gate of each of the common transistor, the first sub-transistor and the second sub-transistor is configured to receive a reset control signal, one of the source or the drain of the common transistor is configured to receive an initialization voltage signal, and the other of the source or the drain of the common transistor is electrically connected to the first sub-transistor and the second sub-transistor, respectively.

4. The display substrate according to claim 3, wherein the display substrate further comprises a semiconductor layer arranged on the base substrate and a first conductive layer located on a side of the semiconductor layer away from the base substrate, and the display substrate further comprises a reset signal line arranged on the base substrate, the reset signal line is configured to transmit the reset control signal, and the reset signal line is located in the first conductive layer; and the reset signal line comprises a first part, a second part and a third part located in the first display region, and the semiconductor layer comprises a common channel portion, a first channel portion and a second channel portion located in the first display region, orthographic projections of the first part, the second part and the third part on the base substrate are respectively coincide with orthographic projections of the common channel portion, the first channel portion and the second channel portion on the base substrate, the gate of the common transistor comprises the first part, the gate of the first sub-transistor comprises the second part, and the gate of the second sub-transistor comprises the third part.

5. The display substrate according to claim 4, wherein the common transistor comprises a common source portion and a common drain portion located in the semiconductor layer, the first sub-transistor comprises a first sub-source portion and a first sub-drain portion located in the semiconductor layer, and the second sub-transistor comprises a second sub-source portion and a second sub-drain portion located in the semiconductor layer;

wherein the common source portion and the common drain portion are respectively located on both sides of the common channel portion, the first sub-source portion and the first sub-drain portion are respectively located on both sides of the first channel portion, and the second sub-source portion and the second sub-drain portion are respectively located on both sides of the second channel portion;

wherein the display substrate further comprises an initialization voltage line arranged on the base substrate and a first connection portion arranged on the base substrate;

wherein one of the common source portion and the common drain portion is electrically connected to the initialization voltage line through a first via hole, and the other of the common source portion and the common drain portion extends continuously with one of the first sub-source portion and the first sub-drain portion;

wherein the other of the first sub-source portion and the first sub-drain portion is electrically connected to one end of the first connection portion through a second via hole; and wherein the first sub-pixel driving circuit further comprises a first driving transistor comprising a gate, and the other end of the first connection portion is electrically connected to the gate of the first driving transistor through a third via hole.

6. The display substrate according to claim 5, wherein the display substrate further comprises a first transparent conductive connection portion arranged on the base substrate;

the other of the common source portion and the common drain portion further extends continuously with one of the second sub-source portion and the second sub-drain portion; and the other of the second sub-source portion and the second sub-drain portion is electrically connected to one end of the first transparent conductive connection portion through the third via hole.

7. The display substrate according to claim 6, wherein the second sub-pixel driving circuit further comprises a second driving transistor comprising a gate, and the other end of the first transparent conductive connection portion is electrically connected to the gate of the second driving transistor through a fourth via hole.

8. The display substrate according to claim 6, wherein the initialization voltage line is located in a second conductive layer, the first connection portion is located in a third conductive layer, the second conductive layer is located on a side of the first conductive layer away from the base substrate, and the third conductive layer is located on a side of the second conductive layer away from the base substrate; and wherein the first transparent conductive connection portion is located in a first transparent conductive layer, and the first transparent conductive layer is located on a side of the third conductive layer away from the base substrate.

9. The display substrate according to claim 6, wherein the first sub-pixel driving circuit further comprises a first initialization transistor comprising an active layer located in the semiconductor layer;
   the second sub-pixel driving circuit further comprises a second initialization transistor comprising an active layer located in the semiconductor layer; and
   an orthographic projection of the first transparent conductive connection portion on the base substrate partially overlaps with an orthographic projection of the active layer of the first initialization transistor on the base substrate, and the orthographic projection of the first transparent conductive connection portion on the base substrate partially overlaps with an orthographic projection of the active layer of the second initialization transistor on the base substrate.

10. The display substrate according to claim 9, wherein the display substrate further comprises a first scan signal line and a second scan signal line arranged on the base substrate, the first scan signal line is configured to supply a scan signal to the first sub-pixel driving circuit, and the second scan signal line is configured to supply a scan signal to the second sub-pixel driving circuit; and
   an orthographic projection of the first scan signal line on the base substrate partially overlaps with the orthographic projection of the active layer of the first initialization transistor on the base substrate, and an orthographic projection of the second scan signal line on the base substrate partially overlaps with the orthographic projection of the active layer of the second initialization transistor on the base substrate.

11. The display substrate according to claim 10, wherein the display substrate further comprises a third transparent conductive connection portion arranged on the base substrate, and one end of the third transparent conductive connection portion is electrically connected to the first scan signal line through a ninth via hole, and the other end of the third transparent conductive connection portion is electrically connected to the second scan signal line through a tenth via hole.

12. The display substrate according to claim 9, wherein the first transparent conductive connection portion comprises at least a first part, a second part, and a third part, the third part of the first transparent conductive connection portion extends in a first direction, the second part of the first transparent conductive connection portion extends in a second direction, and the first part of the first transparent conductive connection portion extends in an oblique direction that is oblique relative to both the first direction and the second direction; and
   wherein:
      an orthographic projection of the first part of the first transparent conductive connection portion on the base substrate partially overlaps with the orthographic projection of the active layer of the first initialization transistor on the base substrate; and/or
      an orthographic projection of the third part of the first transparent conductive connection portion on the base substrate partially overlaps with the orthographic projection of the active layer of the second initialization transistor on the base substrate; and/or
      the second part of the first transparent conductive connection portion is located in a light-transmitting region between the first sub-pixel and the second sub-pixel.

13. The display substrate according to claim 9, wherein:
   the active layer of the first initialization transistor is spaced apart from other parts of the first sub-pixel driving circuit in the semiconductor layer; and/or
   the active layer of the second initialization transistor is spaced apart from other parts of the second sub-pixel driving circuit in the semiconductor layer.

14. The display substrate according to claim 9, wherein the display substrate further comprises a second connection portion arranged on the base substrate, and a first end of the second connection portion is electrically connected to the initialization voltage line through a fifth via hole, and a second end of the second connection portion is electrically connected to a first end of the active layer of the first initialization transistor through a sixth via hole;
   wherein the display substrate further comprises a second transparent conductive connection portion arranged on the base substrate, a first end of the second transparent conductive connection portion is electrically connected to a second end of the second connection portion through a seventh via hole, and a second end of the second transparent conductive connection portion is electrically connected to a first end of the active layer of the second initialization transistor through an eighth via hole; and
   wherein the second connection portion is located in a third conductive layer; and/or the second transparent conductive connection portion is located in a first transparent conductive layer.

15. The display substrate according to claim 9, wherein the display substrate further comprises a first light-emitting control line and a second light-emitting control line arranged on the base substrate, the first light-emitting control line is configured to supply a light-emitting control signal to the first sub-pixel driving circuit, and the second light-emitting control line is configured to supply a light-emitting control signal to the second sub-pixel driving circuit; and
   the display substrate further comprises a fourth transparent conductive connection portion arranged on the base substrate, one end of the fourth transparent conductive connection portion is electrically connected to the first light-emitting control line through an eleventh via hole, and the other end of the fourth transparent conductive connection portion is electrically connected to the second light-emitting control line through a twelfth via hole.

16. The display substrate according to claim 15, wherein the plurality of sub-pixel groups comprise at least a first sub-pixel group and a second sub-pixel group that are located in the same row and are adjacent to each other;
   wherein the display substrate further comprises a first conductive wire arranged on the base substrate, one end of the first conductive wire is electrically connected to a reset signal line in the first sub-pixel group through a thirteenth via hole, the other end of the first conductive wire is electrically connected to a reset signal line in the second sub-pixel group through a fourteenth via hole;
   wherein the display substrate further comprises a second conductive wire arranged on the base substrate, one end of the second conductive wire is electrically connected to an initialization voltage line in the first sub-pixel group through a fifteenth via hole, and the other end of the second conductive wire is electrically connected to an initialization voltage line in the second sub-pixel group through a sixteenth via hole;

wherein the third transparent conductive connection portion and/or the fourth transparent conductive connection portion are located in a first transparent conductive layer;

wherein the first conductive wire and/or the second conductive wire are located in a second transparent conductive layer, wherein the second transparent conductive layer is located on a side of the first transparent conductive layer away from the base substrate;

wherein the display substrate further comprises: a data signal line configured to transmit a data signal and a driving voltage line configured to transmit a driving voltage, wherein the data signal line and the driving voltage line are located in the first transparent conductive layer;

wherein the driving voltage line is disconnected at the first sub-pixel driving circuit and the second sub-pixel driving circuit, so that the driving voltage line comprises a first driving voltage sub-line and a second driving voltage sub-line, and the first driving voltage sub-line and the second driving voltage sub-line are spaced apart in an extension direction of the driving voltage line;

wherein the display substrate further comprises a third connection portion, one end of the third connection portion is electrically connected to the first driving voltage sub-line through a seventeenth via hole, and the other end of the third connection portion is electrically connected to the second driving voltage sub-line through an eighteenth via hole;

wherein the display substrate comprises a fourth conductive layer arranged on the base substrate, and the fourth conductive layer is located between the first transparent conductive layer and the second transparent conductive layer; and wherein the third connection portion is located in the fourth conductive layer.

17. The display substrate according to claim 5, wherein in at least one of the plurality of the sub-pixel groups, the first sub-pixel and the second sub-pixel share the reset signal line and the initialization voltage line.

18. The display substrate according to claim 1, wherein the first light-emitting device comprises at least a first electrode and a light-emitting material layer arranged on a side of the first electrode away from the base substrate;

wherein an area of an orthographic projection of a first electrode of the first sub-pixel on the base substrate is greater than an area of an orthographic projection of a first electrode of the second sub-pixel on the base substrate; and wherein:
the orthographic projection of the first electrode of the first sub-pixel on the base substrate covers an orthographic projection of an occupied region of the first sub-pixel driving circuit on the base substrate; and/or
the orthographic projection of the first electrode of the second sub-pixel on the base substrate covers an orthographic projection of an occupied region of the second sub-pixel driving circuit on the base substrate.

19. A display panel, comprising the display substrate according to claim 1.

20. A display apparatus, comprising the display substrate according to claim 1; and
at least one image sensor,
wherein an orthographic projection of the at least one image sensor on the base substrate falls within an orthographic projection of the first display region on the base substrate.

* * * * *

UNITED STATES PATENT AND TRADEMARK OFFICE
CERTIFICATE OF CORRECTION

| | | |
|---|---|---|
| PATENT NO. | : 12,238,999 B2 | Page 1 of 1 |
| APPLICATION NO. | : 17/629360 | |
| DATED | : February 25, 2025 | |
| INVENTOR(S) | : Ke Liu et al. | |

It is certified that error appears in the above-identified patent and that said Letters Patent is hereby corrected as shown below:

On the Title Page

Item (73) Assignee Information
Delete "Optoelectronis"
Insert --Optoelectronics--

Signed and Sealed this
Twenty-fifth Day of March, 2025

Coke Morgan Stewart
*Acting Director of the United States Patent and Trademark Office*